US012685219B2

(12) United States Patent
Song et al.

(10) Patent No.: US 12,685,219 B2
(45) Date of Patent: Jul. 14, 2026

(54) PACKAGE COMPRISING A CHIPLET LOCATED BETWEEN AN INTEGRATED DEVICE AND A METALLIZATION PORTION

(71) Applicant: QUALCOMM Incorporated, San Diego, CA (US)

(72) Inventors: Yanmei Song, San Diego, CA (US); William Stone, San Diego, CA (US); Jianwen Xu, San Diego, CA (US); Senthil Sivaswamy, San Diego, CA (US); John Holmes, Escondido, CA (US); Ryan Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 729 days.

(21) Appl. No.: 17/894,043

(22) Filed: Aug. 23, 2022

(65) Prior Publication Data

US 2024/0072032 A1 Feb. 29, 2024

(51) Int. Cl.
| | |
|---|---|
| *H01L 25/00* | (2006.01) |
| *H10W 70/05* | (2026.01) |
| *H10W 70/60* | (2026.01) |
| *H10W 72/00* | (2026.01) |
| *H10W 90/00* | (2026.01) |
| *H10D 86/85* | (2025.01) |
| *H10W 70/00* | (2026.01) |
| *H10W 70/09* | (2026.01) |
| *H10W 70/652* | (2026.01) |
| *H10W 72/90* | (2026.01) |
| *H10W 90/20* | (2026.01) |

(52) U.S. Cl.
CPC ........... *H10W 90/00* (2026.01); *H10W 70/05* (2026.01); *H10W 70/093* (2026.01); *H10W 70/614* (2026.01); *H10W 72/0198* (2026.01); *H10D 86/85* (2025.01); *H10W 70/09* (2026.01); *H10W 70/099* (2026.01); *H10W 70/60* (2026.01); *H10W 70/6528* (2026.01); *H10W 72/072* (2026.01); *H10W 72/07236* (2026.01); *H10W 72/853* (2026.01); *H10W 72/942* (2026.01); *H10W 90/20* (2026.01); *H10W 90/722* (2026.01)

(58) Field of Classification Search
None
See application file for complete search history.

(56) References Cited

U.S. PATENT DOCUMENTS

| | | | | |
|---|---|---|---|---|
| 11,462,463 | B2 * | 10/2022 | Elsherbini | ........... H01L 23/5226 |
| 2016/0322330 | A1 | 11/2016 | Lin et al. | |
| 2017/0062383 | A1 * | 3/2017 | Yee | ......................... H01L 24/20 |

(Continued)

OTHER PUBLICATIONS

International Search Report and Written Opinion—PCT/US2023/070503—ISA/EPO—Oct. 31, 2023.

*Primary Examiner* — Long Pham
(74) *Attorney, Agent, or Firm* — Loza & Loza, LLP

(57) ABSTRACT

A package comprising a first metallization portion, a first integrated device coupled to the first metallization portion through a first plurality of pillar interconnects, and a first chiplet located between the first integrated device and the first metallization portion. The first chiplet is coupled to the first integrated device through a first plurality of inter pillar interconnects. The first chiplet may include an active chiplet. The first chiplet may include a passive chiplet.

28 Claims, 30 Drawing Sheets

*CROSS SECTIONAL PROFILE VIEW*

(56) References Cited

U.S. PATENT DOCUMENTS

| 2018/0005984 | A1 | 1/2018 | Yu et al. |
| 2018/0025992 | A1 | 1/2018 | Hung et al. |
| 2018/0053730 | A1 | 2/2018 | Shao et al. |
| 2018/0358298 | A1 | 12/2018 | Zhai et al. |
| 2018/0366436 | A1 | 12/2018 | Wang et al. |
| 2019/0096825 | A1 | 3/2019 | Kim et al. |
| 2019/0109119 | A1 | 4/2019 | Shih et al. |
| 2019/0333845 | A1 | 10/2019 | Chen |
| 2019/0393153 | A1 | 12/2019 | Wang et al. |
| 2020/0043893 | A1 | 2/2020 | Chen et al. |
| 2020/0105653 | A1 | 4/2020 | Elsherbini et al. |
| 2020/0266156 | A1 | 8/2020 | Lee |
| 2021/0111166 | A1 | 4/2021 | Zhang et al. |
| 2021/0159180 | A1 | 5/2021 | Zhai et al. |
| 2021/0280540 | A1 | 9/2021 | Kim et al. |
| 2022/0157777 | A1 | 5/2022 | Yang et al. |
| 2022/0223543 | A1 | 7/2022 | Choi et al. |
| 2022/0384390 | A1 | 12/2022 | Yang et al. |
| 2023/0040467 | A1 | 2/2023 | Chen et al. |
| 2023/0082912 | A1 | 3/2023 | Chang et al. |
| 2023/0092361 | A1 | 3/2023 | Wu et al. |
| 2023/0352352 | A1 | 11/2023 | Yu et al. |
| 2024/0038648 | A1 | 2/2024 | Chen et al. |
| 2024/0063148 | A1* | 2/2024 | Foo ..................... H01L 21/4846 |
| 2024/0071993 | A1 | 2/2024 | Song et al. |

* cited by examiner

CROSS SECTIONAL PROFILE VIEW

CROSS SECTIONAL PROFILE VIEW

CROSS SECTIONAL PROFILE VIEW

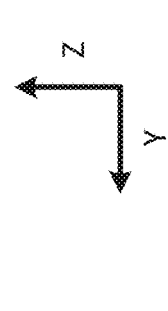
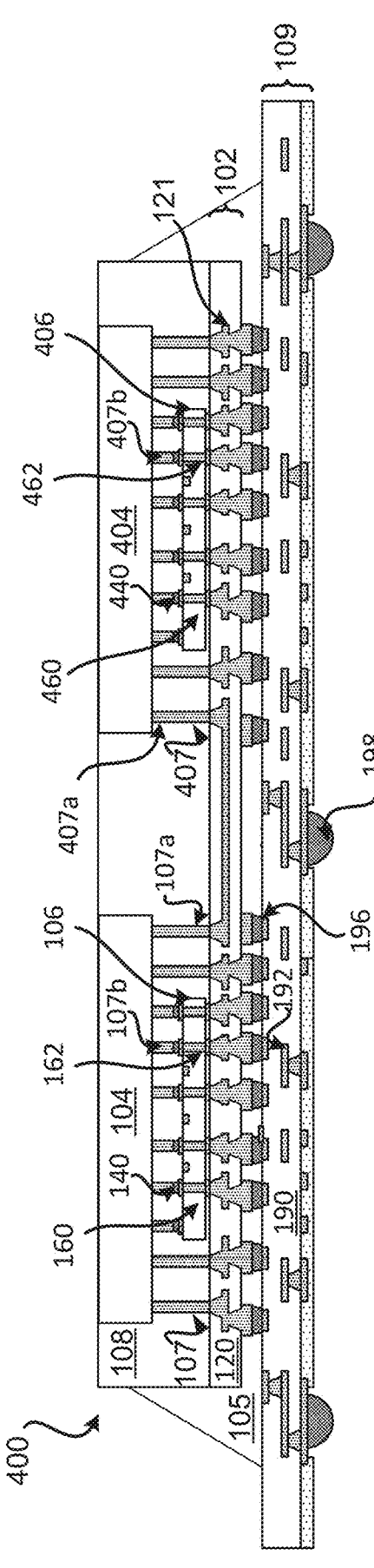
CROSS SECTIONAL PROFILE VIEW
*FIG. 4*

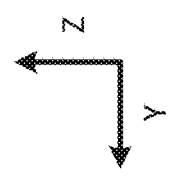
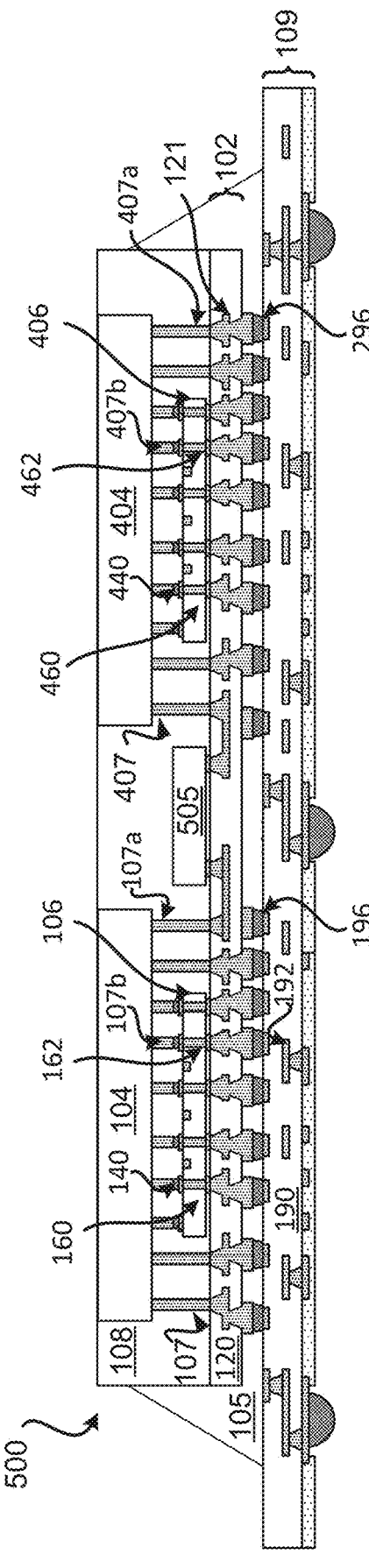
CROSS SECTIONAL PROFILE VIEW
*FIG. 5*

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

TRENCH CAPACITOR DEVICE

CHIPLET SUBSTRATE

CAVITY / TRENCH
FORMATION

OXIDE FORMATION
POLYSILICON FORMATION
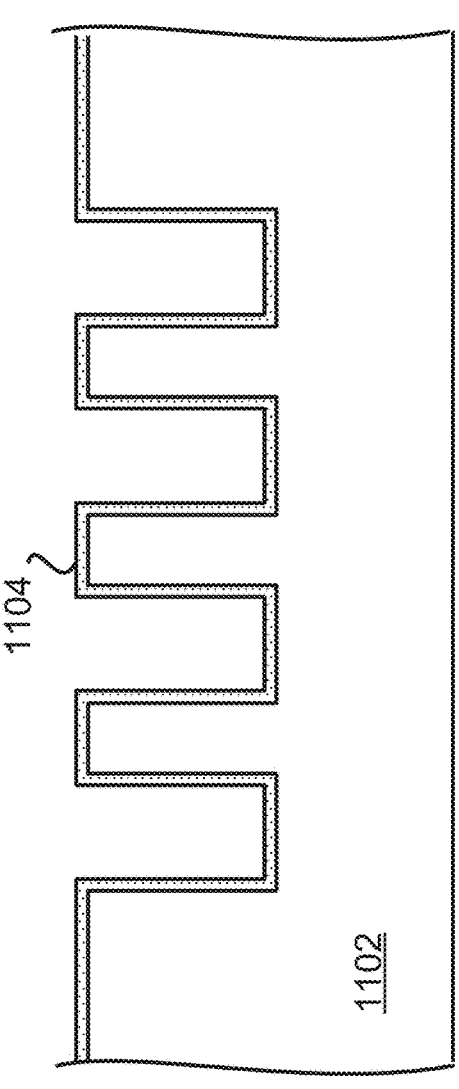
1104
1102
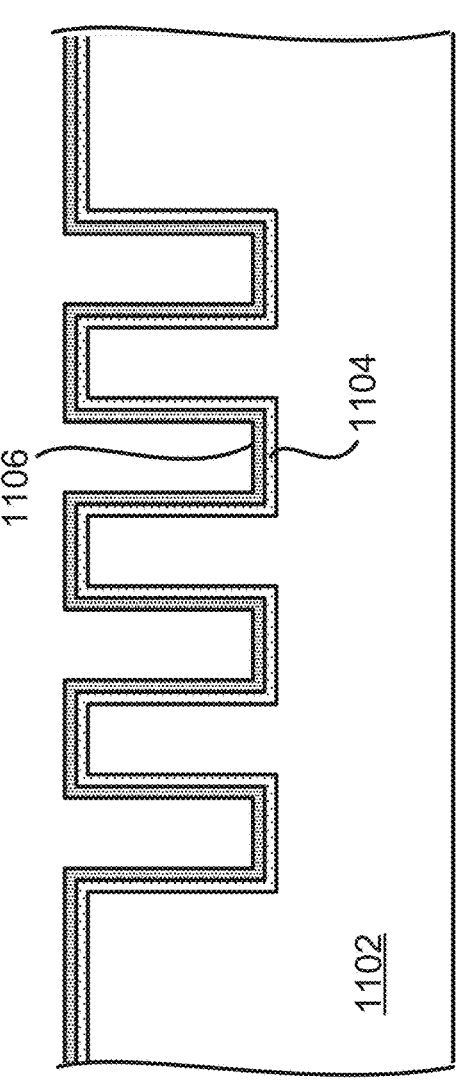
1106
1104
1102
FIG. 12B
3
4

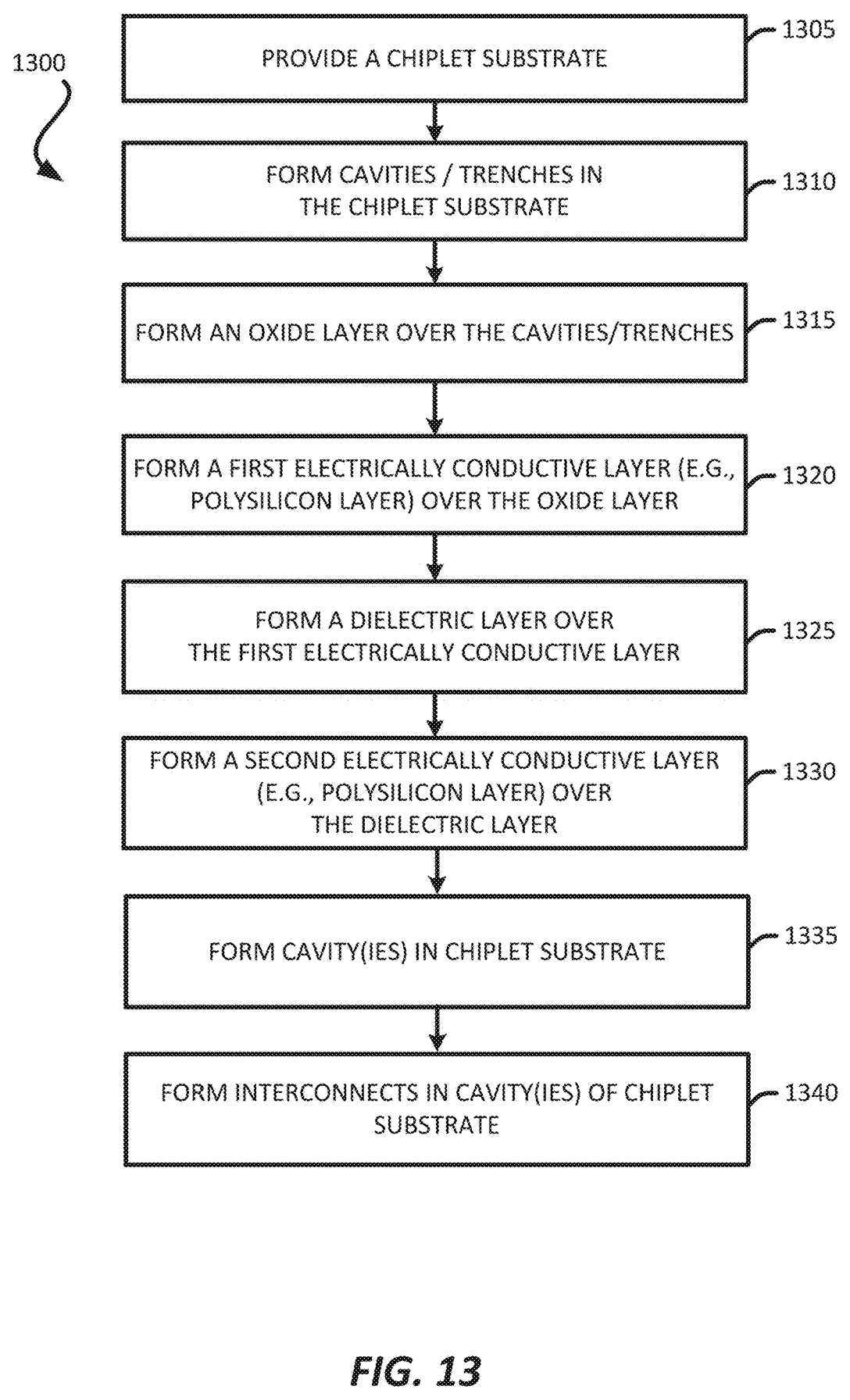

1300

```
┌─────────────────────────────────────────────────┐
│           PROVIDE A CHIPLET SUBSTRATE            │──1305
└─────────────────────────────────────────────────┘
                        │
                        ▼
┌─────────────────────────────────────────────────┐
│            FORM CAVITIES / TRENCHES IN           │──1310
│              THE CHIPLET SUBSTRATE               │
└─────────────────────────────────────────────────┘
                        │
                        ▼
┌─────────────────────────────────────────────────┐
│    FORM AN OXIDE LAYER OVER THE CAVITIES/TRENCHES │──1315
└─────────────────────────────────────────────────┘
                        │
                        ▼
┌─────────────────────────────────────────────────┐
│ FORM A FIRST ELECTRICALLY CONDUCTIVE LAYER (E.G.,│──1320
│    POLYSILICON LAYER) OVER THE OXIDE LAYER       │
└─────────────────────────────────────────────────┘
                        │
                        ▼
┌─────────────────────────────────────────────────┐
│            FORM A DIELECTRIC LAYER OVER          │──1325
│        THE FIRST ELECTRICALLY CONDUCTIVE LAYER   │
└─────────────────────────────────────────────────┘
                        │
                        ▼
┌─────────────────────────────────────────────────┐
│    FORM A SECOND ELECTRICALLY CONDUCTIVE LAYER   │──1330
│         (E.G., POLYSILICON LAYER) OVER           │
│               THE DIELECTRIC LAYER               │
└─────────────────────────────────────────────────┘
                        │
                        ▼
┌─────────────────────────────────────────────────┐
│        FORM CAVITY(IES) IN CHIPLET SUBSTRATE     │──1335
└─────────────────────────────────────────────────┘
                        │
                        ▼
┌─────────────────────────────────────────────────┐
│   FORM INTERCONNECTS IN CAVITY(IES) OF CHIPLET   │──1340
│                   SUBSTRATE                      │
└─────────────────────────────────────────────────┘
```

*FIG. 13*

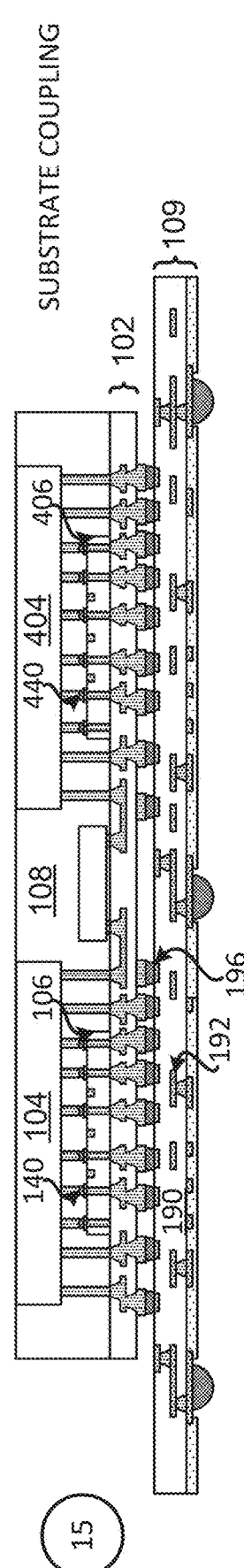
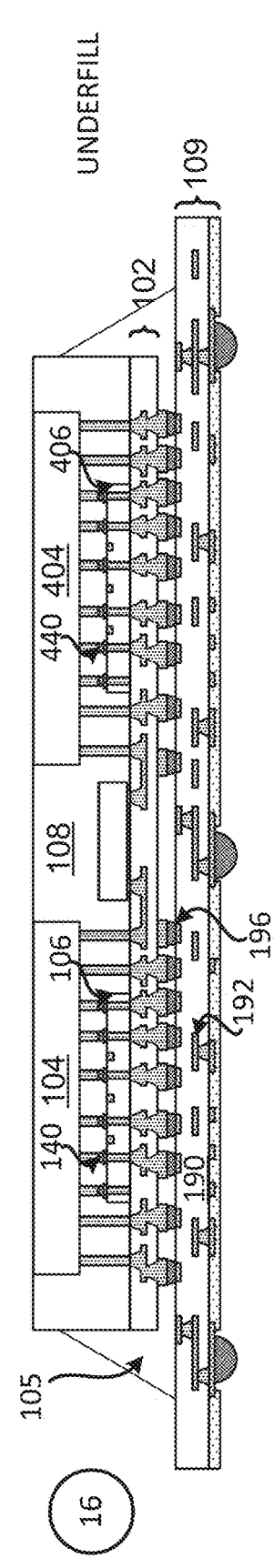
FIG. 14D

METALLIZATION
PORTION
FORMATION

} 702

} 102

720
708
120
108

404

104

( 7 )

SOLDER
INTERCONNECT +
CARRIER
DECOUPLING

} 102

} 702

800

404

104

108
120
708
720

196

( 8 )

BRIDGE PLACEMENT

ENCAPSULATION LAYER FORMATION

METALLIZATION PORTION

FIG. 16B

Figure 17B:
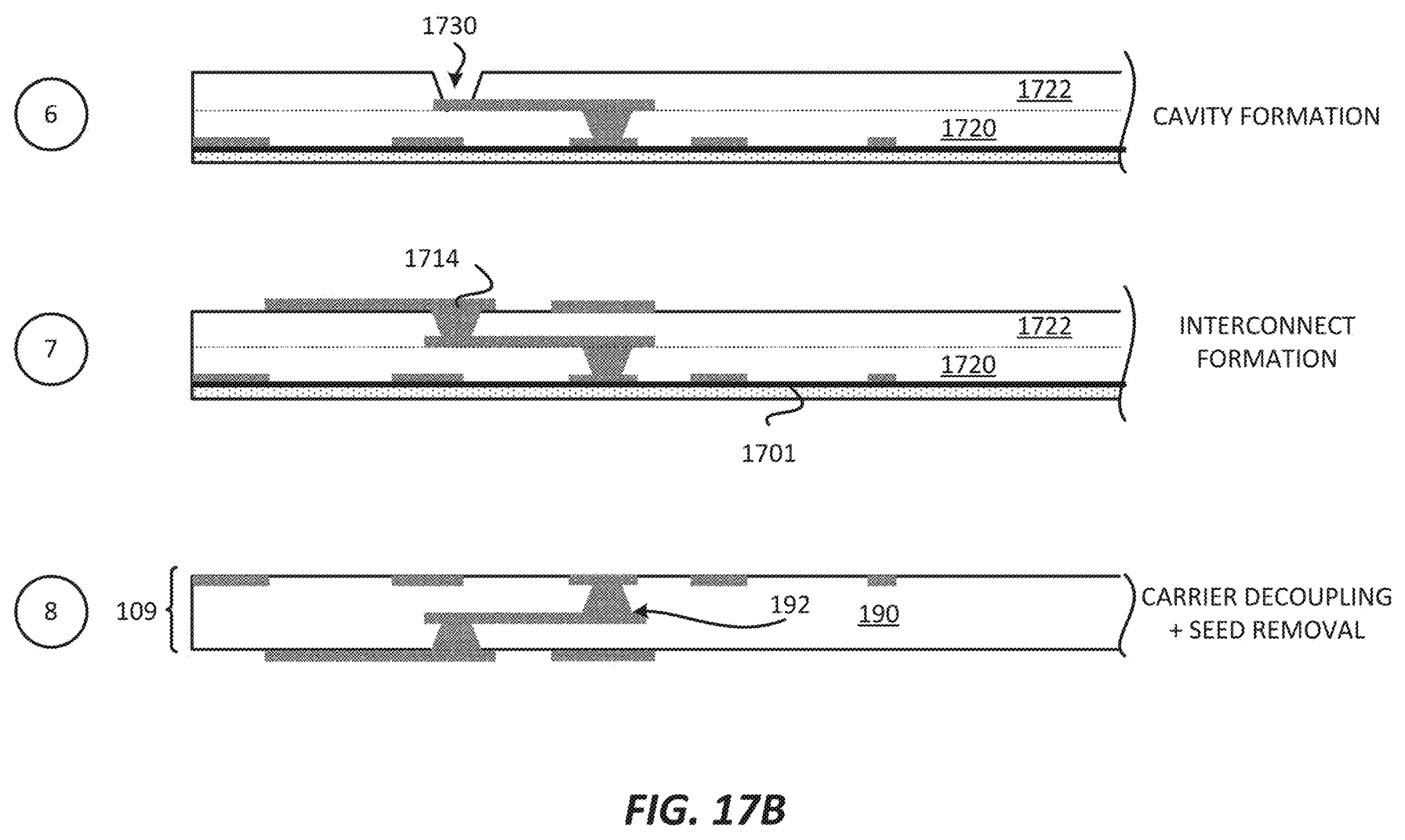

CAVITY FORMATION

1722

1720

1730

6

INTERCONNECT FORMATION

1722

1720

1714

1701

7

CARRIER DECOUPLING + SEED REMOVAL

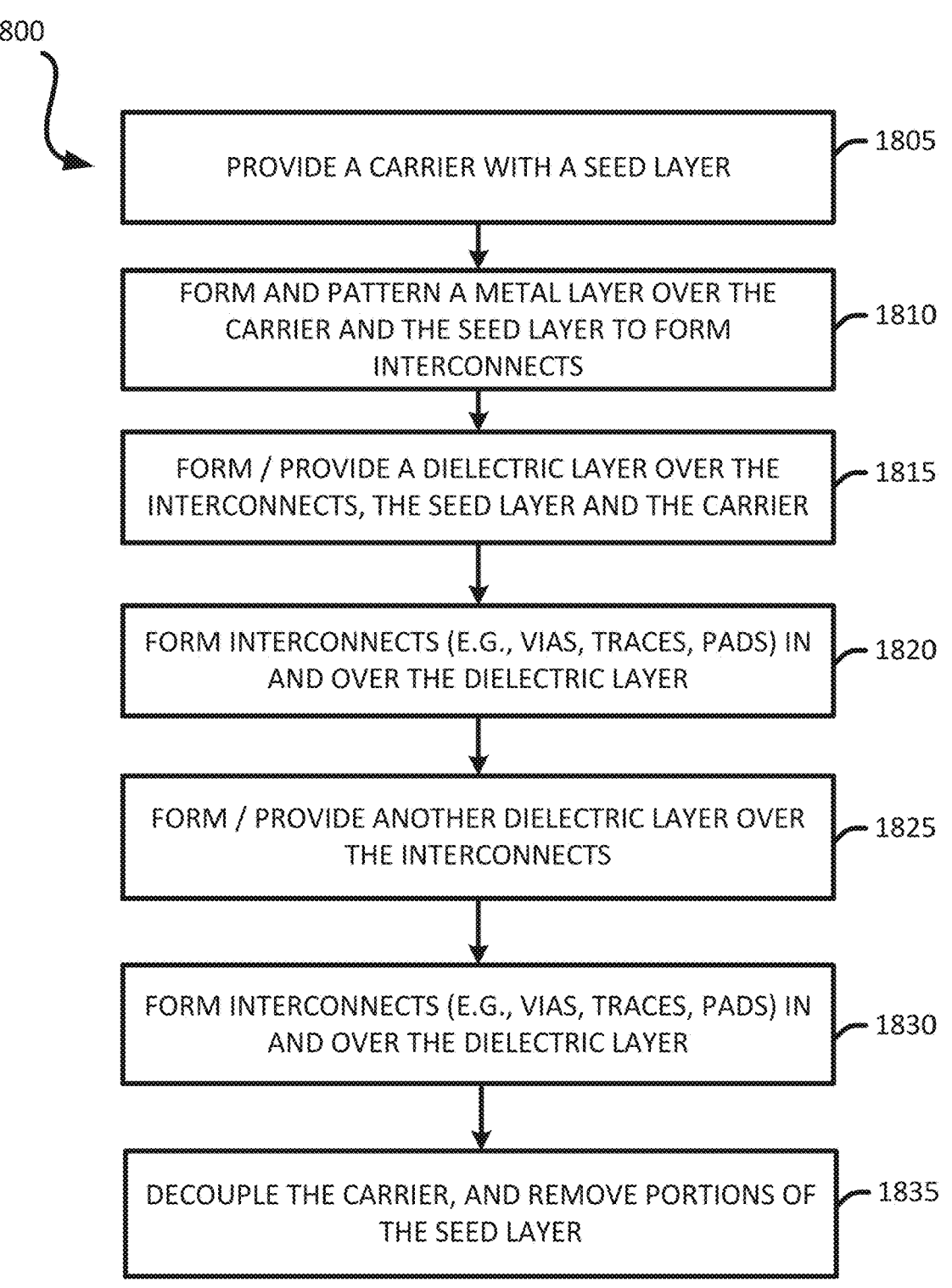

1800

PROVIDE A CARRIER WITH A SEED LAYER   — 1805

FORM AND PATTERN A METAL LAYER OVER THE CARRIER AND THE SEED LAYER TO FORM INTERCONNECTS   — 1810

FORM / PROVIDE A DIELECTRIC LAYER OVER THE INTERCONNECTS, THE SEED LAYER AND THE CARRIER   — 1815

FORM INTERCONNECTS (E.G., VIAS, TRACES, PADS) IN AND OVER THE DIELECTRIC LAYER   — 1820

FORM / PROVIDE ANOTHER DIELECTRIC LAYER OVER THE INTERCONNECTS   — 1825

FORM INTERCONNECTS (E.G., VIAS, TRACES, PADS) IN AND OVER THE DIELECTRIC LAYER   — 1830

DECOUPLE THE CARRIER, AND REMOVE PORTIONS OF THE SEED LAYER   — 1835

*FIG. 18*

PACKAGE COMPRISING A CHIPLET LOCATED BETWEEN AN INTEGRATED DEVICE AND A METALLIZATION PORTION

FIELD

Various features relate to a package comprising an integrated device.

BACKGROUND

A package may include a substrate, an integrated device and a passive device. These components are coupled together to provide a package that may perform various electrical functions. How the integrated device, the substrate and the passive component are coupled together affects how the package performs overall. There is an ongoing need to provide better performing packages.

SUMMARY

Various features relate to a package comprising an integrated device.

One example provides a package comprising a first metallization portion, a first integrated device coupled to the first metallization portion through a first plurality of pillar interconnects, and a first chiplet located between the first integrated device and the first metallization portion, wherein the first chiplet is coupled to the first integrated device through a first plurality of inter pillar interconnects.

Another example provides a device that includes a package. The package comprises a first metallization portion, a first integrated device coupled to the first metallization portion through a first plurality of pillar interconnects, and a first chiplet located between the first integrated device and the first metallization portion, wherein the first chiplet is coupled to the first integrated device through a first plurality of inter pillar interconnects.

Another example provides a method for fabricating a package. The method provides a first integrated device and a first plurality of inter pillar interconnects. The method forms an encapsulation layer that encapsulates the first integrated device and the first plurality of inter pillar interconnects. The method forms a first plurality of pillar interconnects that are configured to be coupled to the first integrated device. The method couples a first chiplet to the first integrated device through the first plurality of inter pillar interconnects. The method forms a first metallization portion such that the first metallization portion is coupled to the first chiplet and the first encapsulation layer.

Another example provides a package comprising a first metallization portion, a first integrated device coupled to the first metallization portion, a second integrated device coupled to the first metallization portion, a second metallization portion coupled to the first metallization portion through a first plurality of pillar interconnects, a first chiplet located between the first metallization portion and the second metallization portion, wherein the first chiplet is configured to be electrically coupled to the first integrated device through the first metallization portion, and a second chiplet located between the first metallization portion and the second metallization portion, wherein the second chiplet is configured to be electrically coupled to the second integrated device through the first metallization portion.

Another example provides a device that includes a package. The package comprises a first metallization portion, a first integrated device coupled to the first metallization portion, a second integrated device coupled to the first metallization portion, a second metallization portion coupled to the first metallization portion through a first plurality of pillar interconnects, a first chiplet located between the first metallization portion and the second metallization portion, wherein the first chiplet is configured to be electrically coupled to the first integrated device through the first metallization portion, and a second chiplet located between the first metallization portion and the second metallization portion, wherein the second chiplet is configured to be electrically coupled to the second integrated device through the first metallization portion.

Another example provides a method for fabricating a package. The method provides a first integrated device and a second integrated device. The method forms an encapsulation layer that encapsulates the first integrated device and the second integrated device. The method forms a first metallization portion such that the first metallization portion is coupled to the first integrated device and the second integrated device. The method forms a first plurality of pillar interconnects and a second plurality of pillar interconnects such that the first plurality of pillar interconnects and the second plurality of pillar interconnects are coupled to the first metallization portion. The method couples a first chiplet and a second chiplet to the first metallization portion. The method forms another encapsulation layer that encapsulates the first plurality of pillar interconnects, the second plurality of pillar interconnects, the first chiplet and the second chiplet. The method forms a second metallization portion such that the second metallization portion is coupled to the first chiplet and the second chiplet.

Another example provides a method for fabricating a package. The method forms a second metallization portion. The method forms a first plurality of pillar interconnects and a second plurality of pillar interconnects such that the first plurality of pillar interconnects and the second plurality of pillar interconnects are coupled to the second metallization portion. The method couples a first chiplet and a second chiplet to the second metallization portion. The method forms an encapsulation layer that encapsulates the first plurality of pillar interconnects, the second plurality of pillar interconnects, the first chiplet and the second chiplet. The method forms a first metallization portion such that the first metallization portion is coupled to the first chiplet and the second chiplet. The method couples a first integrated device and a second integrated device to the first metallization portion.

BRIEF DESCRIPTION OF THE DRAWINGS

Various features, nature and advantages may become apparent from the detailed description set forth below when taken in conjunction with the drawings in which like reference characters identify correspondingly throughout.

FIG. 4 illustrates a cross sectional view of a package comprising multiple integrated devices, a metallization portion and multiple deep trench capacitors.

FIG. 5 illustrates a cross sectional view of a package comprising multiple integrated devices, a metallization portion, a bridge, and multiple deep trench capacitors.

FIGS. 12A-12D illustrate an exemplary sequence for fabricating a deep trench capacitor.

FIG. 13 illustrates an exemplary flow diagram of a method for fabricating a deep trench capacitor.

FIGS. 14A-14D illustrate an exemplary sequence for fabricating a package comprising multiple integrated devices, a metallization portion, a bridge, and multiple deep trench capacitors.

FIGS. 16A-16C illustrate an exemplary sequence for fabricating a package comprising multiple integrated devices, a metallization portion, a bridge, and multiple deep trench capacitors.

FIGS. 17A-17B illustrate an exemplary sequence for fabricating a substrate.

FIG. 18 illustrates an exemplary flow diagram of a method for fabricating a substrate.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a first metallization portion, a first integrated device coupled to the first metallization portion, a second integrated device coupled to the first metallization portion, a second metallization portion coupled to the first metallization portion through a first plurality of pillar interconnects, a first chiplet located between the first metallization portion and the second metallization portion, wherein the first chiplet is configured to be electrically coupled to the first integrated device through the first metallization portion, and a second chiplet located between the first metallization portion and the second metallization portion, wherein the second chiplet is configured to be electrically coupled to the second integrated device through the first metallization portion. The first chiplet may include a first active chiplet or a first passive chiplet. The second chiplet may include a second active chiplet or a second passive chiplet. Positioning the first chiplet to be close to the first integrated device, and positioning the second chiplet to be close to the second integrated device, help improve the performance of the package. Reducing the electrical path between the first integrated device and the first chiplet and/or the electrical path between the second integrated device and the second chiplet, helps reduce latency in signals and/or currents which can help improve the performance of the package. As will be further described below, instead of one integrated device that performs all the functions of a package, various functions of the package are performed by different integrated devices and/or different chiplets. By redistributing the functions of the package to various integrated devices and/or various chiplets, cost savings in fabricating the package may be achieved, while still providing a package with high performance capabilities.

Exemplary Package Comprising an Integrated Device and a Chiplet

Figure 1:
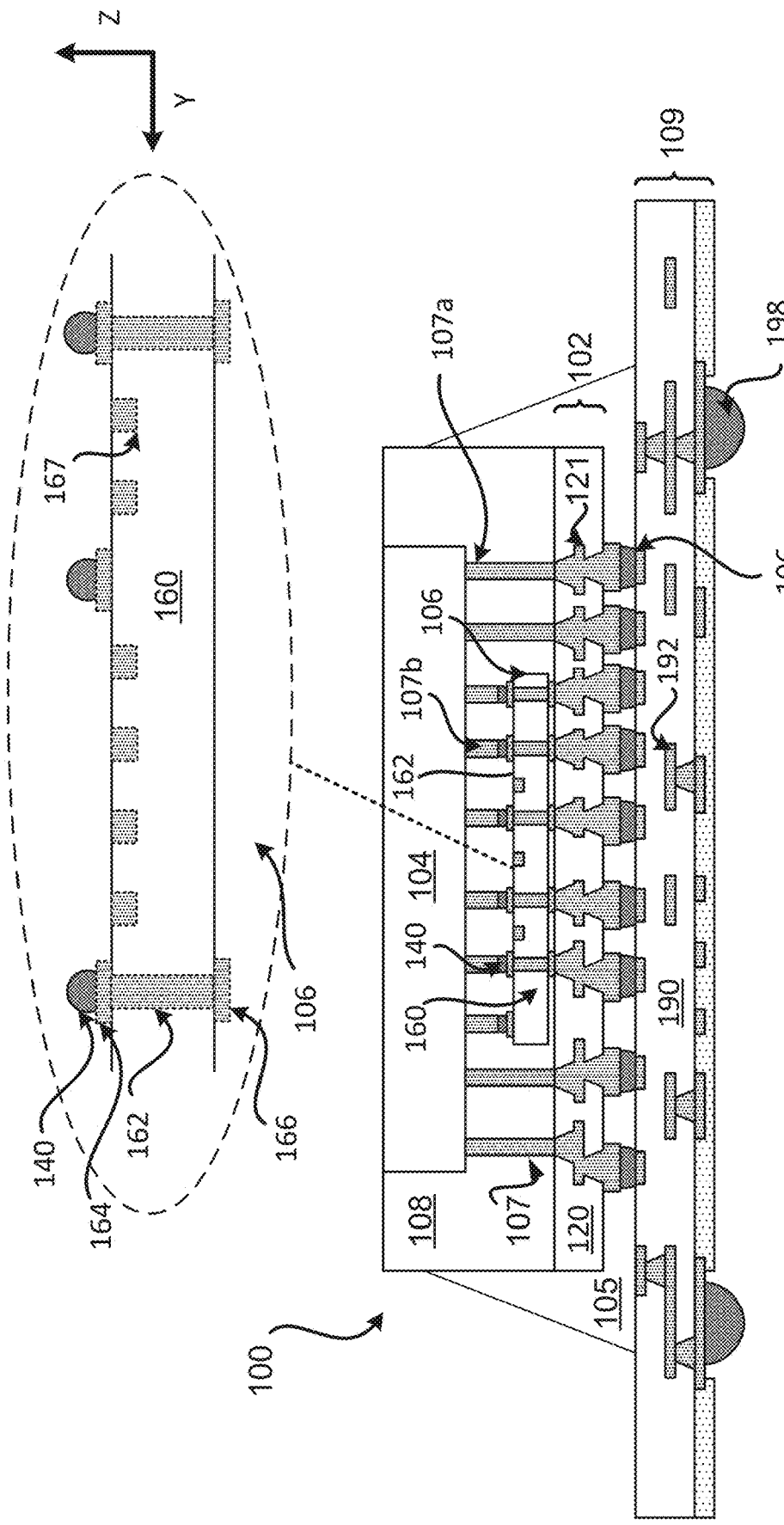
FIG. 1 illustrates a cross sectional view of a package comprising an integrated device, a metallization portion and a deep trench capacitor between the integrated device and the metallization portion.

FIG. 1 illustrates a cross sectional profile view of a package 100 that includes an integrated device and a chiplet. The package 100 includes a metallization portion 102, an integrated device 104, a chiplet 106, a plurality of pillar interconnects 107, and an encapsulation layer 108. The plurality of pillar interconnects 107 includes a plurality of pillar interconnects 107a and a plurality of pillar interconnects 107b. The package 100 is coupled to a substrate 109 through a plurality of solder interconnects 196. In some implementations, the substrate 109 may be considered part of the package 100. A plurality of solder interconnects 198 is coupled to a bottom portion of the substrate 109. The substrate 109 may be configured to be coupled to a board (not shown), such as a printed circuit board (PCB), through the plurality of solder interconnects 198. The substrate 109 includes at least one dielectric layer 190 (e.g., at least one substrate dielectric layer) and a plurality of interconnects 192 (e.g., plurality of substrate interconnects).

The integrated device 104 is coupled to the metallization portion 102 through the plurality of pillar interconnects 107a. The integrated device 104 is coupled to the chiplet 106 through the plurality of pillar interconnects 107b and a plurality of solder interconnects 140. The plurality of pillar interconnects 107b may be located between the integrated device 104 and the chiplet 106. The plurality of pillar interconnects 107b may include a plurality of inter pillar interconnects. The plurality of inter pillar interconnects may be similar to the plurality of pillar interconnects 107a. However, the plurality of inter pillar interconnects may be shorter than the plurality of pillar interconnects 107a. The plurality of inter pillar interconnects may be located between the integrated device 104 and the chiplet 106. The chiplet 106 is coupled to the metallization portion 102. The chiplet 106 may be configured as a passive chiplet. The chiplet 106 may be configured as a trench capacitor device (e.g., deep trench capacitor (DTC) device). The chiplet 106 is located between the metallization portion 102 and the integrated device 104. The chiplet 106 includes a front side and a back side. The front side of the chiplet 106 faces the integrated device 104. For example, a front side of a deep trench capacitor faces the integrated device 104.

The chiplet 106 includes a die substrate 160, a plurality of through substrate vias 162, a plurality of trench interconnects 164, a plurality of trench interconnects 166 and a plurality of trench capacitors 167. The plurality of trench interconnects 164 are located on a front side (e.g., top side) of the chiplet 106. The plurality of trench interconnects 166 are located on a back side (e.g., bottom side) of the chiplet 106. One or more of the through substrate vias from the plurality of through substrate vias 162 may be coupled to one or more trench capacitors from the plurality of trench capacitors 167. The plurality of through substrate vias 162 may be coupled to the plurality of trench interconnects 164 and the plurality of trench interconnects 166. The plurality of trench interconnects 164 is coupled to the plurality of pillar interconnects 107*b* through the plurality of solder interconnects 140. Thus, for example, the plurality of solder interconnects 140 is coupled to the plurality of trench interconnects 164 and the plurality of pillar interconnects 107*b*. The plurality of trench interconnects 166 may be coupled (e.g., directly coupled) to the metallization portion 102. For example, the plurality of trench interconnects 166 may be configured to be directly coupled to metallization interconnects 121 from the metallization portion 102 such that the plurality of trench interconnects 166 are touching the plurality of metallization interconnects 121 from the metallization portion 102. The plurality of trench interconnects 166 may be optional. In some implementations, the plurality of through substrate vias 162 may be configured to be coupled (e.g., directly coupled) to the metallization portion 102. For example, the plurality of through substrate vias 162 may be configured to be directly coupled to metallization interconnects from the metallization portion 102 such that the plurality of through substrate vias 162 are touching the plurality of metallization interconnects 121 from the metallization portion 102. A more detailed example of a trench capacitor is illustrated and described below in at least FIG. 11 of the disclosure. A front side of the chiplet faces the integrated device 104.

The metallization portion 102 includes at least one dielectric layer 120 and a plurality of metallization interconnects 121. The metallization portion 102 may include a redistribution portion. The plurality of metallization interconnects 121 may include a plurality of redistribution interconnects. The metallization portion 102 may be a means for metallization interconnection. The plurality of metallization interconnects 121 may be coupled to a back side of the chiplet 106. For example, the plurality of metallization interconnects 121 may be coupled to the plurality of trench interconnects 166 or the plurality of through substrate vias 162. The plurality of metallization interconnects 121 may be coupled to the plurality of pillar interconnects 107*a*.

As mentioned above, a metallization portion (e.g., 102, 702) may include a redistribution portion that includes redistribution interconnects (e.g., redistribution layer (RDL) interconnects). A redistribution interconnect may include portions that have a U-shape or V-shape. The terms "U-shape" and "V-shape" shall be interchangeable. The terms "U-shape" and "V-shape" may refer to the side profile shape of the interconnects and/or redistribution interconnects. The U-shape interconnect (e.g., U-shape side profile interconnect) and the V-shape interconnect (e.g., V-shape side profile interconnect) may have a top portion and a bottom portion. A bottom portion of a U-shape interconnect (or a V-shape interconnect) may be coupled to a top portion of another U-shape interconnect (or a V-shape interconnect).

One or more electrical paths (e.g., first electrical path, second electrical path, third electrical path) between the metallization portion 102 and the integrated device 104 may include at least one metallization interconnect from the plurality of metallization interconnects 121 and at least one pillar interconnect from the plurality of pillar interconnects 107*a*.

One or more electrical paths (e.g., first electrical path, second electrical path, third electrical path) between the metallization portion 102 and the integrated device 104 may include at least one metallization interconnect from the plurality of metallization interconnects 121, at least one trench interconnect from the plurality of trench interconnects 166, at least one through substrate via from the plurality of through substrate vias 162, at least one trench interconnect from the plurality of trench interconnects 164, at least one solder interconnect from the plurality of solder interconnects 140 and/or at least one pillar interconnect from the plurality of pillar interconnects 107*b*.

The integrated device 104 may be configured to be electrically coupled to the chiplet 106 through the plurality of pillar interconnects 107*b* and the plurality of solder interconnects 140. Thus, one or more electrical paths (e.g., first electrical path, second electrical path, third electrical path) between the integrated device 104 and the chiplet 106 may include at least one pillar interconnect from the plurality of pillar interconnects 107*b* and/or at least one solder interconnect from the plurality of solder interconnects 140.

The encapsulation layer 108 may be coupled to the metallization portion 102, the integrated device 104 and the chiplet 106. The encapsulation layer 108 may be coupled to the plurality of pillar interconnects 107. The encapsulation layer 108 may be coupled to a first surface (e.g., top surface) of the metallization portion 102. The encapsulation layer 108 may encapsulate (e.g., partial or complete) the integrated device 104 and the chiplet 106. FIG. 1 illustrates that a back side of the integrated device 104 is exposed and not covered by the encapsulation layer. However, in some implementations, the back side of the integrated device 104 may be coupled to the encapsulation layer 108. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process.

The metallization portion 102 is coupled to the substrate 109 through the plurality of solder interconnects 196. For example, metallization interconnects from the plurality of metallization interconnects 121 may be coupled to interconnects from the plurality of interconnects 192 through the plurality of solder interconnects 196. An underfill 105 is coupled to the substrate 109, the metallization portion 102 and the encapsulation layer 108. The underfill 105 may be considered part of the package 100.

The location and/or placement of the chiplet 106 near the integrated device 104 helps reduce signal and/or current latency between the integrated device 104 and the chiplet 106, which helps improve the performance of the integrated device 104 and/or the package 100. The chiplet 106 is described as being configured as a deep trench capacitor. However, as will be further described below, different implementations may use a chiplet that is configured to perform other operations and/or functionalities.

The use of the integrated device, the chiplet and the metallization portion in the package of FIG. 1, as well as in the packages described in at least FIGS. 2-10 provides several advantages. One, redistributing various functions of the package across at least one integrated device and at least one chiplet can lead to cost savings for the package. Integrated devices and chiplets can be fabricated using different technology nodes, which may have different costs.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap width between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Moreover, the chiplet can be coupled to the integrated device through copper to copper hybrid bond or through solder interconnects, such that the chiplet is very close to the integrated device. For example, the chiplet and the integrated device can be implemented with a metallization portion (e.g., redistribution portion) to position the chiplet to be as close to the integrated device as possible, which reduces the electrical path between the chiplet and the integrated device. This helps improve the performance of the integrated device and the power that is provided to the integrated device. In some implementations, the minimum pitch of interconnects coupled to the chiplet may be as small as about 20 micrometers.

In addition, a chiplet that includes trench capacitors provides several technical benefits. A trench capacitor and/or a trench capacitor device provides a capacitor with high capacitance and/or high capacitance density. Capacitors with higher capacitance density allow for more compact form factors for the package, since these capacitors take up less space but can provide capacitance that are the same and/or comparable to larger sized capacitors. The compact form factor of the trench capacitors allows them to be located very closely to an integrated device, which can help improve power delivery performance to an integrated device. Moreover, since these trench capacitors have small form factors, they can be implemented with a metallization portion instead of being implemented in a package substrate. Thus, the high capacitance capacitors may be implemented during the fabrication of the package, instead of being implemented when the package is coupled to a substrate.

High capacitance capacitors are especially important in certain types of processing operations, such as compute applications (e.g., high performance processing). The use of the chiplet, the integrated device and the metallization portion, as described in the disclosure, helps improve die to die communication, which helps improve the overall performance of the integrated device(s) and the package.

Figure 2:
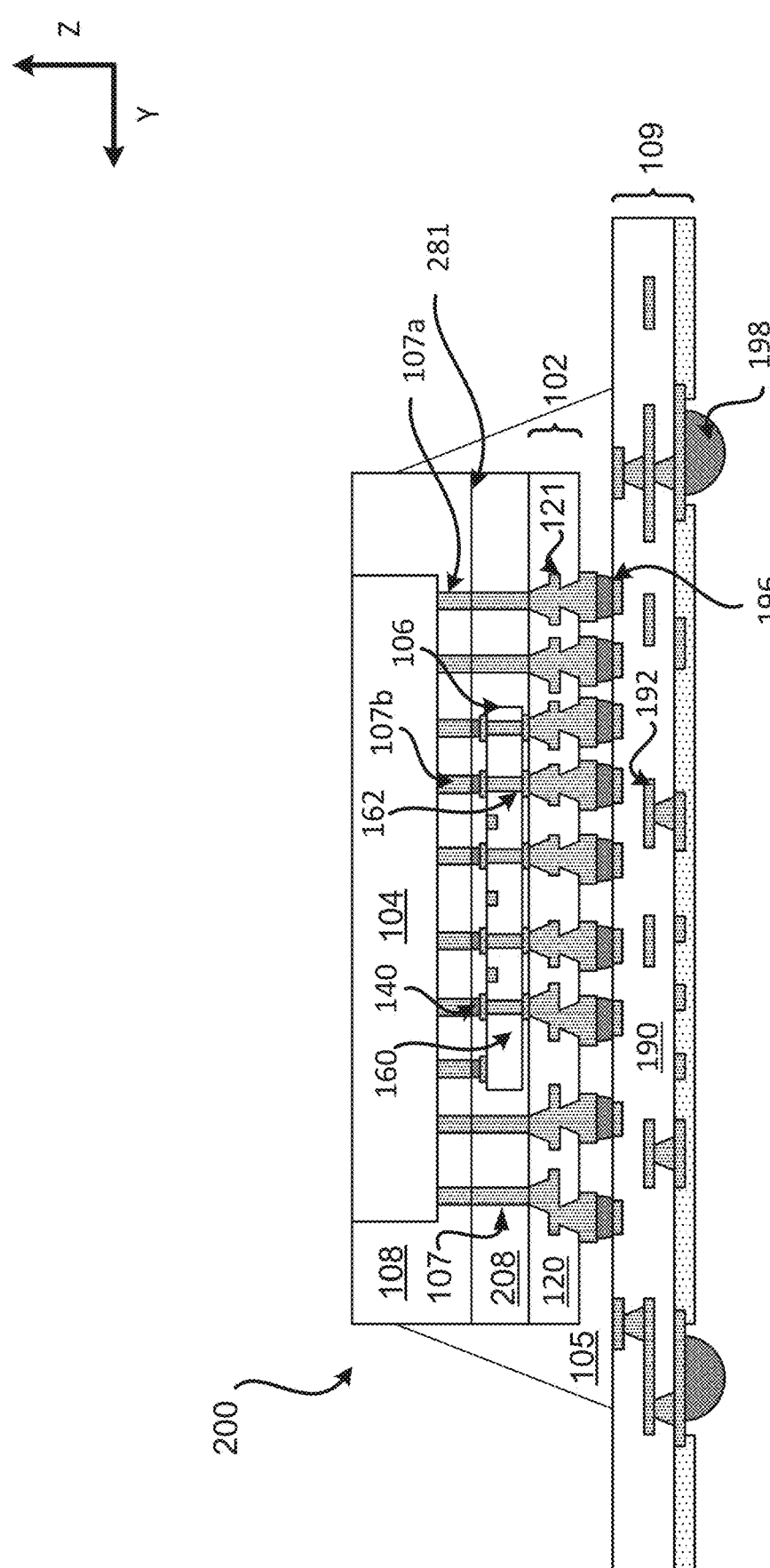
FIG. 2 illustrates a cross sectional view of a package comprising an integrated device, a metallization portion and a deep trench capacitor between the integrated device and the metallization portion.

FIG. 2 illustrates a cross sectional profile view of a package 200 that includes an integrated device and a chiplet. The package 200 includes the metallization portion 102, the integrated device 104, the chiplet 106, the plurality of pillar interconnects 107, an encapsulation layer 108, an encapsulation layer 208 and a dielectric layer 281. The package 200 is similar to the package 100 of FIG. 1, and thus includes the same or similar components that are arranged and/or configured in the same and/or a similar manner as the package 100. For example, the chiplet 106 may be configured to operate as a deep trench capacitor, such as the one described in at least FIG. 11.

The package 200 includes two encapsulation layers that are separated by a dielectric layer. The encapsulation layer 108 may be a first encapsulation layer, and the encapsulation layer 208 may be a second encapsulation layer. The dielectric layer 281 is located between the encapsulation layer 108 and the encapsulation layer 208. The dielectric layer 281 is coupled to an inner surface of the encapsulation layer 108 and an inner surface of the encapsulation layer 208. The dielectric layer 281 may include polyimide (PI). In some implementations, the encapsulation layer 208 may be the same as the encapsulation layer 108. In some implementations, the encapsulation layer 208 may have one or more different properties from the encapsulation layer 108. For example, the encapsulation layer 108 may include a higher concentration of filler than the encapsulation layer 208. As will be further described below in at least FIG. 14A, the plurality of pillar interconnects 107 may include a seed layer (e.g., metal seed layer, copper seed layer) that is planar to the dielectric layer 281. The encapsulation layer 108 is coupled to the integrated device 104, at least a portion of the plurality of pillar interconnects 107a, and at least a portion of the plurality of pillar interconnects 107b. The encapsulation layer 208 is coupled to the metallization portion 102, the chiplet 106, the plurality of solder interconnects 140, and at least a portion of the plurality of pillar interconnects 107a.

Figure 3:
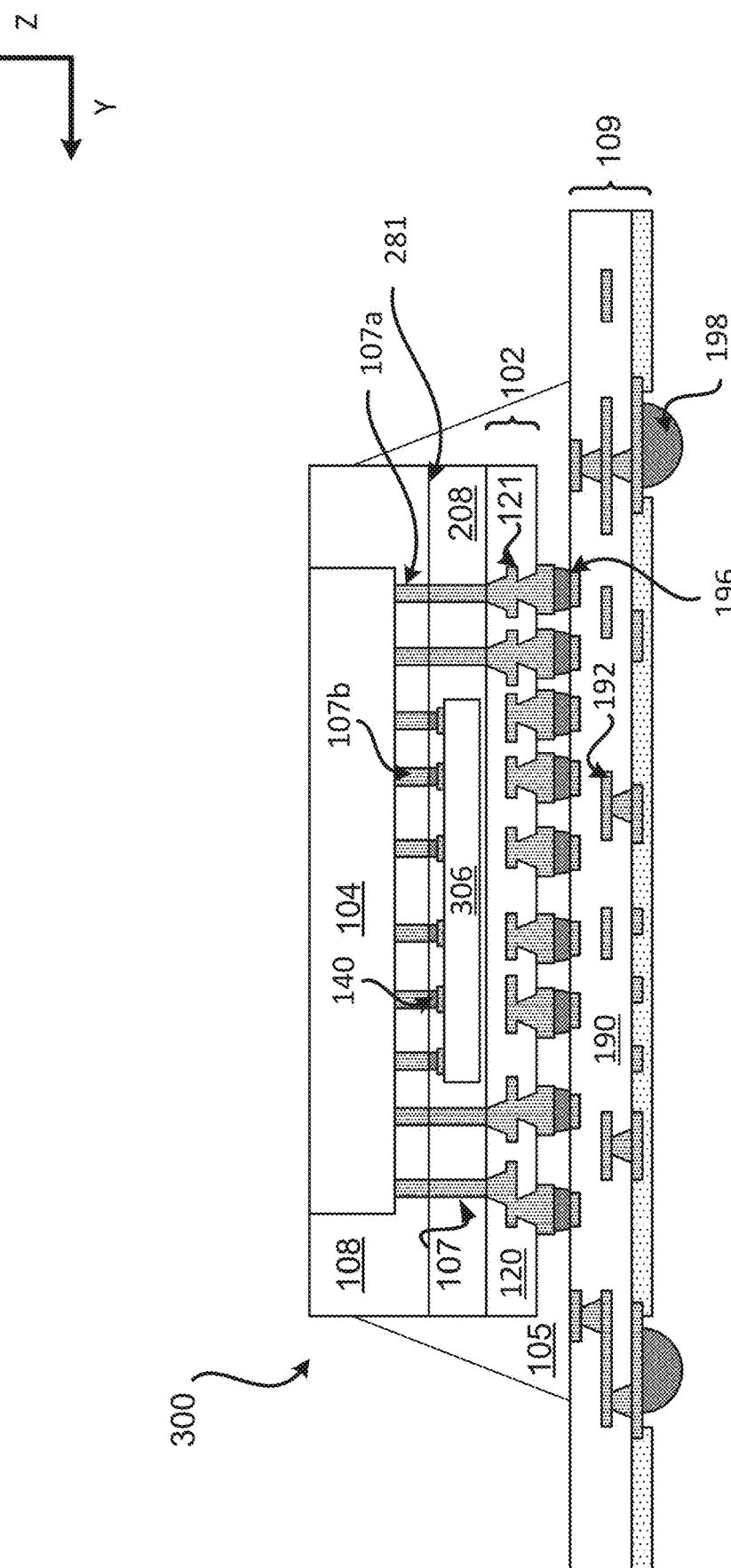
FIG. 3 illustrates a cross sectional view of a package comprising an integrated device, a metallization portion and a chiplet between the integrated device and the metallization portion.

FIG. 3 illustrates a cross sectional profile view of a package 300 that includes an integrated device and a chiplet. The package 300 includes the metallization portion 102, the integrated device 104, a chiplet 306, the plurality of pillar interconnects 107, an encapsulation layer 108, an encapsulation layer 208 and a dielectric layer 281. The package 300 is similar to the package 100 of FIG. 1 and/or the package 200 of FIG. 2, and thus includes the same or similar components that are arranged and/or configured in the same and/or a similar manner as the package 100 and/or the package 200.

The chiplet 306 may be configured to provide a different functionality than the chiplet 106. The chiplet 306 may be configured as an active chiplet or a passive chiplet. The chiplet 306 may be configured to operate as a memory (e.g., first memory, second memory), a power management integrated circuit (PMIC) (e.g., first power management integrated circuit, second power management integrated circuit), and/or a voltage regulator (e.g., first voltage regulator, second voltage regulator). The chiplet 306 may include an integrated device with a smaller size than the integrated device 104. The chiplet 306 may include a die substrate, a plurality of die transistors, and a plurality of die interconnects (all not shown). In some implementations, the chiplet 306 may include a plurality of through substrate vias (not shown).

The chiplet 306 is coupled to the integrated device 104 through the plurality of solder interconnects 140 and the plurality of pillar interconnects 107b. A front side of the chiplet 306 faces the integrated device 104. FIG. 3 illustrates that a back side of the chiplet 306 is not touching the metallization portion 102. However, in some implementations, the chiplet 306 may touch the metallization portion 102. In some implementations, a back side of the chiplet 306 may touch the metallization portion 102. For example, the back side of the chiplet 306 may touch and/or may be coupled to the metallization interconnects 121 of the metallization portion 102, in a similar manner as described for the chiplet 106 of FIGS. 1 and 2. A front side of the chiplet 306 may face the integrated device 104.

FIG. 4 illustrates a package 400 that includes at least two integrated devices and at least two chiplets. The package 400 includes an integrated device 104, a chiplet 106, an integrated device 404, a chiplet 406, a metallization portion 102, and an encapsulation layer 108. The chiplet 106 is located between the integrated device 104 and the metallization portion 102. The chiplet 406 is located between the integrated device 404 and the metallization portion 102. The encapsulation layer 108 encapsulates the integrated device 104, the integrated device 404, the chiplet 106 and the chiplet 406. The encapsulation layer 108 may be coupled to the metallization portion 102.

The package 400 is coupled to the substrate 109 through a plurality of solder interconnects 196. A plurality of solder interconnects 198 may be coupled to the substrate 109. An underfill 105 is coupled to the substrate 109, the metallization portion 102 and the encapsulation layer 108.

The integrated device 104 is coupled to the metallization portion 102 through the plurality of pillar interconnects 107a. The integrated device 104 is coupled to the chiplet 106 through the plurality of pillar interconnects 107b and a plurality of solder interconnects 140. The plurality of pillar interconnects 107b may be located between the integrated device 104 and the chiplet 106. The chiplet 106 is coupled to the metallization portion 102. The chiplet 106 may be configured as a passive chiplet. The chiplet 106 may be configured as a deep trench capacitor (DTC). The chiplet 106 is located between the metallization portion 102 and the integrated device 104. The chiplet 106 includes a front side and a back side. The front side of the chiplet 106 faces the integrated device 104. For example, a front side of a deep trench capacitor faces the integrated device 104.

The integrated device 404 is coupled to the metallization portion 102 through the plurality of pillar interconnects 407a. The integrated device 404 is coupled to the chiplet 406 through the plurality of pillar interconnects 407b and a plurality of solder interconnects 440. The plurality of pillar interconnects 407b may be located between the integrated device 404 and the chiplet 406. The plurality of pillar interconnects 407b may include a plurality of inter pillar interconnects. The plurality of inter pillar interconnects may be similar to the plurality of pillar interconnects 407a. However, the plurality of inter pillar interconnects may be shorter than the plurality of pillar interconnects 407a. The plurality of inter pillar interconnects may be located between the integrated device 404 and the chiplet 406. The chiplet 406 is coupled to the metallization portion 102. The chiplet 406 may be configured as a passive chiplet. The chiplet 406 may be configured as a deep trench capacitor (DTC). The chiplet 406 is located between the metallization portion 102 and the integrated device 404. The chiplet 406 includes a front side and a back side. The front side of the chiplet 406 faces the integrated device 404. For example, a front side of a deep trench capacitor faces the integrated device 404.

The integrated device 104 may be configured to be electrically coupled to the integrated device 404 through the metallization portion 102. For example, the integrated device 104 may be configured to be electrically coupled to the integrated device 404 through an electrical path that includes (i) at least one pillar interconnect from the plurality of pillar interconnects 107a, (ii) at least one metallization interconnect from the plurality of metallization interconnects 121, and (iii) at least one pillar interconnect from the plurality of pillar interconnects 407a.

One or more electrical paths (e.g., first electrical path, second electrical path, third electrical path) between the metallization portion 102 and the integrated device 104 may include at least one metallization interconnect from the plurality of metallization interconnects 121 and at least one pillar interconnect from the plurality of pillar interconnects 107a.

One or more electrical paths (e.g., first electrical path, second electrical path, third electrical path) between the metallization portion 102 and the integrated device 104 may include at least one metallization interconnect from the plurality of metallization interconnects 121, at least one trench interconnect from the plurality of trench interconnects 166, at least one through substrate via from the plurality of through substrate vias 162, at least one trench interconnect from the plurality of trench interconnects 164, at least one solder interconnect from the plurality of solder interconnects 140 and/or at least one pillar interconnect from the plurality of pillar interconnects 107b.

The integrated device 104 may be configured to be electrically coupled to the chiplet 106 through the plurality of pillar interconnects 107b and the plurality of solder interconnects 140. Thus, one or more electrical paths (e.g., first electrical path, second electrical path, third electrical path) between the integrated device 104 and the chiplet 106 may include at least one pillar interconnect from the plurality of pillar interconnects 107b and/or at least one solder interconnect from the plurality of solder interconnects 140.

One or more electrical paths (e.g., first electrical path, second electrical path, third electrical path) between the metallization portion 102 and the integrated device 404 may include at least one metallization interconnect from the plurality of metallization interconnects 121 and at least one pillar interconnect from the plurality of pillar interconnects 407a.

One or more electrical paths (e.g., first electrical path, second electrical path, third electrical path) between the metallization portion 102 and the integrated device 404 may include at least one metallization interconnect from the plurality of metallization interconnects 121, at least one trench interconnect from the plurality of trench interconnects 466, at least one through substrate via from the plurality of through substrate vias 462, at least one trench interconnect from the plurality of trench interconnects 464, at least one solder interconnect from the plurality of solder interconnects 440 and/or at least one pillar interconnect from the plurality of pillar interconnects 407b.

The integrated device 404 may be configured to be electrically coupled to the chiplet 406 through the plurality of pillar interconnects 407b and the plurality of solder interconnects 440. Thus, one or more electrical paths (e.g., first electrical path, second electrical path, third electrical path) between the integrated device 404 and the chiplet 406 may include at least one pillar interconnect from the plurality of pillar interconnects 407b and/or at least one solder interconnect from the plurality of solder interconnects 440.

FIG. 5 illustrates a package 500 that includes a bridge, at least two integrated devices and at least two chiplets. The package 500 includes an integrated device 104, a chiplet 106, an integrated device 404, a chiplet 406, a metallization portion 102, a bridge 505 and an encapsulation layer 108. The package 500 is similar to the package 400 and may be configured in a similar manner as described for the package 400. The chiplet 106 is located between the integrated device 104 and the metallization portion 102. The chiplet 406 is located between the integrated device 404 and the metallization portion 102. The encapsulation layer 108 encapsulates the integrated device 104, the integrated device 404, the chiplet 106, the chiplet 406 and the bridge 505. The encapsulation layer 108 may be coupled to the metallization portion 102.

The bridge 505 may include a die substrate and a plurality of bridge interconnects. The bridge 505 may include a dielectric layer. The bridge 505 is coupled to the metallization portion 102. A front side of the bridge 505 may be coupled to the metallization portion 102.

The integrated device 104 may be configured to be electrically coupled to the integrated device 404 through the metallization portion 102 and the bridge 505. For example, the integrated device 104 may be configured to be electrically coupled to the integrated device 404 through an electrical path that includes (i) at least one pillar interconnect from the plurality of pillar interconnects 107a, (ii) at least one metallization interconnect from the plurality of metallization interconnects 121, (iii) at least one die interconnect from the bridge 505, (iv) at least one metallization interconnect from the plurality of metallization interconnects 121, and (v) at least one pillar interconnect from the plurality of pillar interconnects 407a.

In some implementations, the package 400 and/or the package 500 may include a dielectric layer 281 located in the encapsulation layer 108 in a similar manner as described for the package 200 and/or the package 300.

Figure 6:
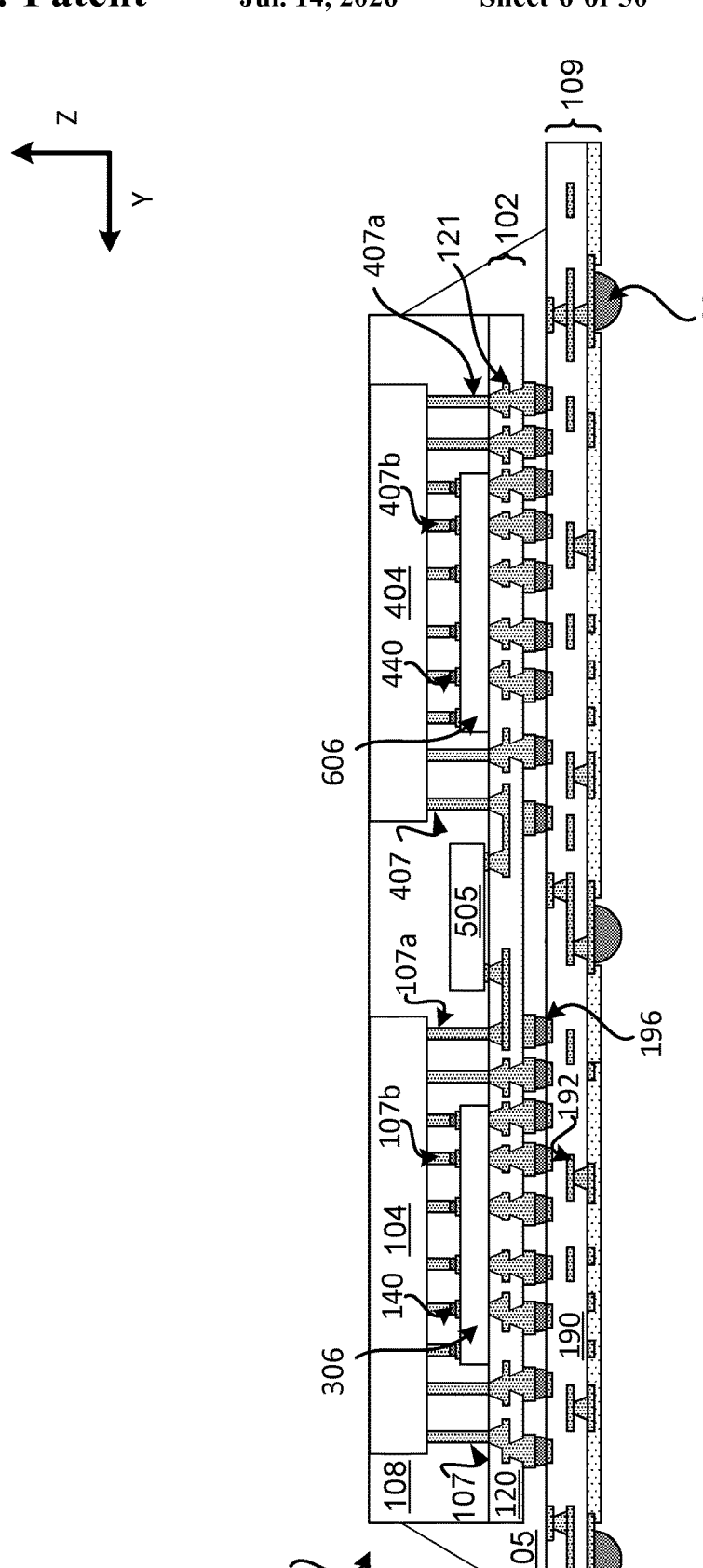
FIG. 6 illustrates a cross sectional view of a package comprising multiple integrated devices, a metallization portion, a bridge, and multiple chiplets.

FIG. 6 illustrates a package 600 that includes a bridge, at least two integrated devices and at least two chiplets. The package 600 includes an integrated device 104, a chiplet 306, an integrated device 404, a chiplet 606, a metallization portion 102, a bridge 505 and an encapsulation layer 108. The package 600 is similar to the package 400 and the package 500, and may be configured in a similar manner as described for the package 400 and the package 500. The chiplet 306 is located between the integrated device 104 and the metallization portion 102. The chiplet 606 is located between the integrated device 404 and the metallization portion 102. The encapsulation layer 108 encapsulates the integrated device 104, the integrated device 404, the chiplet 306, the chiplet 606 and the bridge 505. The encapsulation layer 108 may be coupled to the metallization portion 102.

The bridge 505 may include a die substrate and a plurality of bridge interconnects. The bridge 505 may include a dielectric layer. The bridge 505 is coupled to the metallization portion 102. A front side of the bridge 505 may be coupled to the metallization portion 102.

The integrated device 104 may be configured to be electrically coupled to the integrated device 404 through the metallization portion 102 and the bridge 505. For example, the integrated device 104 may be configured to be electrically coupled to the integrated device 404 through an electrical path that includes (i) at least one pillar interconnect from the plurality of pillar interconnects 107a, (ii) at least one metallization interconnect from the plurality of metallization interconnects 121, (iii) at least one die interconnect from the bridge 505, (iv) at least one metallization interconnect from the plurality of metallization interconnects 121, and (v) at least one pillar interconnect from the plurality of pillar interconnects 407a.

The integrated device 104 may be configured to be electrically coupled to the chiplet 306 through the plurality of pillar interconnects 107b and the plurality of solder interconnects 140. Thus, one or more electrical paths (e.g., first electrical path, second electrical path, third electrical path) between the integrated device 104 and the chiplet 306 may include at least one pillar interconnect from the plurality of pillar interconnects 107b and/or at least one solder interconnect from the plurality of solder interconnects 140.

The integrated device 404 may be configured to be electrically coupled to the chiplet 606 through the plurality of pillar interconnects 407b and the plurality of solder interconnects 440. Thus, one or more electrical paths (e.g., first electrical path, second electrical path, third electrical path) between the integrated device 404 and the chiplet 606 may include at least one pillar interconnect from the plurality of pillar interconnects 407b and/or at least one solder interconnect from the plurality of solder interconnects 440.

Figure 7:
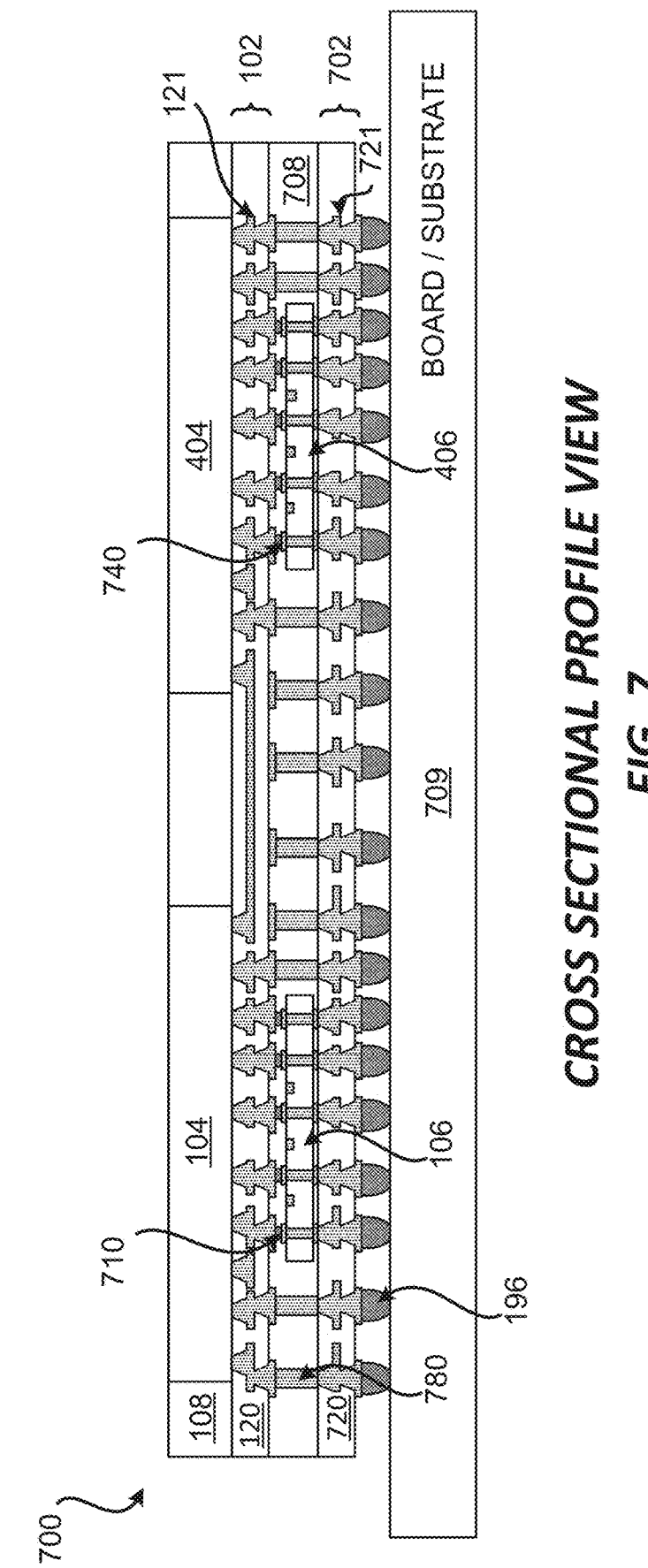
FIG. 7 illustrates a cross sectional view of a package comprising multiple integrated devices, a metallization portion, and multiple deep trench capacitors.

FIG. 7 illustrates a package 700 that includes at least two integrated devices and at least two chiplets. The package 700 includes an integrated device 104, a chiplet 106, an integrated device 404, a chiplet 406, a metallization portion 102, a metallization portion 702, an encapsulation layer 108 and an encapsulation layer 708. The metallization portion 102 includes at least one dielectric layer 120 and a plurality of metallization interconnects 121. The metallization portion 702 includes at least one dielectric layer 720 and a plurality of metallization interconnects 721. The encapsulation layer 108 encapsulates the integrated device 104, the integrated device 404. The encapsulation layer 108 may be coupled to the metallization portion 102.

The chiplet 106 is located between the metallization portion 102 and the metallization portion 702. The chiplet 106 may be coupled to the metallization portion 102 through a plurality of solder interconnects 710. The plurality of solder interconnects 710 may be coupled to at least one interconnect from the chiplet 106 and at least one metallization interconnect from the plurality of metallization interconnects 121 of the metallization portion 102. The chiplet 106 may be touching the metallization portion 702. For example, interconnects from the chiplet 106 may be touching at least one metallization interconnect from the plurality of metallization interconnects 721 of the metallization portion 702. The chiplet 406 is located between the metallization portion 102 and the metallization portion 702. The chiplet 406 may be coupled to the metallization portion 102 through a plurality of solder interconnects 740. The chiplet 406 may be touching the metallization portion 702. For example, interconnects from the chiplet 406 may be touching at least one metallization interconnect from the plurality of metallization interconnects 721 of the metallization portion 702.

The encapsulation layer 708 may encapsulate the chiplet 106 and the chiplet 406. The encapsulation layer 708 may be coupled to the metallization portion 102 and the metallization portion 702. A plurality of through mold vias 780 may be located in the encapsulation layer 708. The plurality of through mold vias 780 are located between the metallization portion 102 and the metallization portion 702. The plurality of through mold vias 780 may be configured to be coupled to the metallization portion 102 and the metallization portion 702. For example, the plurality of through mold vias 780 may be configured to be coupled to (i) the plurality of metallization interconnects 121 of the metallization portion 102 and (ii) the plurality of metallization interconnects 721 of the metallization portion 702.

The integrated device 104 is configured to be electrically coupled to the integrated device 404 through the metallization portion 102. For example, an electrical path between the integrated device 104 and the integrated device 404 may include at least one metallization interconnect from the plurality of metallization interconnects 121 from the metallization portion 102. The electrical path between the integrated device 104 and the integrated device 404 may be configured for signals (e.g., input/output signals) between the integrated device 104 and the integrated device 404.

In some implementations, an electrical path (e.g., configured for providing power) between the substrate 709 and the integrated device 104 may include (i) at least one a solder interconnect from the plurality of solder interconnects 196, (ii) at least one metallization interconnect from the plurality of metallization interconnects 721, (iii) the chiplet 106, (iv) at least one solder interconnect from the plurality of solder interconnects 710, and (v) at least one metallization interconnect from the plurality of metallization interconnects 121.

In some implementations, an electrical path between the substrate 709 and the integrated device 104 may include (i) at least one a solder interconnect from the plurality of solder interconnects 196, (ii) at least one metallization interconnect from the plurality of metallization interconnects 721, (iii) at least one through mold via from the plurality of through mold vias 780 and (iv) at least one metallization interconnect from the plurality of metallization interconnects 121.

In some implementations, an electrical path (e.g., configured for providing power) between the substrate 709 and the integrated device 404 may include (i) at least one a solder interconnect from the plurality of solder interconnects 196, (ii) at least one metallization interconnect from the plurality of metallization interconnects 721, (iii) the chiplet 406, (iv) at least one solder interconnect from the plurality of solder interconnects 740, and (v) at least one metallization interconnect from the plurality of metallization interconnects 121.

In some implementations, an electrical path between the substrate 709 and the integrated device 404 may include (i) at least one a solder interconnect from the plurality of solder interconnects 196, (ii) at least one metallization interconnect from the plurality of metallization interconnects 721, (iii) at least one through mold via from the plurality of through mold vias 780 and (iv) at least one metallization interconnect from the plurality of metallization interconnects 121.

The integrated device 104 is configured to be electrically coupled to the chiplet 106. For example, the integrated device 104 may be configured to be electrically coupled to the chiplet 106 through an electrical path that includes at least one metallization interconnect from the plurality of metallization interconnects 121 and at least one solder interconnect from the plurality of solder interconnects 710.

The integrated device 404 is configured to be electrically coupled to the chiplet 406. For example, the integrated device 404 may be configured to be electrically coupled to the chiplet 406 through an electrical path that includes at least one metallization interconnect from the plurality of metallization interconnects 121 and at least one solder interconnect from the plurality of solder interconnects 740.

Figure 8:
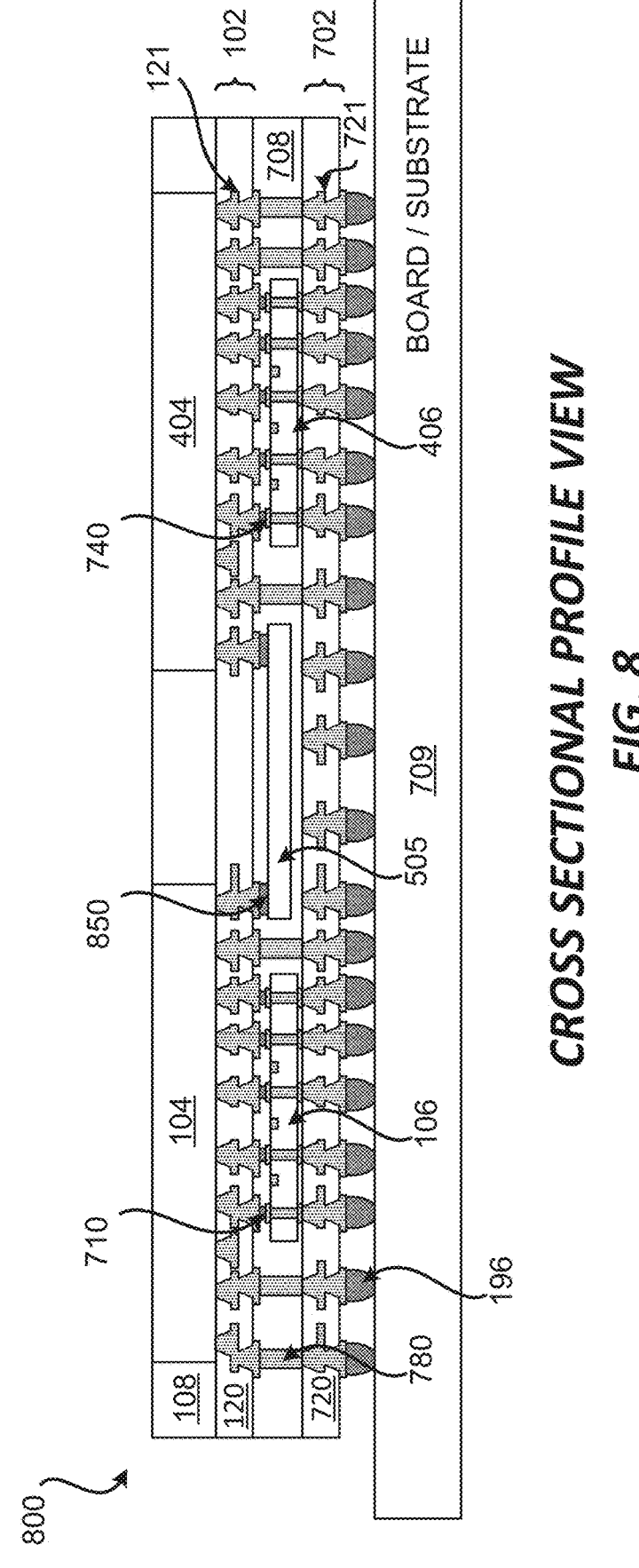
FIG. 8 illustrates a cross sectional view of a package comprising multiple integrated devices, a metallization portion, a bridge, and multiple deep trench capacitors.

FIG. 8 illustrates a package 800 that includes at least two integrated devices and at least two chiplets. The package 800 is similar to the package 700, and thus the package 800 may be configured in a similar manner as described for the package 700. The package 800 includes an integrated device 104, a chiplet 106, an integrated device 404, a chiplet 406, a metallization portion 102, a metallization portion 702, a bridge 505, an encapsulation layer 108 and an encapsulation layer 708. The metallization portion 102 includes at least one dielectric layer 120 and a plurality of metallization interconnects 121. The metallization portion 702 includes at least one dielectric layer 720 and a plurality of metallization interconnects 721. The encapsulation layer 108 encapsulates the integrated device 104, the integrated device 404. The encapsulation layer 108 may be coupled to the metallization portion 102.

The chiplet 106 is located between the metallization portion 102 and the metallization portion 702. The chiplet 106 may be coupled to the metallization portion 102 through a plurality of solder interconnects 710. The plurality of solder interconnects 710 may be coupled to at least one interconnect from the chiplet 106 and at least one metallization interconnect from the plurality of metallization interconnects 121 of the metallization portion 102. The chiplet 106 may be touching the metallization portion 702. For example, interconnects from the chiplet 106 may be touching at least one metallization interconnect from the plurality of metallization interconnects 721 of the metallization portion 702. The chiplet 406 is located between the metallization portion 102 and the metallization portion 702. The chiplet 406 may be coupled to the metallization portion 102 through a plurality of solder interconnects 740. The chiplet 406 may be touching the metallization portion 702. For example, interconnects from the chiplet 406 may be touching at least one metallization interconnect from the plurality of metallization interconnects 721 of the metallization portion 702.

The bridge 505 is located between the metallization portion 102 and the metallization portion 702. The bridge 505 is coupled to the metallization portion 102 through a plurality of solder interconnects 850. The bridge 505 may include a die substrate and a plurality of bridge interconnects. The bridge 505 may include a dielectric layer. A front side of the bridge 505 may be coupled to the metallization portion 102.

The encapsulation layer 708 may encapsulate the chiplet 106, the chiplet 406 and the bridge 505. The encapsulation layer 708 may be coupled to the metallization portion 102 and the metallization portion 702. A plurality of through mold vias 780 may be located in the encapsulation layer 708. The plurality of through mold vias 780 are located between the metallization portion 102 and the metallization portion 702. The plurality of through mold vias 780 may be configured to be coupled to the metallization portion 102 and the metallization portion 702. For example, the plurality of through mold vias 780 may be configured to be coupled to (i) the plurality of metallization interconnects 121 of the metallization portion 102 and (ii) the plurality of metallization interconnects 721 of the metallization portion 702.

The integrated device 104 is configured to be electrically coupled to the integrated device 404 through the metallization portion 102 and the bridge 505. For example, an electrical path between the integrated device 104 and the integrated device 404 may include (i) at least one metallization interconnect from the plurality of metallization interconnects 121 from the metallization portion 102, (ii) at least one solder interconnect from the plurality of solder interconnects 850, (iii) the bridge 505, (iv) at least one solder interconnect from the plurality of solder interconnects 850, and (v) at least one metallization interconnect from the plurality of metallization interconnects 121 from the metallization portion 102. The electrical path between the integrated device 104 and the integrated device 404 may be configured for signals (e.g., input/output signals) between the integrated device 104 and the integrated device 404.

In some implementations, an electrical path (e.g., configured for providing power) between the substrate 709 and the integrated device 104 may include (i) at least one a solder interconnect from the plurality of solder interconnects 196, (ii) at least one metallization interconnect from the plurality of metallization interconnects 721, (iii) the chiplet 106, (iv) at least one solder interconnect from the plurality of solder interconnects 710, and (v) at least one metallization interconnect from the plurality of metallization interconnects 121.

In some implementations, an electrical path between the substrate 709 and the integrated device 104 may include (i) at least one a solder interconnect from the plurality of solder interconnects 196, (ii) at least one metallization interconnect from the plurality of metallization interconnects 721, (iii) at least one through mold via from the plurality of through mold vias 780 and (iv) at least one metallization interconnect from the plurality of metallization interconnects 121.

In some implementations, an electrical path (e.g., configured for providing power) between the substrate 709 and the integrated device 404 may include (i) at least one a solder interconnect from the plurality of solder interconnects 196, (ii) at least one metallization interconnect from the plurality of metallization interconnects 721, (iii) the chiplet 406, (iv) at least one solder interconnect from the plurality of solder interconnects 740, and (v) at least one metallization interconnect from the plurality of metallization interconnects 121.

In some implementations, an electrical path between the substrate 709 and the integrated device 404 may include (i) at least one a solder interconnect from the plurality of solder interconnects 196, (ii) at least one metallization interconnect from the plurality of metallization interconnects 721, (iii) at least one through mold via from the plurality of through mold vias 780 and (iv) at least one metallization interconnect from the plurality of metallization interconnects 121.

The integrated device 104 is configured to be electrically coupled to the chiplet 106. For example, the integrated device 104 may be configured to be electrically coupled to the chiplet 106 through an electrical path that includes at least one metallization interconnect from the plurality of metallization interconnects 121 and at least one solder interconnect from the plurality of solder interconnects 710.

The integrated device 404 is configured to be electrically coupled to the chiplet 406. For example, the integrated device 404 may be configured to be electrically coupled to the chiplet 406 through an electrical path that includes at least one metallization interconnect from the plurality of metallization interconnects 121 and at least one solder interconnect from the plurality of solder interconnects 740.

Figure 9:
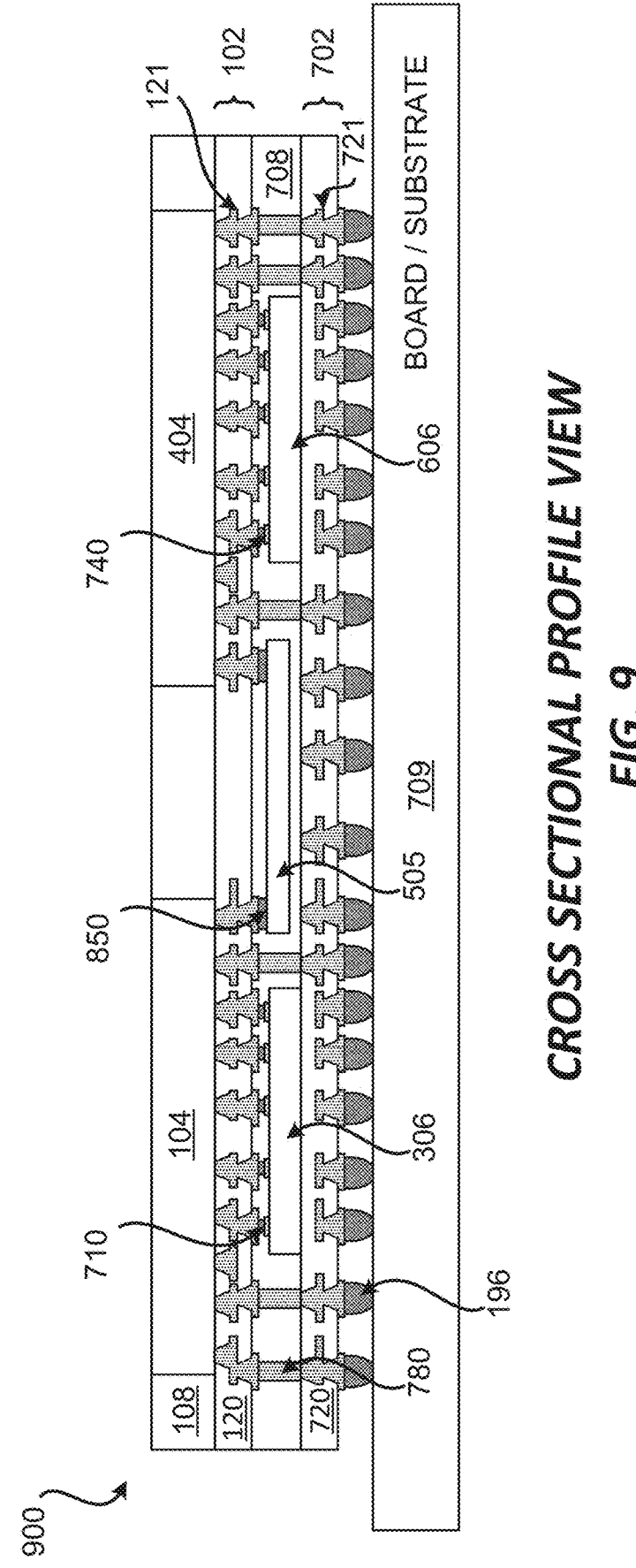
FIG. 9 illustrates a cross sectional view of a package comprising multiple integrated devices, a metallization portion, a bridge, and multiple chiplets.

FIG. 9 illustrates a package 900 that includes at least two integrated devices and at least two chiplets. The package 900 is similar to the package 800, and thus the package 900 may be configured in a similar manner as described for the package 800. The package 900 includes an integrated device 104, a chiplet 306, an integrated device 404, a chiplet 606, a metallization portion 102, a metallization portion 702, a bridge 505, an encapsulation layer 108 and an encapsulation layer 708. The metallization portion 102 includes at least one dielectric layer 120 and a plurality of metallization interconnects 121. The metallization portion 702 includes at least one dielectric layer 720 and a plurality of metallization interconnects 721. The encapsulation layer 108 encapsulates the integrated device 104, the integrated device 404. The encapsulation layer 108 may be coupled to the metallization portion 102.

The chiplet 306 is located between the metallization portion 102 and the metallization portion 702. The chiplet 306 may be coupled to the metallization portion 102 through a plurality of solder interconnects 710. The plurality of solder interconnects 710 may be coupled to at least one interconnect from the chiplet 306 and at least one metallization interconnect from the plurality of metallization interconnects 121 of the metallization portion 102. The chiplet 306 may be touching the metallization portion 702. For example, interconnects from the chiplet 306 may be touching at least one metallization interconnect from the plurality of metallization interconnects 721 of the metallization portion 702. The chiplet 606 is located between the metallization portion 102 and the metallization portion 702. The chiplet 606 may be coupled to the metallization portion 102 through a plurality of solder interconnects 740. The chiplet 606 may be touching the metallization portion 702. For example, interconnects from the chiplet 606 may be touching at least one metallization interconnect from the plurality of metallization interconnects 721 of the metallization portion 702.

The bridge 505 is located between the metallization portion 102 and the metallization portion 702. The bridge 505 is coupled to the metallization portion 102 through a plurality of solder interconnects 850. The bridge 505 may include a die substrate and a plurality of bridge interconnects. The bridge 505 may include a dielectric layer. A front side of the bridge 505 may be coupled to the metallization portion 102.

The encapsulation layer 708 may encapsulate the chiplet 306, the chiplet 606 and the bridge 505. The encapsulation layer 708 may be coupled to the metallization portion 102 and the metallization portion 702. A plurality of through mold vias 780 may be located in the encapsulation layer 708. The plurality of through mold vias 780 are located between the metallization portion 102 and the metallization portion 702. The plurality of through mold vias 780 may be configured to be coupled to the metallization portion 102 and the metallization portion 702. For example, the plurality of through mold vias 780 may be configured to be coupled to (i) the plurality of metallization interconnects 121 of the metallization portion 102 and (ii) the plurality of metallization interconnects 721 of the metallization portion 702.

A front side of the bridge 505 faces the metallization portion 102. A front side of the chiplet 306 faces the metallization portion 102. A front side of the chiplet 606 faces the metallization portion 102.

The integrated device 104 is configured to be electrically coupled to the integrated device 404 through the metallization portion 102 and the bridge 505. For example, an electrical path between the integrated device 104 and the integrated device 404 may include (i) at least one metallization interconnect from the plurality of metallization interconnects 121 from the metallization portion 102, (ii) at least one solder interconnect from the plurality of solder interconnects 850, (iii) the bridge 505, (iv) at least one solder interconnect from the plurality of solder interconnects 850, and (v) at least one metallization interconnect from the plurality of metallization interconnects 121 from the metallization portion 102. The electrical path between the integrated device 104 and the integrated device 404 may be configured for signals (e.g., input/output signals) between the integrated device 104 and the integrated device 404.

In some implementations, an electrical path (e.g., configured for providing power) between the substrate 709 and the integrated device 104 may include (i) at least one a solder interconnect from the plurality of solder interconnects 196, (ii) at least one metallization interconnect from the plurality of metallization interconnects 721, (iii) the chiplet 306, (iv) at least one solder interconnect from the plurality of solder interconnects 710, and (v) at least one metallization interconnect from the plurality of metallization interconnects 121.

In some implementations, an electrical path between the substrate 709 and the integrated device 104 may include (i) at least one a solder interconnect from the plurality of solder interconnects 196, (ii) at least one metallization interconnect from the plurality of metallization interconnects 721, (iii) at least one through mold via from the plurality of through mold vias 780 and (iv) at least one metallization interconnect from the plurality of metallization interconnects 121.

In some implementations, an electrical path (e.g., configured for providing power) between the substrate 709 and the integrated device 404 may include (i) at least one a solder interconnect from the plurality of solder interconnects 196, (ii) at least one metallization interconnect from the plurality of metallization interconnects 721, (iii) the chiplet 606, (iv) at least one solder interconnect from the plurality of solder interconnects 740, and (v) at least one metallization interconnect from the plurality of metallization interconnects 121.

In some implementations, an electrical path between the substrate 709 and the integrated device 404 may include (i)

at least one a solder interconnect from the plurality of solder interconnects 196, (ii) at least one metallization interconnect from the plurality of metallization interconnects 721, (iii) at least one through mold via from the plurality of through mold vias 780 and (iv) at least one metallization interconnect from the plurality of metallization interconnects 121.

The integrated device 104 is configured to be electrically coupled to the chiplet 306. For example, the integrated device 104 may be configured to be electrically coupled to the chiplet 306 through an electrical path that includes at least one metallization interconnect from the plurality of metallization interconnects 121 and at least one solder interconnect from the plurality of solder interconnects 710.

The integrated device 404 is configured to be electrically coupled to the chiplet 606. For example, the integrated device 404 may be configured to be electrically coupled to the chiplet 606 through an electrical path that includes at least one metallization interconnect from the plurality of metallization interconnects 121 and at least one solder interconnect from the plurality of solder interconnects 740.

Figure 10:
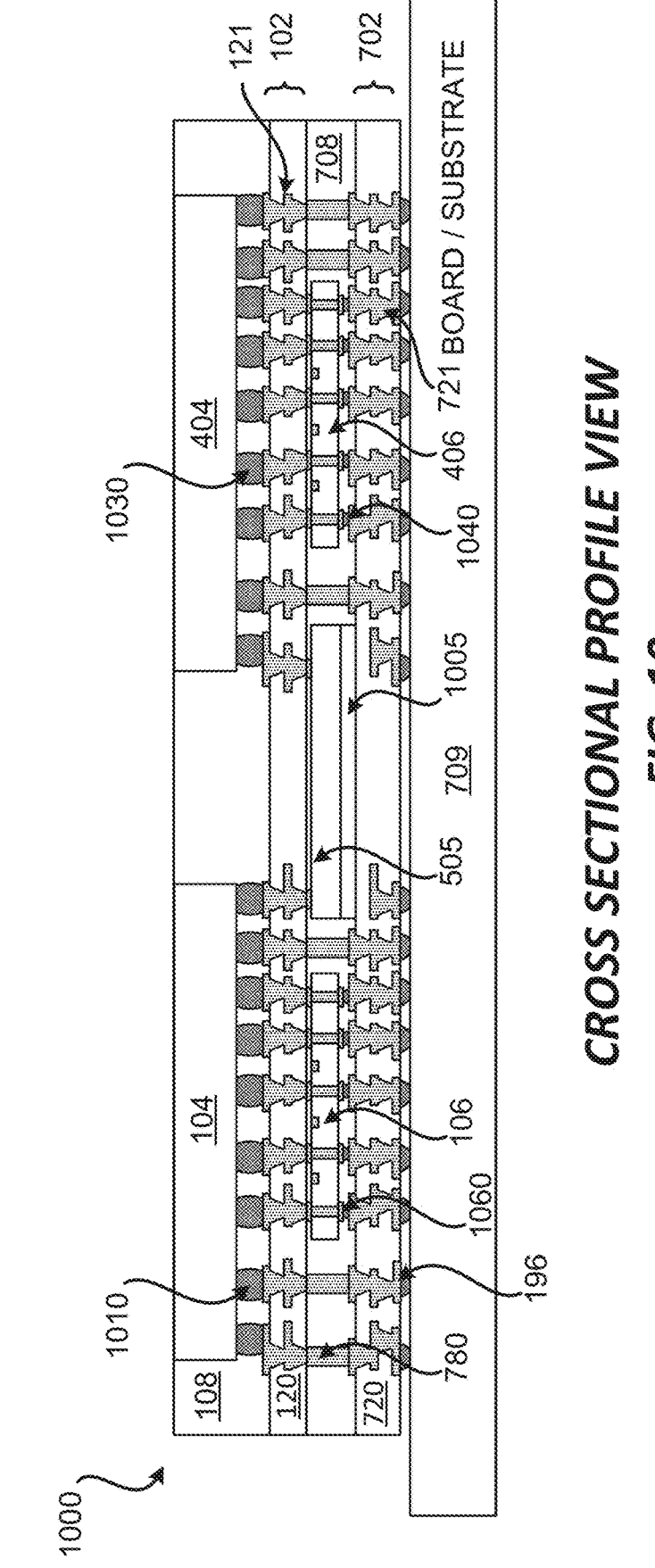
FIG. 10 illustrates a cross sectional view of a package comprising multiple integrated devices, a metallization portion, a bridge, and multiple deep trench capacitor.

FIG. 10 illustrates a package 1000 that includes at least two integrated devices and at least two chiplets. The package 1000 is similar to the package 900, and thus the package 1000 may be configured in a similar manner as described for the package 1000. The package 1000 includes an integrated device 104, a chiplet 106, an integrated device 404, a chiplet 406, a metallization portion 102, a metallization portion 702, a bridge 505, an encapsulation layer 108 and an encapsulation layer 708. The metallization portion 102 includes at least one dielectric layer 120 and a plurality of metallization interconnects 121. The metallization portion 702 includes at least one dielectric layer 720 and a plurality of metallization interconnects 721. The encapsulation layer 108 encapsulates the integrated device 104, the integrated device 404. The encapsulation layer 108 may be coupled to the metallization portion 102.

The chiplet 106 is located between the metallization portion 102 and the metallization portion 702. The chiplet 106 may be coupled to the metallization portion 702 through a plurality of solder interconnects 710. The plurality of solder interconnects 710 may be coupled to at least one interconnect from the chiplet 106 and at least one metallization interconnect from the plurality of metallization interconnects 721 of the metallization portion 702. The chiplet 106 may be touching the metallization portion 102. For example, interconnects from the chiplet 106 may be touching at least one metallization interconnect from the plurality of metallization interconnects 121 of the metallization portion 102. The chiplet 406 is located between the metallization portion 102 and the metallization portion 702. The chiplet 406 may be coupled to the metallization portion 702 through a plurality of solder interconnects 740. The chiplet 406 may be touching the metallization portion 102. For example, interconnects from the chiplet 406 may be touching at least one metallization interconnect from the plurality of metallization interconnects 121 of the metallization portion 102.

The bridge 505 is located between the metallization portion 102 and the metallization portion 702. The bridge 505 is coupled to the metallization portion 102. The bridge 505 may include a die substrate and a plurality of die interconnects. The bridge 505 may include a dielectric layer. A front side of the bridge 505 may be coupled to the metallization portion 102. A back side of the bridge 505 may be coupled to the metallization portion 702 through an adhesive 1005. For example, a back side of the die substrate of the bridge 505 may be coupled to the metallization portion 702 through the adhesive 1005. A front side of the bridge 505 faces the metallization portion 102. A front side of the chiplet 406 faces the metallization portion 102. A front side of the chiplet 406 faces the metallization portion 102.

The encapsulation layer 708 may encapsulate the chiplet 106, the chiplet 406 and the bridge 505. The encapsulation layer 708 may be coupled to the metallization portion 102 and the metallization portion 702. A plurality of through mold vias 780 may be located in the encapsulation layer 708. The plurality of through mold vias 780 are located between the metallization portion 102 and the metallization portion 702. The plurality of through mold vias 780 may be configured to be coupled to the metallization portion 102 and the metallization portion 702. For example, the plurality of through mold vias 780 may be configured to be coupled to (i) the plurality of metallization interconnects 121 of the metallization portion 102 and (ii) the plurality of metallization interconnects 721 of the metallization portion 702.

The integrated device 104 is coupled to the metallization portion 102 through a plurality of solder interconnects 1010. The integrated device 404 is coupled to the metallization portion 102 through a plurality of solder interconnects 1030. The integrated device 104 is configured to be electrically coupled to the integrated device 404 through the metallization portion 102 and the bridge 505. For example, an electrical path between the integrated device 104 and the integrated device 404 may include (i) at least one solder interconnect from the plurality of solder interconnects 1010, (ii) at least one metallization interconnect from the plurality of metallization interconnects 121 from the metallization portion 102, (iii) the bridge 505, (iv) at least one metallization interconnect from the plurality of metallization interconnects 121 from the metallization portion 102, and (v) at least one solder interconnect from the plurality of solder interconnects 1030. The electrical path between the integrated device 104 and the integrated device 404 may be configured for signals (e.g., input/output signals) between the integrated device 104 and the integrated device 404.

In some implementations, an electrical path (e.g., configured for providing power) between the substrate 709 and the integrated device 104 may include (i) at least one a solder interconnect from the plurality of solder interconnects 196, (ii) at least one metallization interconnect from the plurality of metallization interconnects 721, (ii) at least one solder interconnect from the plurality of solder interconnects 1060, (iv) the chiplet 106, (v) at least one metallization interconnect from the plurality of metallization interconnects 121, and (vi) at least one solder interconnect from the plurality of solder interconnects 1010.

In some implementations, an electrical path between the substrate 709 and the integrated device 104 may include (i) at least one a solder interconnect from the plurality of solder interconnects 196, (ii) at least one metallization interconnect from the plurality of metallization interconnects 721, (iii) at least one through mold via from the plurality of through mold vias 780, (iv) at least one metallization interconnect from the plurality of metallization interconnects 121, and (v) at least one solder interconnect from the plurality of solder interconnects 1010.

In some implementations, an electrical path (e.g., configured for providing power) between the substrate 709 and the integrated device 404 may include (i) at least one a solder interconnect from the plurality of solder interconnects 196, (ii) at least one metallization interconnect from the plurality of metallization interconnects 721, (ii) at least one solder interconnect from the plurality of solder interconnects 1040, (iv) the chiplet 406, (v) at least one metallization interconnect from the plurality of metallization interconnects 121, and (vi) at least one solder interconnect from the plurality of solder interconnects 1030.

In some implementations, an electrical path between the substrate 709 and the integrated device 404 may include (i) at least one a solder interconnect from the plurality of solder interconnects 196, (ii) at least one metallization interconnect from the plurality of metallization interconnects 721, (iii) at least one through mold via from the plurality of through mold vias 780, (iv) at least one metallization interconnect from the plurality of metallization interconnects 121, and (v) at least one solder interconnect from the plurality of solder interconnects 1030.

The integrated device 104 is configured to be electrically coupled to the chiplet 106. For example, the integrated device 104 may be configured to be electrically coupled to the chiplet 106 through an electrical path that includes at least one solder interconnect from the plurality of solder interconnects 1010 and at least one metallization interconnect from the plurality of metallization interconnects 121.

The integrated device 404 is configured to be electrically coupled to the chiplet 406. For example, the integrated device 404 may be configured to be electrically coupled to the chiplet 406 through an electrical path that includes at least one solder interconnect from the plurality of solder interconnects 1030, and at least one metallization interconnect from the plurality of metallization interconnects 121.

The package 1000 is coupled to the substrate 709 through a plurality of solder interconnects 196. The substrate 709 may be a board (e.g., printed circuit board).

FIGS. 1-10 illustrate various packages that include at least one chiplet that is located near an integrated device. The use of the chiplets and integrated devices with metallization portion(s) provides several advantages. One, a chiplet can be fabricated using a different fabrication process (e.g., technology node) than an integrated device. This helps with cost savings since a chiplet may not need to be fabricated using the most expensive fabrication process. Moreover, the use of chiplets with metallization portion(s) helps improve electrical performance between integrated devices and/or chiplets, as the chiplets and/or the integrated devices can be located close to each other.

As mentioned above, a package may include several metallization portions. Any of the metallization portions may be a first metallization portion, and/or any of the metallization portions may be a second metallization portion. For example, in some implementations, the metallization portion 102 may be considered a first metallization portion, and the metallization portion 702 may be considered a second metallization portion. In some implementations, the metallization portion 702 may be considered a first metallization portion, and the metallization portion 102 may be considered a second metallization portion.

As mentioned above, a chiplet may include a trench capacitor and/or be configured to operate as a trench capacitor device. A trench capacitor and/or a trench capacitor device provides a capacitor with high capacitance and/or high capacitance density. Capacitors with higher capacitance density allow for more compact form factors for the package, since these capacitors take up less space but can provide capacitance that are the same and/or comparable to larger sized capacitors. The compact form factor of the trench capacitors allows them to be located very closely to an integrated device, which can help improve power delivery performance to an integrated device. Moreover, since these trench capacitors have small form factors, they can be implemented with a metallization portion instead of being implemented in a package substrate.

Exemplary Chiplet with Trench Capacitors

Figure 11:
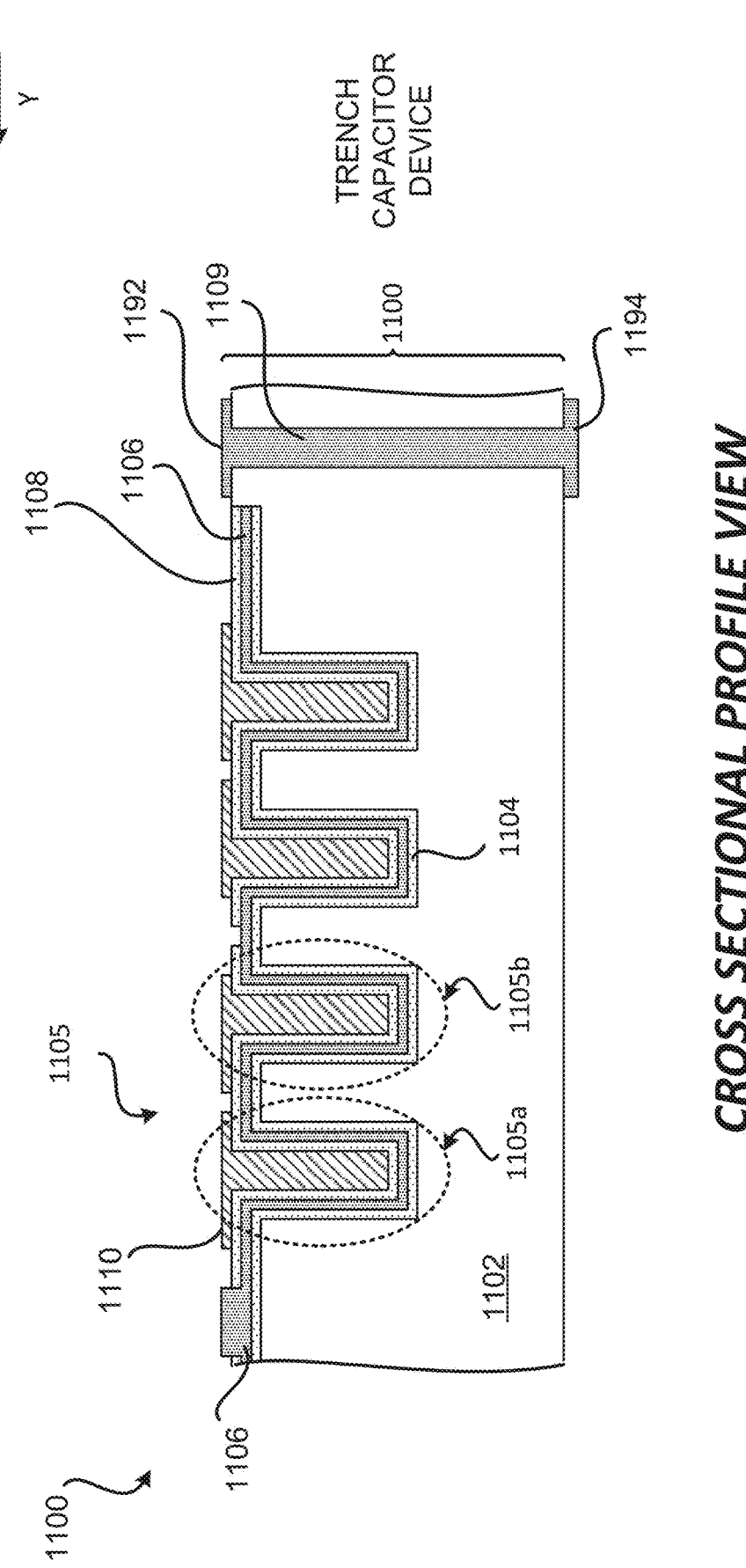
FIG. 11 illustrates a cross sectional profile view of a deep trench capacitor.

FIG. 11 illustrates a cross sectional profile view of a chiplet 1100 that configured as a trench capacitor device. The chiplet 1100 may be an integrated passive device that includes multiple trench capacitors (e.g., deep trench capacitors). The chiplet 1100 may be a means for trench capacitance. The chiplet 1100 may represent the chiplet 106 and/or the chiplet 406. The chiplet 1100 includes a front side and a back side. The front side of the chiplet 1100 may include the plurality of trench capacitors.

The chiplet 1100 includes a chiplet substrate 1102 and a plurality of trench capacitors 1105. A plurality of solder interconnects (not shown) may be coupled to the chiplet 1100. The chiplet substrate 1102 may include silicon (Si). The chiplet substrate 1102 may include a plurality of trenches and/or cavities over which capacitors may be formed. Examples of trenches and/or cavities are further described below in at least FIGS. 12A-12C.

The plurality of trench capacitors 1105 includes a trench capacitor 1105a and a trench capacitor 1105b. The trench capacitor 1105a and the trench capacitor 1105b may be configured to be part of a same capacitor (e.g., first capacitor, first trench capacitor). The trench capacitor 1105a and the trench capacitor 1105b may be configured to be coupled to and/or part of a first power distribution network (PDN). The trench capacitor 1105a and the trench capacitor 1105b may be configured to be part of a first electrical path for a first power for a package. The trench capacitor 1105a and the trench capacitor 1105b may be configured to be coupled to integrated device(s).

As shown in FIG. 11, the chiplet 1100 includes the chiplet substrate 1102, an oxide layer 1104, a first electrically conductive layer 1106, a dielectric layer 1108, and a second electrically conductive layer 1110. The first electrically conductive layer 1106 and/or the second electrically conductive layer 1110 may include polysilicon. The oxide layer 1104 and/or the dielectric layer 1108 may include $SiO_2$ (e.g., low-pressure chemical vapor deposition (LPCVD) $SiO_2$) or $Si_3N_4$ (e.g., LPCVD $Si_3N_4$). Portions of the oxide layer 1104, the first electrically conductive layer 1106, the dielectric layer 1108, and the second electrically conductive layer 1110 may be located in trenches and/or cavities of the chiplet substrate 1102. It is noted that a chiplet substrate 1102 may be considered to have a trench or a cavity, even if the trench or the cavity is filled with one or more materials.

The trench capacitor 1105a (e.g., first trench capacitor, first capacitor, means for first trench capacitance) may be defined by (i) a first portion of the oxide layer 1104, (ii) a first portion of the first electrically conductive layer 1106, (iii) a first portion of the dielectric layer 1108, and (iv) a first portion of the second electrically conductive layer 1110 that are located in a trench (e.g., first trench) of the chiplet substrate 1102.

The trench capacitor 1105b (e.g., second trench capacitor, second capacitor, means for second trench capacitance) may be defined by (i) a second portion of the oxide layer 1104, (ii) a second portion of the first electrically conductive layer 1106, (iii) a second portion of the dielectric layer 1108, and (iv) a second portion of the second electrically conductive layer 1110 that are located in a trench (e.g., second trench) of the chiplet substrate 1102. It is noted that trench capacitor 1105b may be part of a same capacitor as the trench capacitor 1105a. That is, the trench capacitor 1105a and the trench capacitor 1105b may be configured to be electrically coupled together to form a capacitor (e.g., first capacitor) with a greater capacitance.

The chiplet 1100 also includes an interconnect 1109, an interconnect 1192 and an interconnect 1194. The interconnect 1109 is coupled to the interconnect 1192 and the interconnect 1194. The interconnect 1109 may be a through substrate via that extends through the chiplet substrate 1102. The interconnect 1192 may be a pad interconnect. The interconnect 1194 may be a pad interconnect. The interconnect 1192 may be located on the front side of the chiplet 1100. The interconnect 1194 may be located on the back side of the chiplet 1100. The interconnect 1109 may be a through chiplet substrate interconnect. The chiplet may include at least one through chiplet substrate interconnect.

An integrated device (e.g., 104, 404) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 104, 404) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one or more integrated devices). As mentioned above, using several chiplets that perform several functions may reduce the overall cost of a package relative to using a single chip to perform all of the functions of a package. In some implementations, one or more of the chiplets (e.g., 106, 306, 406, 606, 1100) and/or one of more of integrated devices (e.g., 104, 404) described in the disclosure may be fabricated using the same technology node or two or more different technology nodes. For example, an integrated device (e.g., 104) may be fabricated using a first technology node, and a chiplet (e.g., 106) may be fabricated using a second technology node that is not as advanced as the first technology node. In such an example, the integrated device (e.g., 104) may include components (e.g., interconnects, transistors) that have a first minimum size, and the chiplet (e.g., 106) may include components (e.g., interconnects, transistors) that have a second minimum size, where the second minimum size is greater than the first minimum size. In some implementations, the integrated device 104 and the integrated device 404 of a package, may be fabricated using the same technology node or different technology nodes. In some implementations, a chiplet (e.g., 106) and another chiplet (e.g., 406) of a package, may be fabricated using the same technology node or different technology nodes.

As an example, in some implementations, a first integrated device (e.g., 104) may include a first plurality of die interconnects comprising a first minimum spacing, and a second integrated device (e.g., 404) may include a second plurality of die interconnects comprising a second minimum spacing. A chiplet (e.g., 106, 306, 406) may include a plurality of interconnects comprising a third minimum spacing. In some implementations, the third minimum spacing may be different than the first minimum spacing and/or the second minimum spacing. In another example, in some implementations, an integrated device (e.g., 104, 404) may include a plurality of die interconnects comprising a first minimum spacing, and a chiplet (e.g., 106, 306, 406) may include a plurality of interconnects comprising a second minimum spacing. In yet another example, in some implementations, an integrated device (e.g., 104, 404) may include a first plurality of transistors comprising a first minimum spacing, and a chiplet (e.g., 106, 306, 606) may include a second plurality of transistors comprising a second minimum spacing. In some implementations, the first minimum spacing may be less than the second minimum spacing. In some implementations, the first minimum spacing may be the same as the second minimum spacing.

Exemplary Sequence for Fabricating a Chiplet with Trench Capacitors

In some implementations, fabricating an chiplet with trench capacitors includes several processes. FIGS. 12A-12D illustrate an exemplary sequence for providing or fabricating a chiplet with trench capacitors. In some implementations, the sequence of FIGS. 12A-12D may be used to provide or fabricate the chiplet 1100 of FIG. 11. However, the process of FIGS. 12A-12D may be used to fabricate any of the chiplets (e.g., 106, 406) described in the disclosure.

It should be noted that the sequence of FIGS. 12A-12D may combine one or more stages in order to simplify and/or clarify the sequence for providing or fabricating a chiplet with trench capacitors. In some implementations, the order of the processes may be changed or modified. In some implementations, one or more of processes may be replaced or substituted without departing from the scope of the disclosure.

Figure 12A:
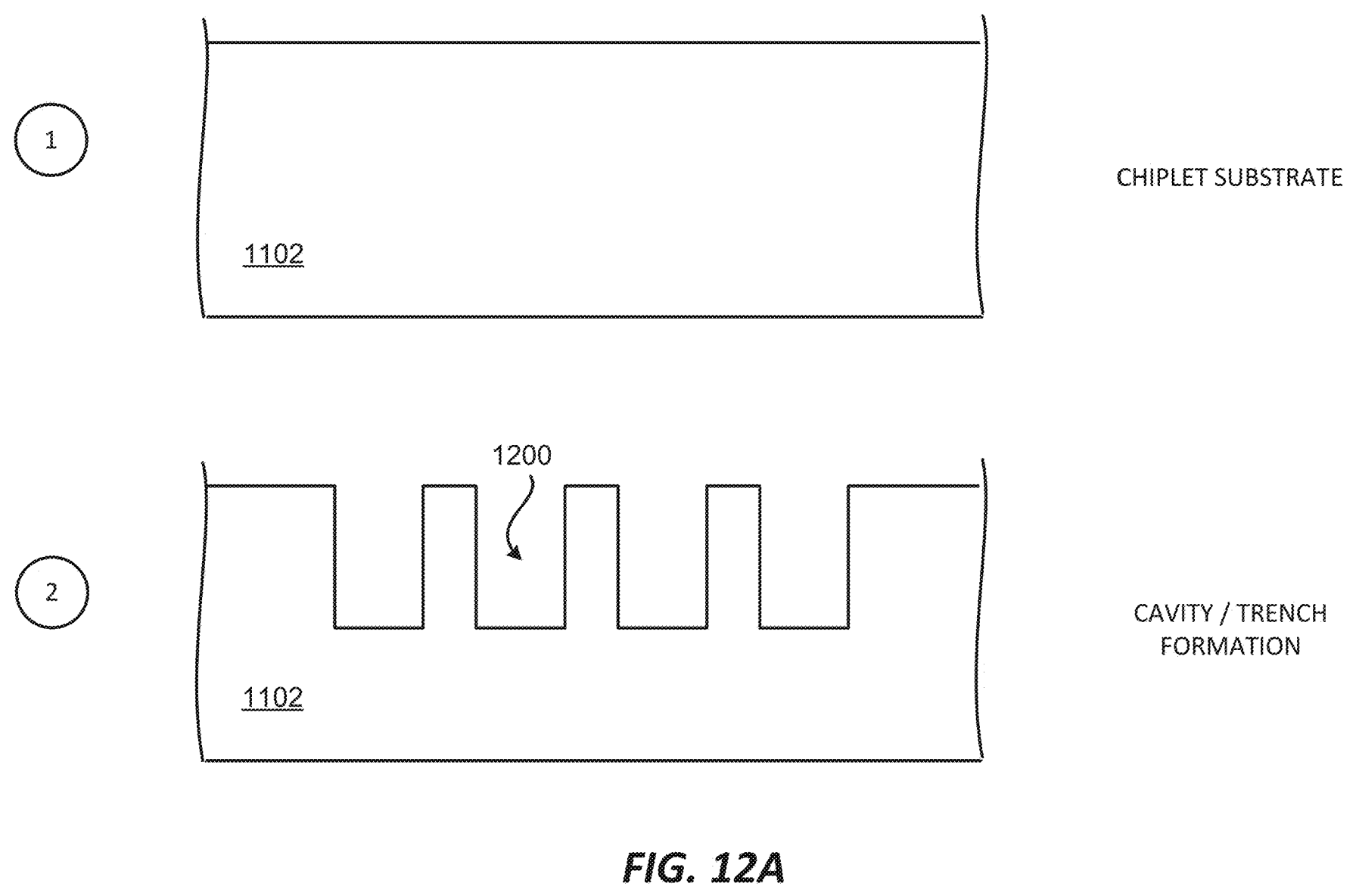

Stage 1, as shown in FIG. 12A, illustrates a state after a substrate 1102 is provided. The substrate 1102 may be a chiplet substrate. The substrate 1102 may include silicon (Si).

Stage 2 illustrates a state after a plurality of trenches 1200 is formed in the substrate 1102. The plurality of trenches 1200 may include a plurality of cavities. The plurality of trenches 1200 may include a first trench, a second trench, a third trench, and a fourth trench. The trenches may have different shapes and/or different depths. An etching process may be used to form the plurality of trenches. The plurality of trenches 1200 may be evenly spaced or have different spacing.

Stage 3, as shown in FIG. 12B, illustrates a state after an oxide layer 1104 is formed over a surface of the substrate 1102. A deposition process may be used to form the oxide layer 1104 over the surface of the substrate 1102 including over and in the plurality of trenches 1200. For example, a chemical vapor deposition (CVD) process may be used to form the oxide layer 1104. A low-pressure chemical vapor deposition (LPCVD) process may be used to form the oxide layer 1104. The oxide layer 1104 may take up the shape and/or contour of the plurality of trenches 1200.

Stage 4 illustrates a state after a first electrically conductive layer 1106 is formed over the oxide layer 1104. The first electrically conductive layer 1106 may include polysilicon. A deposition process may be used to form the first electrically conductive layer 1106 over the oxide layer 1104 including over and in the plurality of trenches 1200. For example, a chemical vapor deposition (CVD) process may be used to form the first electrically conductive layer 1106. A low-pressure chemical vapor deposition (LPCVD) process may be used to form the first electrically conductive layer 1106. The first electrically conductive layer 1106 may take up the shape and/or the contour of the oxide layer 1104 and/or the plurality of trenches 1200. The first electrically conductive layer 1106 may include polysilicon. The first electrically conductive layer 1106 may be doped. An example of a dopant includes boron. Thus, for example, the first electrically conductive layer 1106 may include a LPCVD polysilicon doped with boron.

Figure 12C:
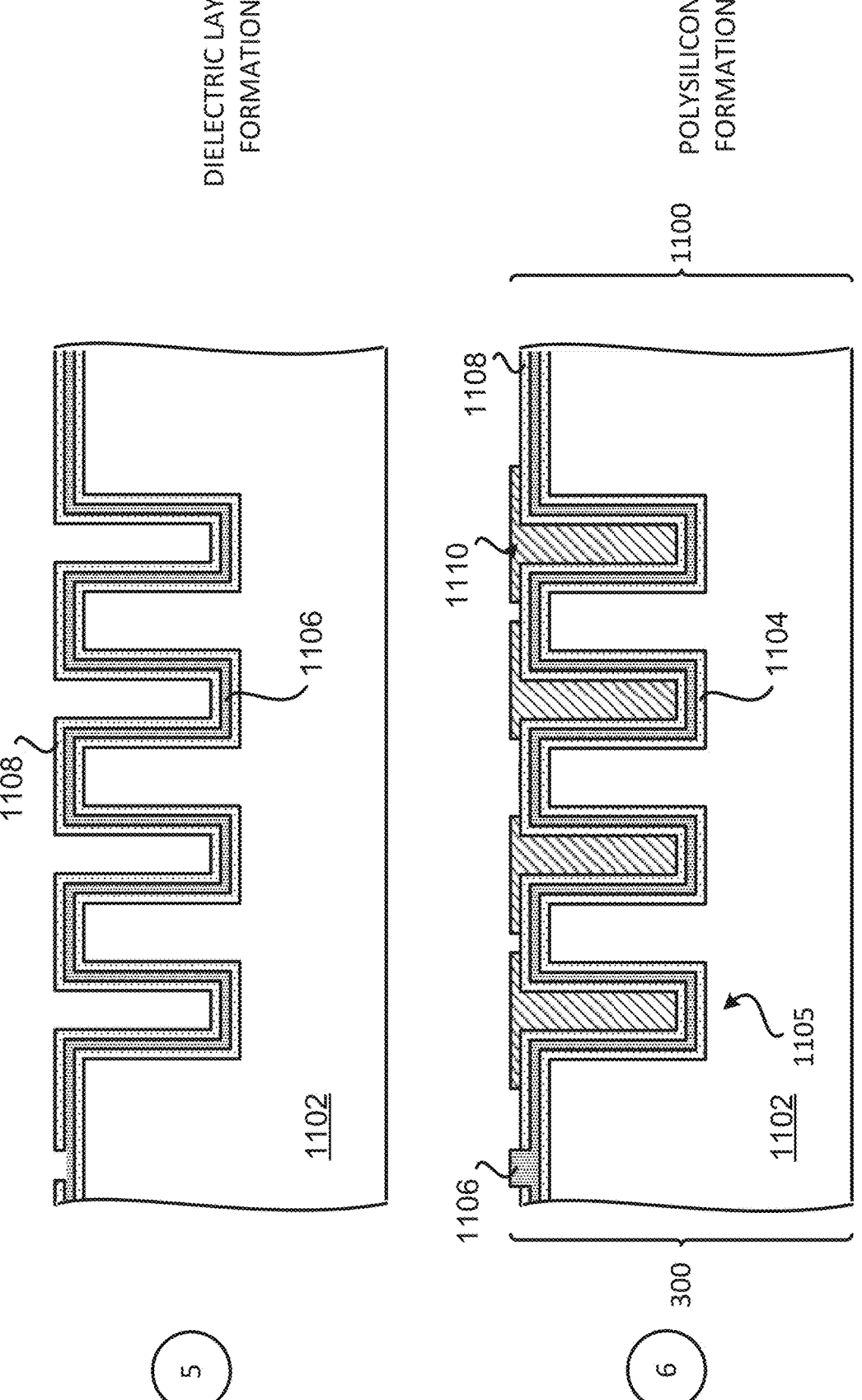

Stage 5, as shown in FIG. 12C, illustrates a state after a dielectric layer 1108 is formed over the first electrically conductive layer 1106. A deposition process and/or a lamination process may be used to form the dielectric layer 1108 over the first electrically conductive layer 1106 including over and in the plurality of trenches 1200.

Stage 6 illustrates a state after a second electrically conductive layer 1110 is formed over the dielectric layer 1108. The second electrically conductive layer 1110 may include polysilicon. A deposition process may be used to form the second electrically conductive layer 1110 over the dielectric layer 1108 including over and in the plurality of trenches 1200. For example, a chemical vapor deposition (CVD) process may be used to form the second electrically conductive layer 1110. A low-pressure chemical vapor deposition (LPCVD) process may be used to form the second electrically conductive layer 1110. An etching process may be used to form the various portions of the second electrically conductive layer 1110. The second electrically conductive layer 1110 may fill up the plurality of trenches 1200. The second electrically conductive layer 1110 may be doped. An example of a dopant includes boron. Thus, for example, the second electrically conductive layer 1110 may include a LPCVD polysilicon doped with boron. Stage 6 may also illustrate where additional portion(s) of the first electrically conductive layer 1106 may be formed. The additional portion(s) of the first electrically conductive layer 1106 may be formed through opening(s) of the dielectric layer 1108. The additional portion(s) of the first electrically conductive layer 1106 that is not covered by the dielectric layer 1108 may be used as a pad to be coupled to a solder interconnect. The additional portion of the first electrically conductive layer 1106 may be formed using a deposition process. The first electrically conductive layer 1106 and/or the second electrically conductive layer 1110 may include polysilicon.

Figure 12D:
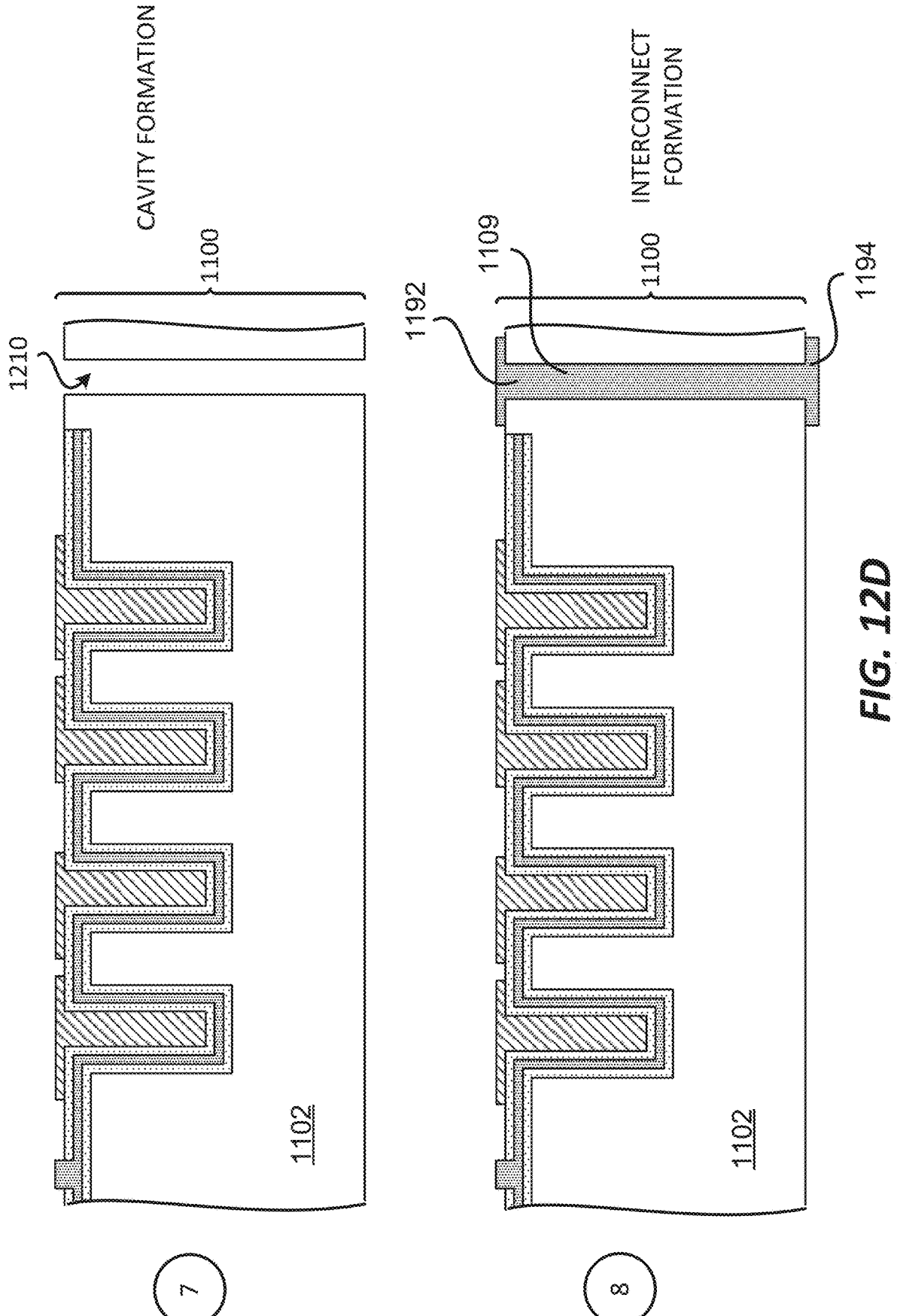

Stage 7, as shown in FIG. 12D, illustrates a state after at least one cavity 1210 is formed in the substrate 1102. An etching process and/or a laser process (e.g., laser ablation) may be used to form the at least one cavity 1210 that extends through the entire thickness of the substrate 1102.

Stage 8 illustrates a state after the interconnect 1109, the interconnect 1192 and the interconnect 1194 are formed. A plating process may be used to form the interconnect 1109, the interconnect 1192 and the interconnect 1194. Stage 8 illustrates an example of the chiplet 1100 that includes a plurality of trench capacitors 1105.

Exemplary Flow Diagram of a Method for Fabricating a Chiplet with Trench Capacitors In some implementations, fabricating chiplet with trench capacitors includes several processes. FIG. 13 illustrates an exemplary flow diagram of a method 1300 for providing or fabricating a chiplet with trench capacitors. In some implementations, the method 1300 of FIG. 13 may be used to provide or fabricate the chiplet 1100 of FIG. 11. However, the method 1300 may be used to fabricate any chiplet with trench capacitors. The method 1300 of FIG. 13 will be used to describe fabricating the chiplet 1100.

It should be noted that the method of FIG. 13 may combine one or more processes in order to simplify and/or clarify the method for providing or fabricating a chiplet with trench capacitor. In some implementations, the order of the processes may be changed or modified.

The method provides (at 1305) a substrate (e.g., 1102). The substrate 1102 may be a chiplet substrate. The substrate 1102 may include silicon (Si). Stage 1 of FIG. 12A illustrates and describes an example of providing a chiplet substrate.

The method forms (at 1310) a plurality of trenches (e.g., 1200) in the substrate (e.g., 1102). The plurality of trenches 1200 may include a plurality of cavities. The plurality of trenches 1200 may include a first trench, a second trench, a third trench, and a fourth trench. The trenches may have different shapes and/or different depths. An etching process may be used to form the plurality of trenches 1200. The plurality of trenches 1200 may be evenly spaced or have different spacing. Stage 2 of FIG. 12A illustrates and describes an example of forming trenches.

The method forms (at 1315) an oxide layer (e.g., 1104) over the plurality of trenches. The oxide layer 1104 may be formed over a surface of the substrate 1102. A deposition process may be used to form the oxide layer 1104 over the surface of the substrate 1102 including over and in the plurality of trenches 1200. A low-pressure chemical vapor deposition (LPCVD) process may be used to form the oxide layer 1104. The oxide layer 1104 may take up the shape and/or contour of the plurality of trenches 1200. Stage 3 of FIG. 12B illustrates and describes an example of forming an oxide layer.

The method forms (at 1320) a first electrically conductive layer (e.g., 1106) over an oxide layer (e.g., 1104). The first electrically conductive layer 1106 may be formed over the oxide layer 1104. The first electrically conductive layer 1106 may include polysilicon. A deposition process may be used to form the first electrically conductive layer 1106 over the oxide layer 1104 including over and in the plurality of trenches 1200. For example, a low-pressure chemical vapor deposition (LPCVD) process may be used to form the first electrically conductive layer 1106. The first electrically conductive layer 1106 may take up the shape and/or the contour of the oxide layer 1104 and/or the plurality of trenches 1200. Forming the first electrically conductive layer 1106 may include doping the first electrically conductive layer 1106 with a dopant. Stage 4 of FIG. 12B illustrates and describes an example of forming a first electrically conductive layer.

The method forms (at 1325) a dielectric layer (e.g., 1108) over the first electrically conductive layer (e.g., 1106). A deposition process may be used to form the dielectric layer 1108 over the first electrically conductive layer 1106 including over and in the plurality of trenches 1200. Stage 5 of FIG. 12C illustrates and describes an example of forming a dielectric layer.

The method forms (at 1330) a second electrically conductive layer (e.g., 1110) over the dielectric layer (e.g., 1108). The second electrically conductive layer 1110 may include polysilicon. A deposition process may be used to form the second electrically conductive layer 1110 over the dielectric layer 1108 including over and in the plurality of trenches 1200. A low-pressure chemical vapor deposition (LPCVD) process may be used to form the second electrically conductive layer 1110. The second electrically conductive layer 1110 may fill up the plurality of trenches 1200. In some implementations, additional portion(s) of the first electrically conductive layer 1106 may also be formed (at 1330). The additional portion(s) of the first electrically conductive layer 1106 may be formed through opening(s) of the dielectric layer 1108. The additional portion of the first electrically conductive layer 1106 may be used as pad(s) configured to be coupled to solder interconnects. Stage 6 of FIG. 12D illustrates and describes an example of forming a second electrically conductive layer.

The method forms (at 1335) at least one cavity (e.g., 1210) in the substrate 1102. An etching process and/or a laser process (e.g., laser ablation) may be used to form the at least one cavity 1210 that extends through the entire thickness of the substrate 1102. Stage 7 of FIG. 12D illustrates and describes an example of forming at least one cavity in a substrate.

The method forms (at 1340) at least one interconnect (e.g., 1109) in the cavity (e.g., 1210) of the substrate (e.g., 1102). In some implementations, a first interconnect (e.g., 1192) may be formed over a first surface of the substrate, and a second interconnect (e.g., 1194) may be formed over a second surface of the substrate. The first interconnect and the second interconnect may be coupled to the interconnect located in the cavity of the substrate. A plating process may be used to form the interconnects (e.g., 1109, 1192, 1194). Stage 8 of FIG. 12D illustrates and describes an example forming at least one interconnect in the cavity of a substrate.

Exemplary Sequence for Fabricating a Package Comprising an Integrated Device and a Chiplet FIGS. 14A-14D illustrate an exemplary sequence for providing or fabricating a package that includes an integrated device and a chiplet. In some implementations, the sequence of FIGS. 14A-14D may be used to provide or fabricate the package 500 of FIG. 5, or any of the packages described in the disclosure.

It should be noted that the sequence of FIGS. 14A-14D may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 14A-14D may be used to fabricate one package or several packages at a time (as part of a wafer).

Figure 14A:
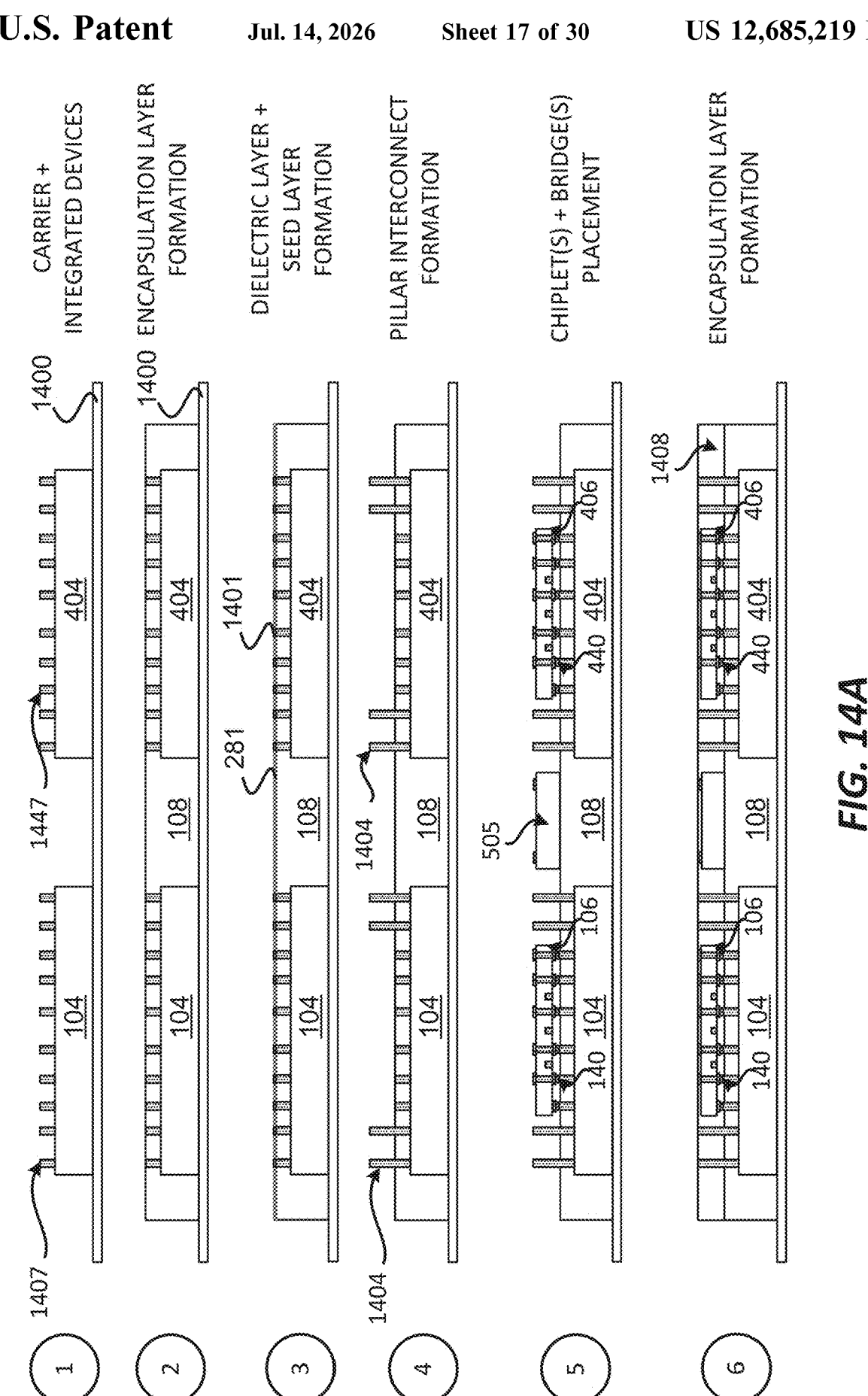

Stage 1, as shown in FIG. 14A, illustrates a state after an integrated device 104 and an integrated device 404 are provided on a carrier 1400. A pick and place process may be used to place the back side of the integrated device 104 and the back side of the integrated device 404 on the carrier 1400. The carrier 1400 may include a tape. The integrated device 104 may include a plurality of pillar interconnects 1407. The plurality of pillar interconnects 1407 may include a plurality of inter pillar interconnects. The integrated device 404 may include a plurality of pillar interconnects 1447. The plurality of pillar interconnects 1447 may include a plurality of inter pillar interconnects. Some of the plurality of pillar interconnects 1407 may represent the plurality of pillar interconnects 107*b*. Some of the plurality of pillar interconnects 1447 may represent the plurality of pillar interconnects 407*b*.

Stage 2 illustrates a state after an encapsulation layer 108 is formed over the carrier 1400, the integrated device 104 and the integrated device 404. The encapsulation layer 108 is coupled to the carrier 1400, the integrated device 104 and the integrated device 404. The encapsulation layer 108 may encapsulate the plurality of pillar interconnects 1407 and the plurality of pillar interconnects 1447. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. In some implementations, the encapsulation layer 108 is provided and then a polishing and/or grinding process is performed to remove portions of the encapsulation layer 108 and/or portions of the pillar interconnects 1407 of the integrated device 104 and/or portions of the pillar interconnects 1447 of the integrated device 404, so as to create a planar surface.

Stage 3 illustrates a state after a dielectric layer 281 is optionally formed over the surface of the encapsulation layer 108. There may be openings in the dielectric layer 281 that expose the pillar interconnects of the integrated device 104 and the pillar interconnects of the integrated device 404. The dielectric layer 281 may include polyimide (PI). The dielectric layer 281 may help create a more planar surface. In some implementations, a seed layer 1401 may be optionally formed over the plurality of pillar interconnects. The seed layer 1401 may be located in the opening of the dielectric layer 281. The seed layer 1401 may help interconnects to formed over the pillar interconnects.

Stage 4 illustrates a state after (i) a plurality of pillar interconnects 1404 are formed and coupled to the pillar interconnects of the integrated device 104 and (ii) a plurality of pillar interconnects 1414 are formed and coupled to the pillar interconnects of the integrated device 404. A plating process may be used to form the plurality of pillar interconnects 1404 and/or 1414. The plurality of pillar interconnects 1404 may represent the plurality of pillar interconnects 107*a*. The plurality of pillar interconnects 1414 may represent the plurality of pillar interconnects 407*a*. In some implementations, the plurality of pillar interconnects 1404 may include the seed layer 1401 and/or the plurality of pillar interconnects 1407. In some implementations, the plurality of pillar interconnects 1414 may include the seed layer 1401 and/or the plurality of pillar interconnects 1447. For the purpose of simplifying the figures, stage 4 and the subsequent stages of FIGS. 14A-14D do not illustrate the dielectric layer 281 and the seed layer 1401. However, it is noted that the dielectric layer 281 and the seed layer 1401 may be located in the package in a manner consistent with what is described in the disclosure.

Stage 5 illustrates a state after the chiplet 106 is coupled to the plurality of pillar interconnects 1407 of the integrated device 104 through a plurality of solder interconnects 140. Stage 5 also illustrates a state after the chiplet 406 is coupled to the plurality of pillar interconnects 1447 of the integrated device 404 through a plurality of solder interconnects 440. A solder reflow process may be used to couple the chiplet 106 and the chiplet 406 to their respective pillar interconnects. Stage 5 also illustrates a state after a bridge 505 is placed on the encapsulation layer 108. The back side of the bridge 505 may be placed and/or coupled to the encapsulation layer 108. When the dielectric layer 281 is present, the back side of the bridge 505 may be placed and/or coupled to the dielectric layer 281.

Stage 6 illustrates a state after an encapsulation layer 1408 is formed over the encapsulation layer 108, the dielectric layer 281, the chiplet 106, the chiplet 406, the plurality of pillar interconnects 1404 and/or the plurality of pillar interconnects 1414. The encapsulation layer 1408 is coupled to the encapsulation layer 108, the dielectric layer 281, the chiplet 106, the chiplet 406, the plurality of pillar interconnects 1404 and/or the plurality of pillar interconnects 1414. The encapsulation layer 1408 may include a mold, a resin and/or an epoxy. The encapsulation layer 1408 may be a means for encapsulation. The encapsulation layer 1408 may be provided by using a compression and transfer molding process, a sheet molding process, or a liquid molding process. In some implementations, the encapsulation layer 1408 is provided and then a polishing and/or grinding process is performed to remove portions of the encapsulation layer 1408 and/or portions of the pillar interconnects 1404 and/or portions of the pillar interconnects 1414, so as to create a planar surface.

Figure 14B:
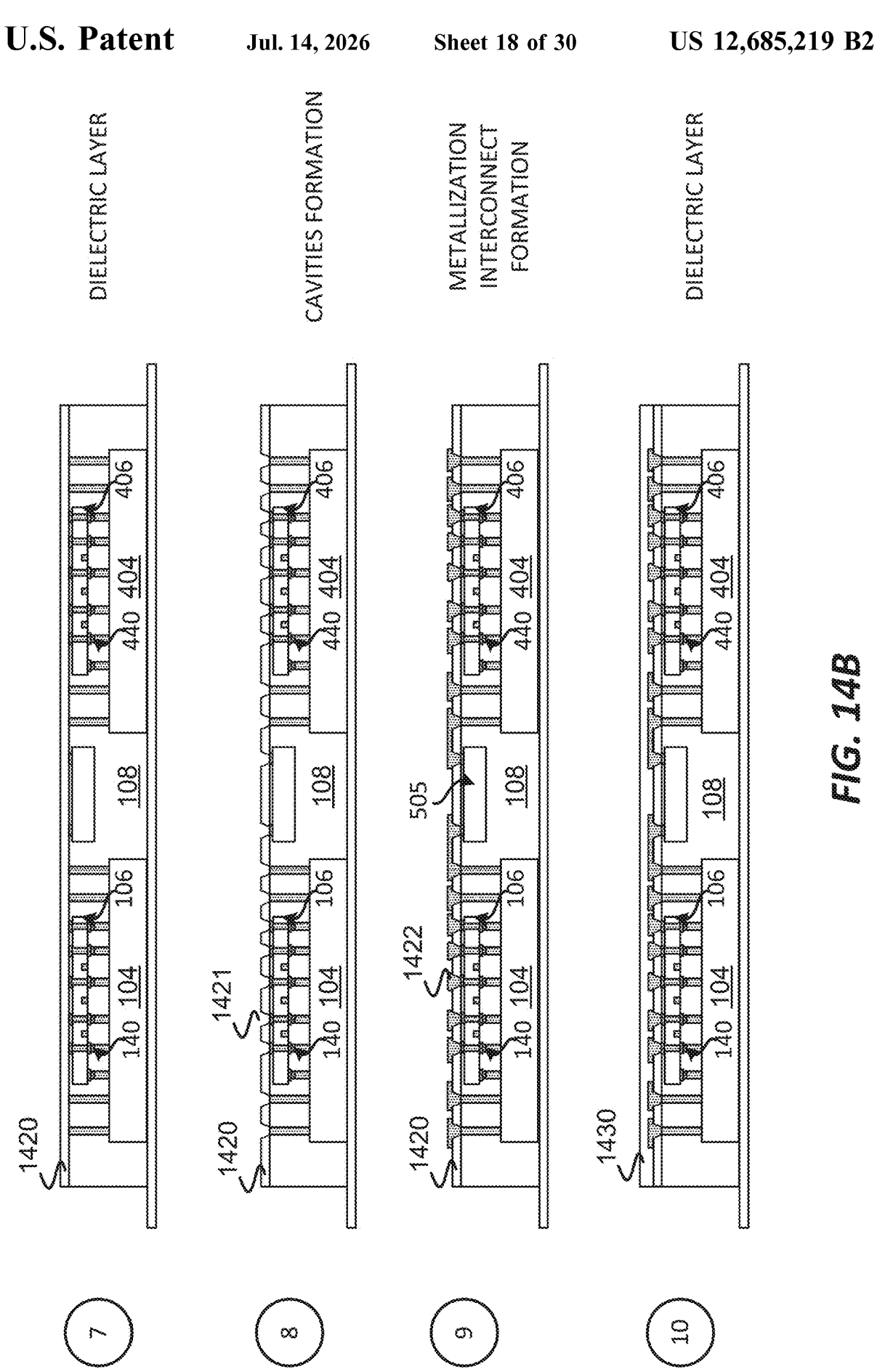

Stage 7, as shown in FIG. 14B, illustrates a state after dielectric layer 1420 is formed over the encapsulation layer 108. It is noted that the encapsulation layer 108 may represent the encapsulation layer 108 and the encapsulation layer 1408. In some implementations, the encapsulation layer 108 shown at stage 7 may include the dielectric layer 281 as described above in FIG. 14A. A lamination process may be used to form the dielectric layer 1420.

Stage 8 illustrates a state after a plurality of cavities 1421 are formed in the dielectric layer 1420. The plurality of cavities 1421 may be openings in the dielectric layer 1420 that expose interconnects. An exposure and development process may be used to form the plurality of cavities 1421.

Stage 9 illustrates a state after a plurality of metallization interconnects 1422 are formed in and over the dielectric layer 1420. A plating process may be used to form the plurality of metallization interconnects 1422.

Stage 10 illustrates a state after dielectric layer 1430 is formed over the dielectric layer 1420. A lamination process may be used to form the dielectric layer 1430.

Figure 14C:
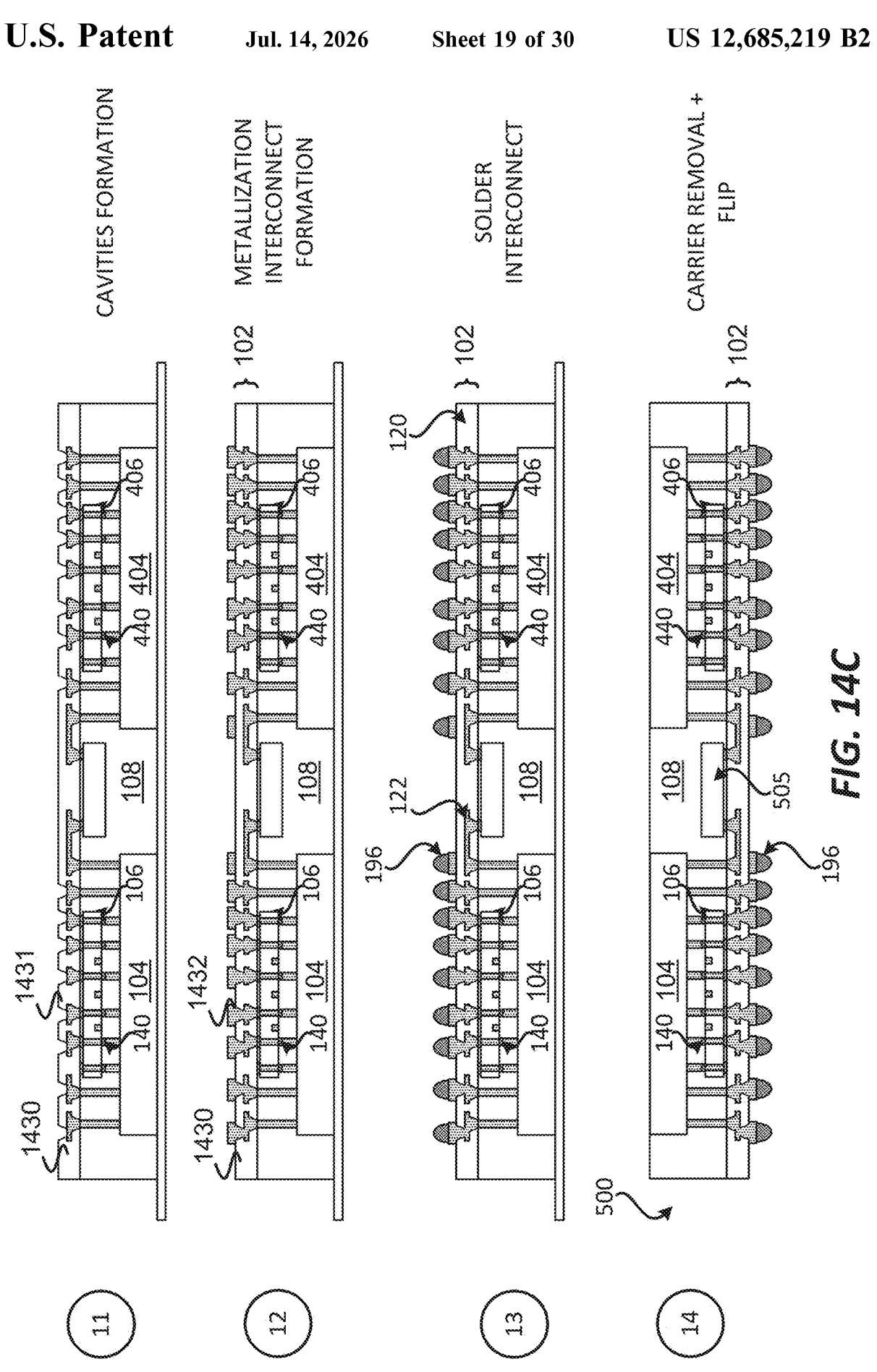

Stage 11, as shown in FIG. 14C, illustrates a state after a plurality of cavities 1431 are formed in the dielectric layer 1430. The plurality of cavities 1431 may be openings in the dielectric layer 1430 that expose interconnects. An exposure and development process may be used to form the plurality of cavities 1431.

Stage 12 illustrates a state after a plurality of metallization interconnects 1432 are formed in and over the dielectric layer 1430. The plurality of metallization interconnects 1432 may be coupled to the plurality of metallization interconnects 1422. A plating process may be used to form the plurality of metallization interconnects 1432. The dielectric layer 1420, the dielectric layer 1430, the plurality of metallization interconnects 1422 and the plurality of metallization interconnects 1432 may form the metallization portion 102. The plurality of metallization interconnects 1422 and the plurality of metallization interconnects 1432 may be represented by the plurality of metallization interconnects 122. The dielectric layer 1420 and the dielectric layer 1430 may be represented by the at least one dielectric layer 120.

Stage 13 illustrates a state after a plurality of solder interconnects 196 are coupled to the metallization portion 102. The plurality of solder interconnects 196 may be coupled to the plurality of metallization interconnects 122 of the metallization portion 102. A solder reflow process may be used to couple the plurality of solder interconnects 196 to the metallization portion 102.

Stage 14 illustrates a state after the carrier 1400 is decoupled from the encapsulation layer 108, leaving the package 500 that includes the integrated device 104, the integrated device 404, the chiplet 106, the chiplet 406, the bridge 505, the metallization portion 102 and the encapsulation layer 108.

Stage 15, as shown in FIG. 14D, illustrates a state after the package 500 is coupled to the substrate 109 through the plurality of solder interconnects 196. A solder reflow process may be used to couple the package 500 to the substrate 109.

Stage 16 illustrates a state after an underfill 105 is formed between the package 500 and the substrate 109. The underfill 105 may be coupled to the substrate 109 and to the side of the package 500.

FIGS. 14A-14D illustrate an example of a method for fabricating a package. The method may provide a first integrated device and a first plurality of inter pillar interconnects. The method may form an encapsulation layer that encapsulates the first integrated device and the first plurality of inter pillar interconnects. The method may form a first plurality of pillar interconnects that are configured to be coupled to the first integrated device. The method may couple a first chiplet to the first integrated device through the first plurality of inter pillar interconnects. The method may form a first metallization portion such that the first metallization portion is coupled to the first chiplet and the first encapsulation layer. In some implementations, the method may form a second encapsulation layer that encapsulates the first chiplet. The second encapsulation layer and the encapsulation layer may be part of a same encapsulation layer. The method may provide a second integrated device and a second plurality of inter pillar interconnects, where forming the encapsulation layer comprises forming the encapsulation layer that further encapsulates the second integrated device and the second plurality of inter pillar interconnects. The method may couple a second chiplet to the second integrated device through the second plurality of inter pillar interconnects. The method may provide a bridge that is configured to provide at least one electrical path between the first integrated device and the second integrated device.

Figure 15A:
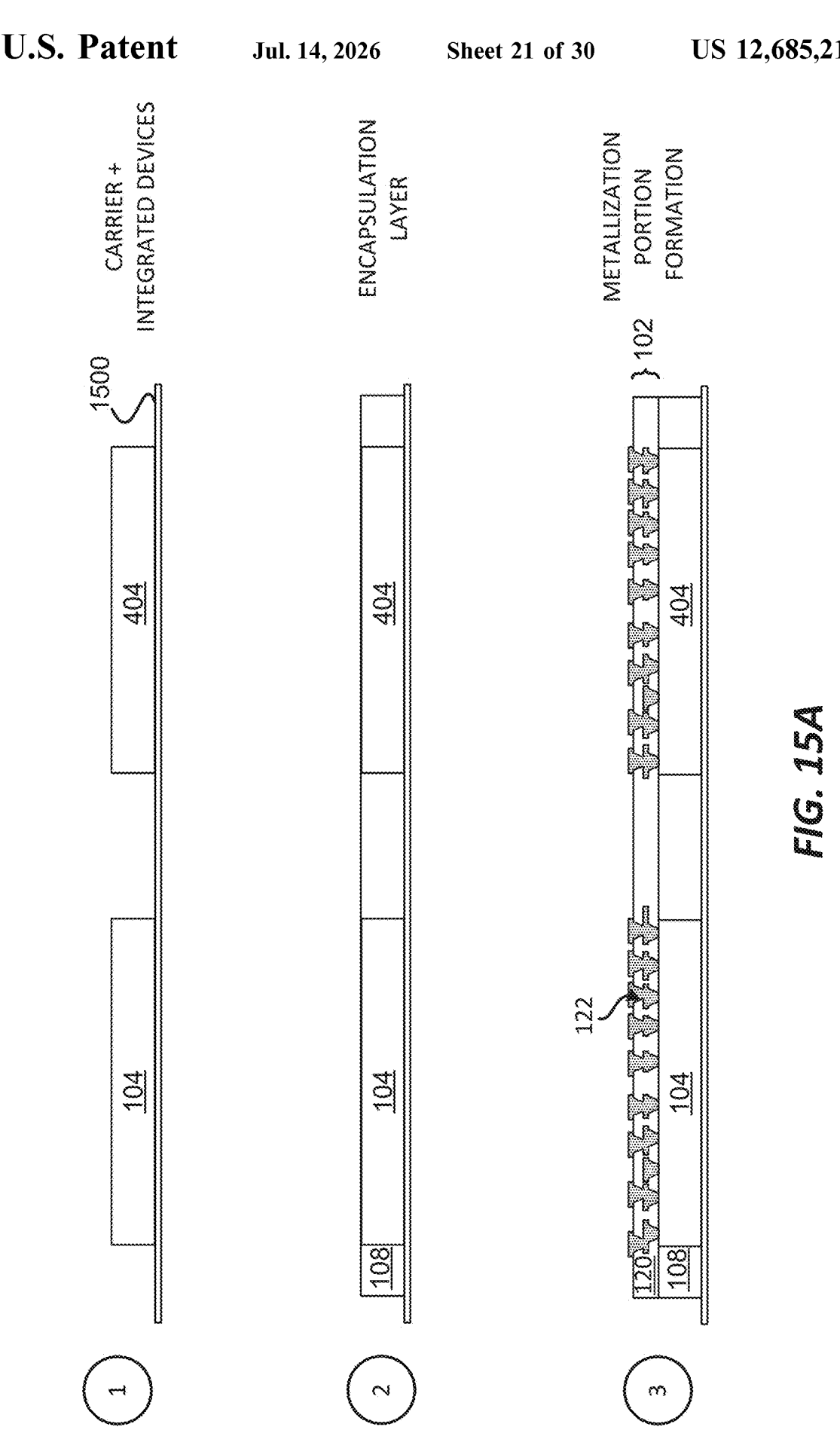
FIGS. 15A-15C illustrate an exemplary sequence for fabricating a package comprising multiple integrated devices, a metallization portion, a bridge, and multiple deep trench capacitors.
Figure 15B:
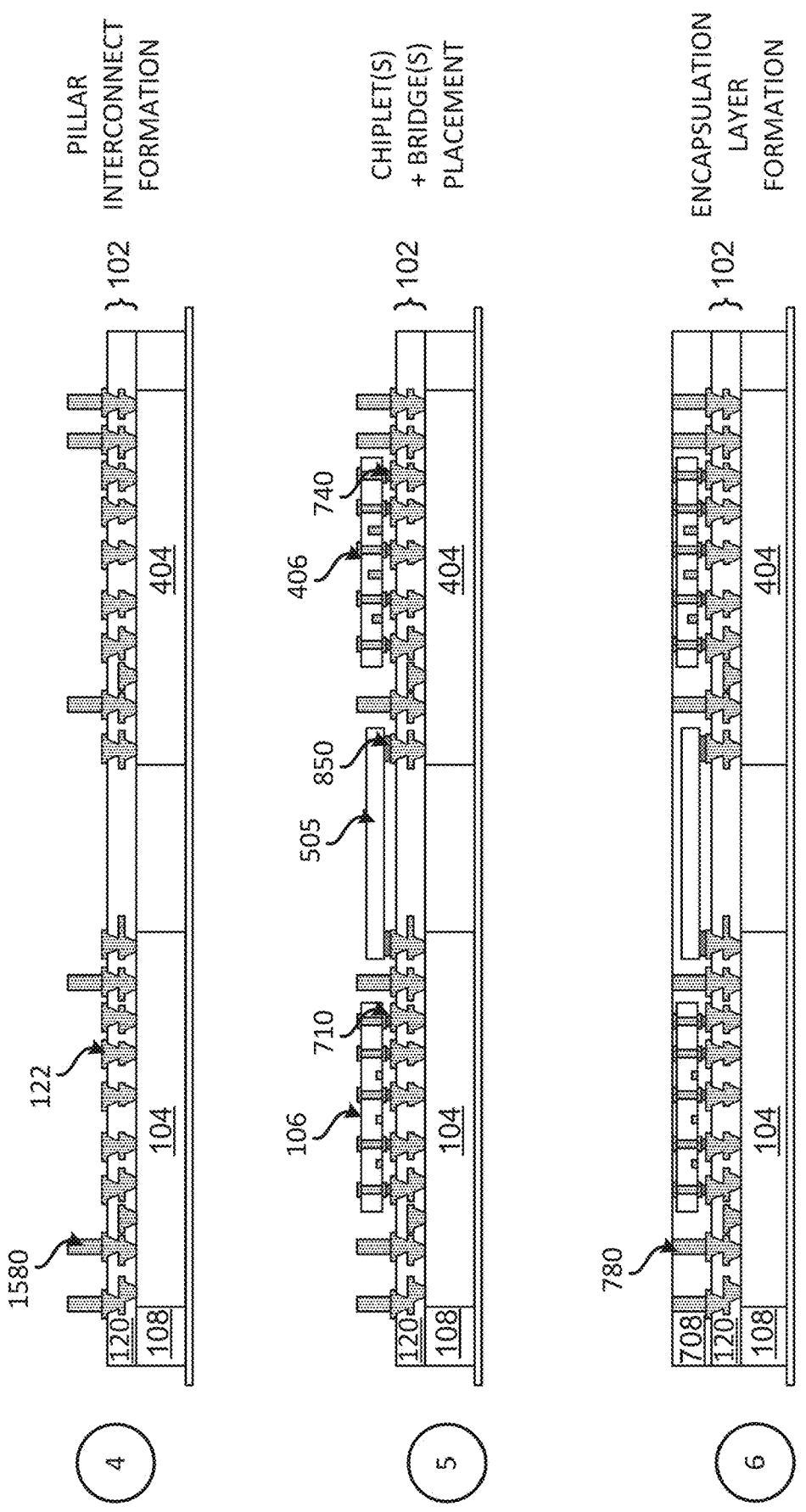
Figure 15C:

Exemplary Sequence for Fabricating a Package Comprising an Integrated Device and a Chiplet FIGS. 15A-15C illustrate an exemplary sequence for providing or fabricating a package that includes an integrated device and a chiplet. In some implementations, the sequence of FIGS. 15A-15C may be used to provide or fabricate the package 800 of FIG. 8, or any of the packages described in the disclosure.

It should be noted that the sequence of FIGS. 15A-15C may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 15A-15C may be used to fabricate one package or several packages at a time (as part of a wafer).

Stage 1, as shown in FIG. 15A, illustrates a state after an integrated device 104 and an integrated device 404 are provided on a carrier 1500. A pick and place process may be used to place the back side of the integrated device 104 and the back side of the integrated device 404 on the carrier 1500. The carrier 1500 may include a tape.

Stage 2 illustrates a state after an encapsulation layer 108 is formed over the carrier 1500, the integrated device 104 and the integrated device 404. The encapsulation layer 108 is coupled to the carrier 1500, the integrated device 104 and the integrated device 404. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. In some implementations, the encapsulation layer 108 is provided and then a polishing and/or grinding process is performed to remove portions of the encapsulation layer 108, so as to create a planar surface.

Stage 3 illustrates a state after a metallization portion 102 is formed. The metallization portion 102 may be formed over the integrated device 104, the integrated device 404 and the encapsulation layer 108. The metallization portion 102 includes at least one dielectric layer 120 and a plurality of metallization interconnects 122. The metallization portion 102 may be formed in a similar as manner as described for the metallization portion 102 shown in FIGS. 14A-14D.

Stage 4, as shown in FIG. 15B, illustrates a state after a plurality of pillar interconnects 1580 are formed. A plating process may be used to form the plurality of pillar interconnects 1580. The plurality of pillar interconnects may be coupled to the plurality of metallization interconnects 122.

Stage 5 illustrates a state after the chiplet 106 is coupled to the plurality of metallization interconnects 122 through a plurality of solder interconnects 740. Stage 5 also illustrates a state after the chiplet 406 is coupled to the plurality of metallization interconnects 122 through a plurality of solder interconnects 740. A solder reflow process may be used to couple the chiplet 106 and the chiplet 406 to the plurality of metallization interconnects 122. Stage 5 also illustrates a state after a bridge 505 is coupled to the plurality of metallization interconnects 122 through a plurality of solder interconnects 850. The front side of the bridge 505 may face the metallization portion 102.

Stage 6 illustrates a state after an encapsulation layer 708 is formed over the encapsulation layer 108, the chiplet 106, the chiplet 406, the bridge 505, and the plurality of pillar interconnects 1580. The encapsulation layer 708 is coupled to the encapsulation layer 108, the chiplet 106, the chiplet 406, the bridge 505, and the plurality of pillar interconnects 1580. The plurality of pillar interconnects 1580 may be represented as the plurality of through mold vias 780 in the encapsulation layer 708. The encapsulation layer 708 may include a mold, a resin and/or an epoxy. The encapsulation layer 708 may be a means for encapsulation. The encapsulation layer 708 may be provided by using a compression and transfer molding process, a sheet molding process, or a liquid molding process. In some implementations, the encapsulation layer 708 is provided and then a polishing and/or grinding process is performed to remove portions of the encapsulation layer 708 and/or portions of the through mold vias 780, so as to create a planar surface.

Stage 7, as shown in FIG. 15C, illustrates a state after a metallization portion 702 is formed. The metallization portion 702 may be formed over the encapsulation layer 708, the chiplet 106 and the chiplet 406. The metallization portion 702 includes at least one dielectric layer 720 and a plurality of metallization interconnects 722. The metallization portion 702 may be formed in a similar as manner as described for the metallization portion 102 shown in FIGS. 14A-14D.

Stage 8 illustrates a state after a plurality of solder interconnects 196 are coupled to the metallization portion 702. The plurality of solder interconnects 196 may be coupled to the plurality of metallization interconnects 722 of the metallization portion 702. A solder reflow process may be used to couple the plurality of solder interconnects 196 to the metallization portion 702. Stage 8 also illustrates a state after the carrier 1500 is decoupled from the encapsulation layer 108, leaving the package 800 that includes the integrated device 104, the integrated device 404, the chiplet 106, the chiplet 406, the bridge 505, the metallization portion 102, the metallization portion 702, the encapsulation layer 108 and the encapsulation layer 708.

FIGS. 15A-15C illustrate an example of a method of fabricating a package. The method may provide a first integrated device and a second integrated device. The method may form an encapsulation layer that encapsulates the first integrated device and the second integrated device. The method may form a first metallization portion such that the first metallization portion is coupled to the first integrated device and the second integrated device. The method may form a first plurality of pillar interconnects and a second plurality of pillar interconnects such that the first plurality of pillar interconnects and the second plurality of pillar interconnects are coupled to the first metallization portion. The method may couple a first chiplet and a second chiplet to the first metallization portion. The method may form another encapsulation layer that encapsulates the first plurality of pillar interconnects, the second plurality of pillar interconnects, the first chiplet and the second chiplet. The method may form a second metallization portion such that the second metallization portion is coupled to the first chiplet and the second chiplet. In some implementations, coupling the first chiplet and the second chiplet to the first metallization portion comprises coupling the first chiplet to the first metallization portion such that a front side of the first chiplet faces the first metallization portion, and coupling the second chiplet to the first metallization portion such that a front side of the second chiplet faces the first metallization portion. The first chiplet may be coupled to the first metallization portion through a first plurality of solder interconnects. The second chiplet may be coupled to the first metallization portion through a second plurality of solder interconnects. The method may couple a bridge to the first metallization portion such that a front side of the bridge faces the first metallization portion. The bridge may be coupled to the first metallization portion through a plurality of solder interconnects.

Any of the metallization portions may be a first metallization portion, and/or any of the metallization portions may be a second metallization portion. For example, in some implementations, the metallization portion 102 may be considered a first metallization portion, and the metallization portion 702 may be considered a second metallization portion. In some implementations, the metallization portion 702 may be considered a first metallization portion, and the metallization portion 102 may be considered a second metallization portion.

Figure 16A:
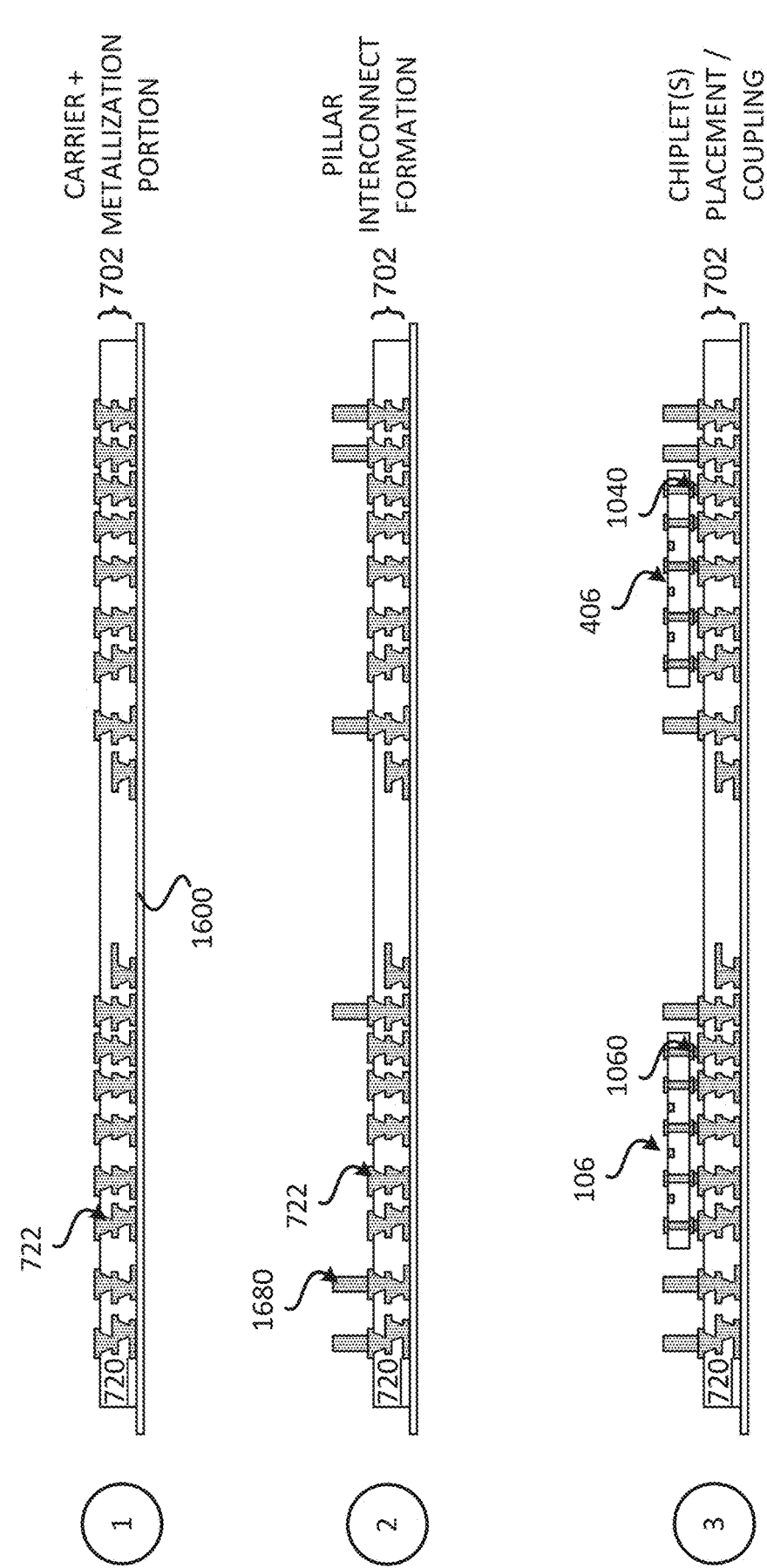
Figure 16B:
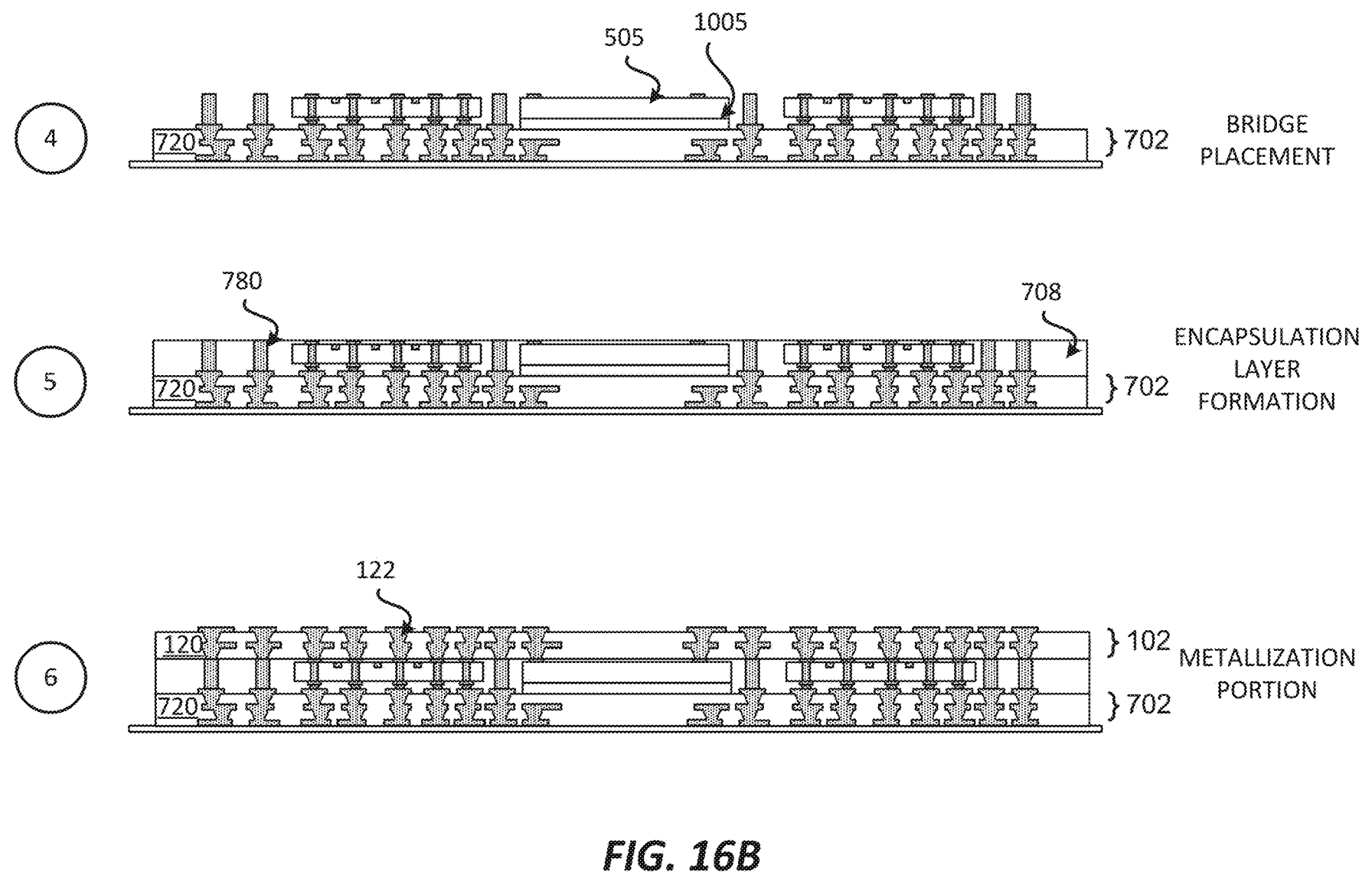
Figure 16C:
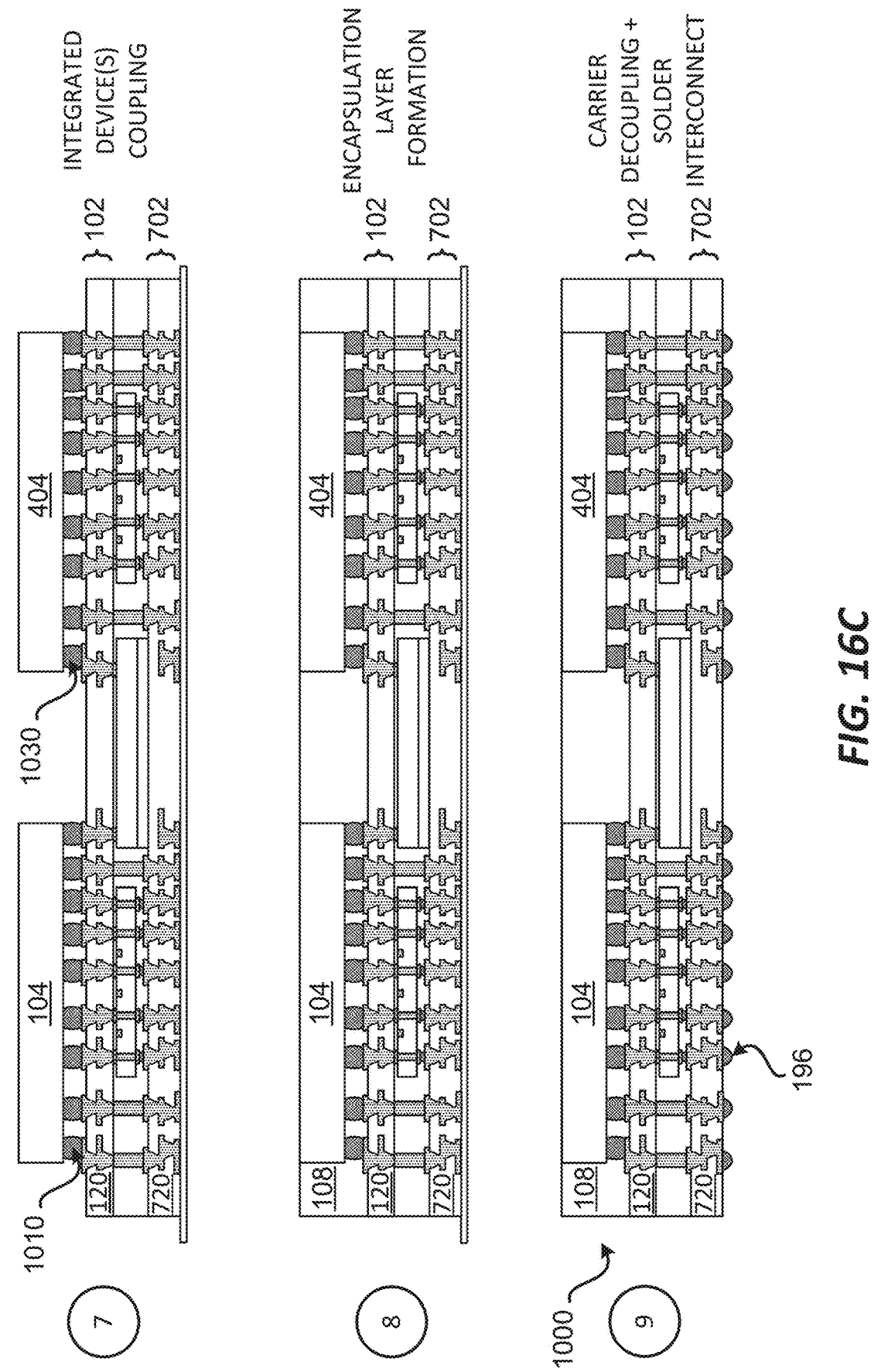

Exemplary Sequence for Fabricating a Package Comprising an Integrated Device and a Chiplet FIGS. 16A-16C illustrate an exemplary sequence for providing or fabricating a package that includes an integrated device and a chiplet. In some implementations, the sequence of FIGS. 16A-16C may be used to provide or fabricate the package 1000 of FIG. 10, or any of the packages described in the disclosure.

It should be noted that the sequence of FIGS. 16A-16C may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 16A-16C may be used to fabricate one package or several packages at a time (as part of a wafer).

Stage 1, as shown in FIG. 16A, illustrates a state after a metallization portion 702 is formed over a carrier 1600. The metallization portion 702 includes at least one dielectric layer 720 and a plurality of metallization interconnects 722. The metallization portion 702 may be formed in a similar as manner as described for the metallization portion 102 shown in FIGS. 14A-14D.

Stage 2 illustrates a state after a plurality of pillar interconnects 1680 are formed. A plating process may be used to form the plurality of pillar interconnects 1680. The plurality of pillar interconnects may be coupled to the plurality of metallization interconnects 722.

Stage 3 illustrates a state after the chiplet 106 is coupled to the plurality of metallization interconnects 722 through a plurality of solder interconnects 1060. Stage 3 also illustrates a state after the chiplet 406 is coupled to the plurality of metallization interconnects 722 through a plurality of solder interconnects 1040. A solder reflow process may be used to couple the chiplet 106 and the chiplet 406 to the plurality of metallization interconnects 722.

Stage 4, as shown in FIG. 16B, illustrates a state after a bridge 505 is coupled to the plurality of metallization interconnects 722 through an adhesive 1005. The back side of the bridge 505 may be coupled to the metallization portion 702 through an adhesive 1005. For example, a back side of the die substrate of the bridge 505 may be coupled to the metallization portion 702 through the adhesive 1005.

Stage 5 illustrates a state after an encapsulation layer 708 is formed over the metallization portion 702, the chiplet 106, the chiplet 406, the bridge 505, and the plurality of pillar interconnects 1680. The encapsulation layer 708 is coupled to the metallization portion 702, the chiplet 106, the chiplet 406, the bridge 505, and the plurality of pillar interconnects 1680. The plurality of pillar interconnects 1680 may be represented as the plurality of through mold vias 780 in the encapsulation layer 708. The encapsulation layer 708 may include a mold, a resin and/or an epoxy. The encapsulation layer 708 may be a means for encapsulation. The encapsulation layer 708 may be provided by using a compression and transfer molding process, a sheet molding process, or a liquid molding process. In some implementations, the encapsulation layer 708 is provided and then a polishing and/or grinding process is performed to remove portions of the encapsulation layer 708 and/or portions of the through mold vias 780, so as to create a planar surface.

Stage 6 illustrates a state after a metallization portion 102 is formed. The metallization portion 102 may be formed over the encapsulation layer 708, the bridge 505, the chiplet 106 and the chiplet 406. The metallization portion 102 includes at least one dielectric layer 120 and a plurality of metallization interconnects 122. The metallization portion 102 may be formed in a similar as manner as described for the metallization portion 102 shown in FIGS. 14A-14D.

Stage 7, as shown in FIG. 16C, illustrates a state after an integrated device 104 is coupled to the metallization portion 102 through a plurality of solder interconnects 1010. The integrated device 104 is coupled to the plurality of metallization interconnects 122 through the plurality of solder interconnects 1010. Stage 7 also illustrates a state after an integrated device 404 is coupled to the metallization portion 102 through a plurality of solder interconnects 1030. The integrated device 404 is coupled to the plurality of metallization interconnects 122 through the plurality of solder interconnects 1030. A solder reflow process may be used to couple the integrated device 104 and the integrated device 404 to the metallization portion 102.

Stage 8 illustrates a state after an encapsulation layer 108 is formed over the integrated device 104, the integrated device 404 and the metallization portion 102. The encapsulation layer 108 is coupled to the metallization portion 102, the integrated device 104 and the integrated device 404. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. In some implementations, the encapsulation layer 108 is provided and then a polishing and/or grinding process is performed to remove portions of the encapsulation layer 108.

Stage 9 illustrates a state after the carrier 1600 is decoupled from the metallization portion 702, leaving the package 1000 that includes the integrated device 104, the integrated device 404, the chiplet 106, the chiplet 406, the bridge 505, the metallization portion 702, the metallization portion 102, the encapsulation layer 108 and the encapsulation layer 708.

Stage 9 also illustrates a state after a plurality of solder interconnects 196 are coupled to the metallization portion 702. The plurality of solder interconnects 196 may be coupled to the plurality of metallization interconnects 722 of the metallization portion 702. A solder reflow process may be used to couple the plurality of solder interconnects 196 to the metallization portion 702.

FIGS. 16A-16C illustrate an example of a method for fabricating a package. The method may form a second metallization portion. The method may form a first plurality of pillar interconnects and a second plurality of pillar interconnects such that the first plurality of pillar interconnects and the second plurality of pillar interconnects are coupled to the second metallization portion. The method may couple a first chiplet and a second chiplet to the second metallization portion. The method may form an encapsulation layer that encapsulates the first plurality of pillar interconnects, the second plurality of pillar interconnects, the first chiplet and the second chiplet. The method may form a first metallization portion such that the first metallization portion is coupled to the first chiplet and the second chiplet. The method may couple a first integrated device and a second integrated device to the first metallization portion. In some implementations, coupling the first chiplet and the second chiplet to the second metallization portion comprises coupling the first chiplet to the second metallization portion such that a back side of the first chiplet faces the second metallization portion, and coupling the second chiplet to the second metallization portion such that a back side of the second chiplet faces the second metallization portion. The first chiplet may be coupled to the second metallization portion through a first plurality of solder interconnects. The second chiplet is coupled to the second metallization portion through a second plurality of solder interconnects. The method may couple a bridge to the second metallization portion such that a back side of the bridge faces the second metallization portion. The method may form another encapsulation layer that encapsulates the first integrated device and the second integrated device.

Any of the metallization portions may be a first metallization portion, and/or any of the metallization portions may be a second metallization portion. For example, in some implementations, the metallization portion 102 may be considered a first metallization portion, and the metallization portion 702 may be considered a second metallization portion. In some implementations, the metallization portion 702 may be considered a first metallization portion, and the metallization portion 102 may be considered a second metallization portion.

Exemplary Sequence for Fabricating a Substrate

Figure 17A:
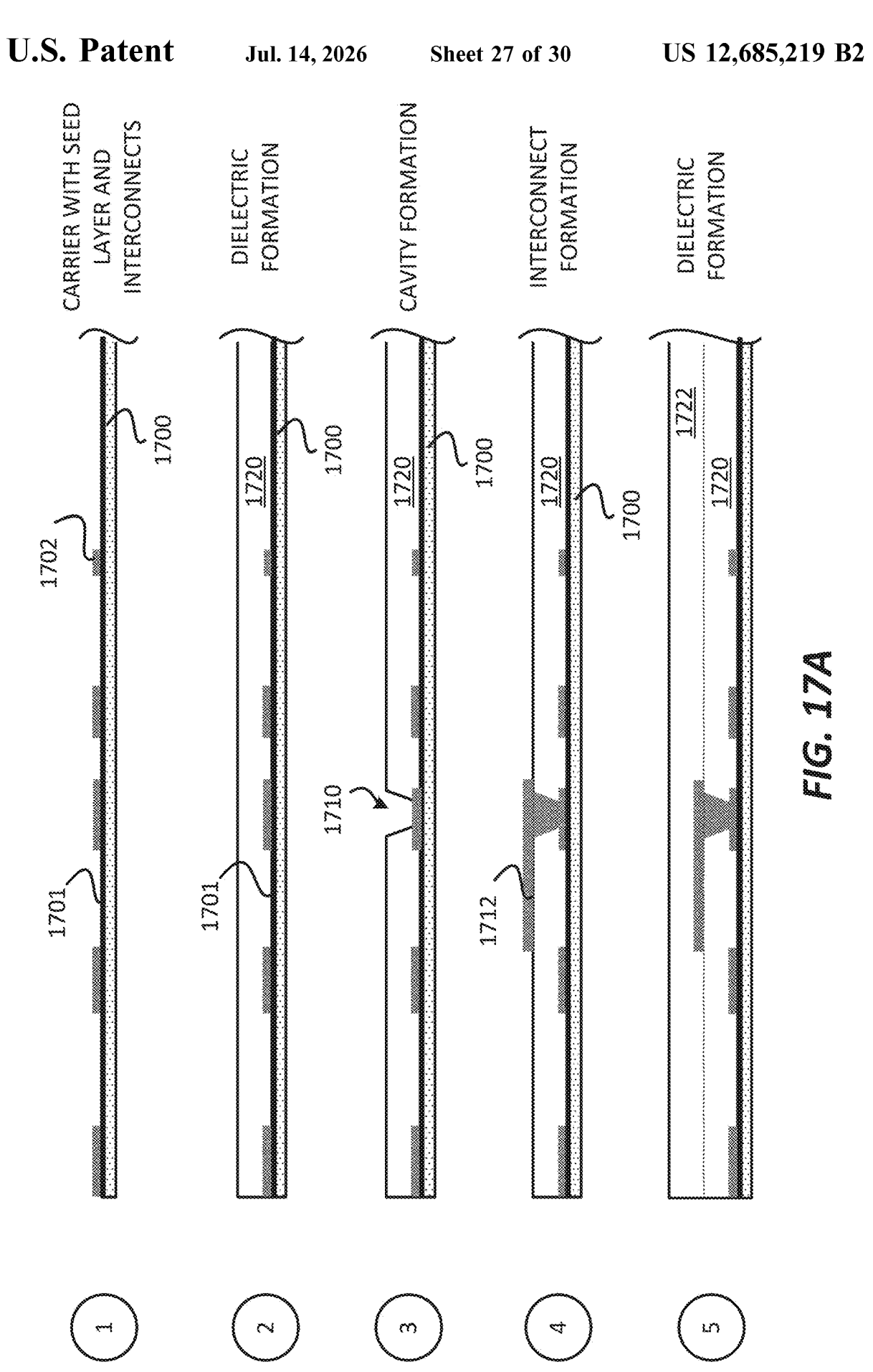

In some implementations, fabricating a substrate includes several processes. FIGS. 17A-17B illustrate an exemplary sequence for providing or fabricating a substrate. In some implementations, the sequence of FIGS. 17A-17B may be used to provide or fabricate the substrate 109. However, the process of FIGS. 17A-17B may be used to fabricate any of the substrates described in the disclosure.

It should be noted that the sequence of FIGS. 17A-17B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 17A, illustrates a state after a carrier 1700 is provided. A seed layer 1701 and interconnects 1702 may be located over the carrier 1700. The interconnects 1702 may be located over the seed layer 1701. A plating process and etching process may be used to form the interconnects 1702. In some implementations, the carrier 1700 may be provided with the seed layer 1701 and a metal layer that is patterned to form the interconnects 1702. The interconnects 1702 may represent at least some of the interconnects from the plurality of interconnects 192.

Stage 2 illustrates a state after a dielectric layer 1720 is formed over the carrier 1700, the seed layer 1701 and the interconnects 1702. A deposition and/or lamination process may be used to form the dielectric layer 1720. The dielectric layer 1720 may include prepreg and/or polyimide. The dielectric layer 1720 may include a photo-imageable dielectric. However, different implementations may use different materials for the dielectric layer.

Stage 3 illustrates a state after a plurality of cavities 1710 is formed in the dielectric layer 1720. The plurality of cavities 1710 may be formed using an etching process (e.g., photo etching process) or laser process.

Stage 4 illustrates a state after interconnects 1712 are formed in and over the dielectric layer 1720, including in and over the plurality of cavities 1710. For example, a via, pad and/or traces may be formed. A plating process may be used to form the interconnects.

Stage 5 illustrates a state after a dielectric layer 1722 is formed over the dielectric layer 1720 and the interconnects 1712. A deposition and/or lamination process may be used to form the dielectric layer 1722. The dielectric layer 1722 may include prepreg and/or polyimide. The dielectric layer 1722 may include a photo-imageable dielectric. However, different implementations may use different materials for the dielectric layer.

Stage 6, as shown in FIG. 17B, illustrates a state after a plurality of cavities 1730 is formed in the dielectric layer 1722. The plurality of cavities 1730 may be formed using an etching process (e.g., photo etching process) or laser process.

Stage 7 illustrates a state after interconnects 1714 are formed in and over the dielectric layer 1722, including in and over the plurality of cavities 1730. For example, a via, pad and/or traces may be formed. A plating process may be used to form the interconnects.

Stage 8 illustrates a state after the carrier 1700 is decoupled (e.g., detached, removed, grinded out) from at least one dielectric layer 190 and the seed layer 1701, portions of the seed layer 1701 are removed (e.g., etched out), leaving the metallization portion 102 that includes at least one dielectric layer 190 and the plurality of interconnects 192. The at least one dielectric layer 190 may represent the dielectric layer 1720 and/or the dielectric layer 1722. The plurality of interconnects 192 may represent the interconnects 1702, 1712 and/or 1714.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

In some implementations, fabricating a substrate includes several processes. FIG. 18 illustrates an exemplary flow diagram of a method 1800 for providing or fabricating a substrate. In some implementations, the method 1800 of FIG. 18 may be used to provide or fabricate the substrate(s) of the disclosure. For example, the method 1800 of FIG. 18 may be used to fabricate the metallization portion 102.

It should be noted that the method 1800 of FIG. 18 may combine one or more processes in order to simplify and/or clarify the method for providing or fabricating a substrate. In some implementations, the order of the processes may be changed or modified.

The method provides (at 1805) a carrier (e.g., 1700). Different implementations may use different materials for the carrier 1700. The carrier 1700 may include a seed layer (e.g., 1701). The seed layer 1701 may include a metal (e.g., copper). The carrier may include a substrate, glass, quartz and/or carrier tape. Stage 1 of FIG. 17A illustrates and describes an example of a carrier with a seed layer that is provided.

The method forms and patterns (at 1810) interconnects over the carrier 1700 and the seed layer 1701. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 192). Stage 1 of FIG. 17A illustrates and describes an example of forming and patterning interconnects over a seed layer and a carrier.

The method forms/provides (at 1815) a dielectric layer 1720 over the seed layer 1701, the carrier 1700 and the interconnects 1702. A deposition and/or lamination process may be used to form the dielectric layer 1720. The dielectric layer 1720 may include prepreg and/or polyimide. The dielectric layer 1720 may include a photo-imageable dielectric. Forming the dielectric layer 1720 may also include forming a plurality of cavities (e.g., 1710) in the dielectric layer 1720. The plurality of cavities may be formed using an etching process (e.g., photo etching) or laser process. Stages 2-3 of FIG. 17A illustrate and describe an example of forming a dielectric layer and cavities in the dielectric layer.

The method forms (at 1820) interconnects in and over the dielectric layer. For example, the interconnects 1712 may be formed in and over the dielectric layer 1720. A plating process may be used to form the interconnects. Forming interconnects may include providing a patterned metal layer over and/or in the dielectric layer. Forming interconnects may also include forming interconnects in cavities of the dielectric layer. Stage 4 of FIG. 17A illustrates and describes an example of forming interconnects in and over a dielectric layer.

The method forms/provides (at 1825) a dielectric layer 1722 over the dielectric layer 1720 and the interconnects 1712. A deposition and/or lamination process may be used to form the dielectric layer 1722. The dielectric layer 1722 may include prepreg and/or polyimide. The dielectric layer 1722 may include a photo-imageable dielectric. Forming the dielectric layer 1722 may also include forming a plurality of cavities (e.g., 1730) in the dielectric layer 1722. The plurality of cavities may be formed using an etching process (e.g., photo etching) or laser process. Stages 5-6 of FIGS. 17A-17B illustrate and describe an example of forming a dielectric layer and cavities in the dielectric layer.

The method forms (at 1830) interconnects in and over the dielectric layer. For example, the interconnects 1714 may be formed in and over the dielectric layer 1722. A plating process may be used to form the interconnects. Forming interconnects may include providing a patterned metal layer over and/or in the dielectric layer. Forming interconnects may also include forming interconnects in cavities of the dielectric layer. Stage 7 of FIG. 17B illustrates and describes an example of forming interconnects in and over a dielectric layer. The method may form additional dielectric layer(s) and additional interconnects as described at 1825 and 1830.

In some implementations, once all the dielectric layer(s) and additional interconnects are formed, the method may decouple (at 1835) the carrier (e.g., 1700) from the seed layer (e.g., 1701). The carrier 1700 may be detached and/or grinded off. The method may also remove (at 1835) portions of the seed layer (e.g., 1701). An etching process may be used to remove portions of the seed layer 1701. Stage 8 of FIG. 17B illustrates and describes an example of decoupling a carrier and seed layer removal.

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 19:
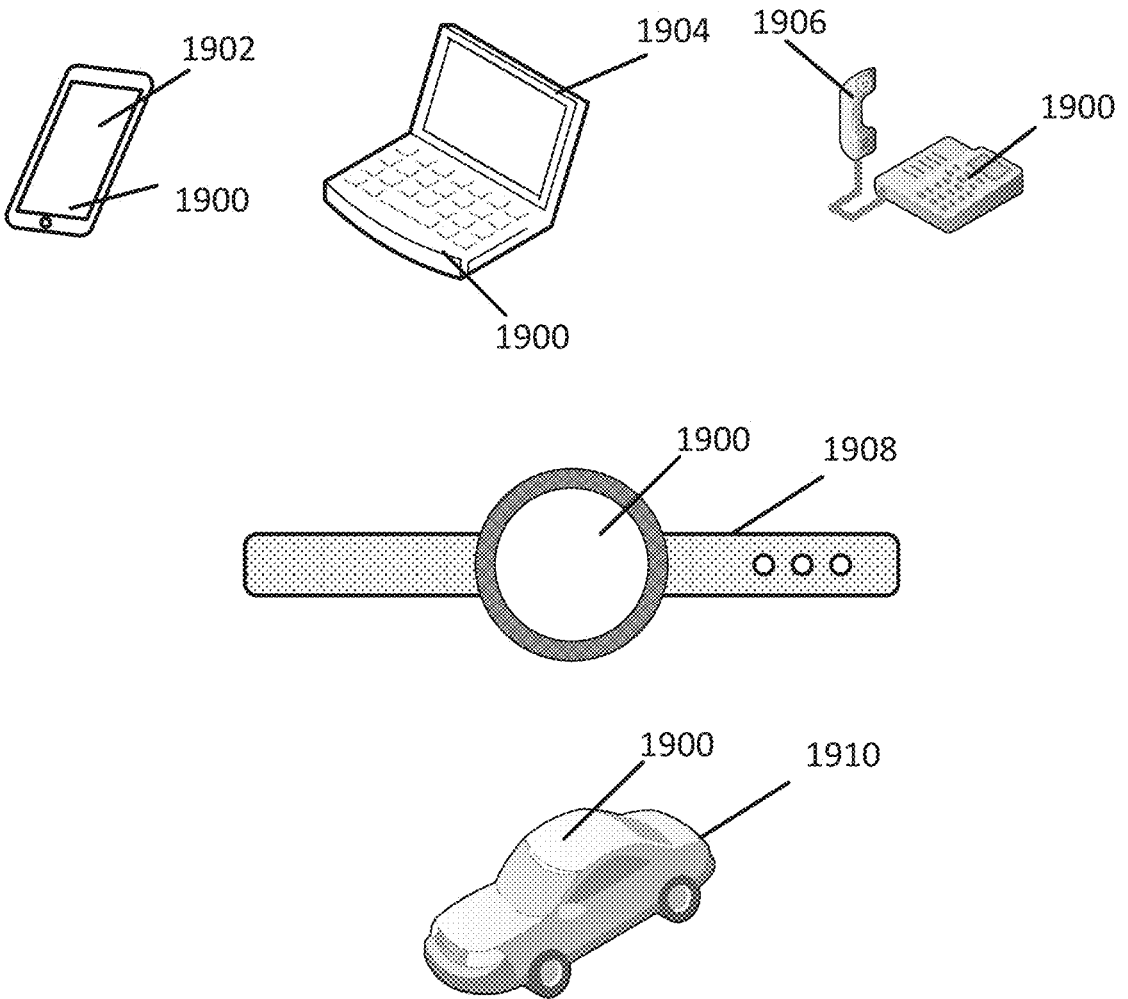
FIG. 19 illustrates various electronic devices that may integrate a die, an electronic circuit, an integrated device, an integrated passive device (IPD), a passive component, a package, and/or a device package described herein.

FIG. 19 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1902, a laptop computer device 1904, a fixed location terminal device 1906, a wearable device 1908, or automotive vehicle 1910 may include a device 1900 as described herein. The device 1900 may be, for example, any of the devices and/or integrated circuit (IC) packages described herein. The devices 1902, 1904, 1906 and 1908 and the vehicle 1910 illustrated in FIG. 19 are merely exemplary. Other electronic devices may also feature the device 1900 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-11, 12A-12D, 13, 14A-14D, 15A-15C, 16A-16C, 17A-17B and/or 18-19 may be rearranged and/or combined into a single component, process, feature or function or embodied in several components, processes, or functions. Additional elements, components, processes, and/or functions may also be added without departing from the disclosure. It should also be noted FIGS. 1-11, 12A-12D, 13, 14A-14D, 15A-15C, 16A-16C, 17A-17B and/or 18-19 and its corresponding description in the present disclosure is not limited to dies and/or ICs. In some implementations, FIGS. 1-11, 12A-12D, 13, 14A-14D, 15A-15C, 16A-16C, 17A-17B and/or 18-19 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object that is coupled to another object may be coupled to at least part of the another object. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a first metallization portion; a first integrated device coupled to the first metallization portion through a first plurality of pillar interconnects; and a first chiplet located between the first integrated device and the first metallization portion, wherein the first chiplet is coupled to the first integrated device through a first plurality of inter pillar interconnects.

Aspect 2: The package of aspect 1, wherein the first chiplet includes a trench capacitor.

Aspect 3: The package of aspect 2, wherein the first chiplet includes a chiplet substrate; a plurality of trench capacitors; and at least one through chiplet substrate interconnect.

Aspect 4: The package of aspect 1, wherein the first chiplet includes a memory, a power management integrated circuit or a voltage regulator.

Aspect 5: The package of aspects 1 through 4, further comprising an encapsulation layer coupled to the first metallization portion and the first integrated device.

Aspect 6: The package of aspect 5, wherein the encapsulation layer comprises a first encapsulation layer coupled to the first integrated device; and a second encapsulation layer coupled to the first metallization portion.

Aspect 7: The package of aspect 6, further comprising a dielectric layer located between the first encapsulation layer and the second encapsulation layer, wherein the dielectric layer is coupled to the first encapsulation layer and the second encapsulation layer.

Aspect 8: The package of aspects 1 through 7, further comprising a second integrated device coupled to the first metallization portion through a second plurality of pillar interconnects; and a second chiplet located between the second integrated device and the first metallization portion, wherein the second chiplet is coupled to the second integrated device through a second plurality of inter pillar interconnects.

Aspect 9: The package of aspect 8, further comprising a bridge coupled to the first metallization portion, wherein the bridge is configured to provide at least one electrical path between the first integrated device and the second integrated device.

Aspect 10: The package of aspects 8 through 9, wherein the first chiplet is laterally surrounded by the first plurality of pillar interconnects; and wherein the second chiplet is laterally surrounded by the second plurality of pillar interconnects.

Aspect 11: The package of aspects 8 through 10, wherein the first integrated device includes a first plurality of die interconnects comprising a first minimum spacing, and wherein the second integrated device includes a second plurality of die interconnects comprising a second minimum spacing.

Aspect 12: The package of aspect 11, wherein the first chiplet includes a plurality of interconnects comprising a third minimum spacing.

Aspect 13: The package of aspects 1 through 10, wherein the first integrated device includes a plurality of die interconnects comprising a first minimum spacing, and wherein the first chiplet includes a plurality of interconnects comprising a second minimum spacing.

Aspect 14: The package of aspect 13, wherein the first minimum spacing is less than the second minimum spacing.

Aspect 15: The package of aspects 1 through 10, wherein the first integrated device includes a first plurality of transistors comprising a first minimum spacing, and wherein the first chiplet includes a second plurality of transistors comprising a second minimum spacing.

Aspect 16: A device comprising a package. The package comprises a first metallization portion; a first integrated device coupled to the first metallization portion through a first plurality of pillar interconnects; and a first chiplet located between the first integrated device and the first metallization portion, wherein the first chiplet is coupled to the first integrated device through a first plurality of inter pillar interconnects.

Aspect 17: The device of aspect 16, wherein the first chiplet includes a trench capacitor.

Aspect 18: The device of aspect 17, wherein the first chiplet includes a chiplet substrate; a plurality of trench capacitors; and at least one through chiplet substrate interconnect.

Aspect 19: The device of aspect 16, wherein the first chiplet includes a memory, a power management integrated circuit or a voltage regulator.

Aspect 20: The device of aspects 16 through 19, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method for fabricating a package. The method provides a first integrated device and a first plurality of inter pillar interconnects. The method forms an encapsulation layer that encapsulates the first integrated device and the first plurality of inter pillar interconnects. The method forms a first plurality of pillar interconnects that are configured to be coupled to the first integrated device. The method couples a first chiplet to the first integrated device through the first plurality of inter pillar interconnects. The method forms a first metallization portion such that the first metallization portion is coupled to the first chiplet and the first encapsulation layer.

Aspect 22: The method of aspect 21, wherein the first chiplet includes a trench capacitor.

Aspect 23: The method of aspect 22, wherein the first chiplet includes a chiplet substrate; a plurality of trench capacitors; and at least one through chiplet substrate interconnect.

Aspect 24: The method of aspect 21, wherein the first chiplet includes a memory, a power management integrated circuit or a voltage regulator.

Aspect 25: The method of aspects 21 through 24, further forming a second encapsulation layer that encapsulates the first chiplet.

Aspect 26: The method of aspect 25, wherein the second encapsulation layer and the encapsulation layer are part of a same encapsulation layer.

Aspect 27: The method of aspects 21 through 26, further comprising providing a second integrated device and a second plurality of inter pillar interconnects, wherein forming the encapsulation layer comprises forming the encapsulation layer that further encapsulates the second integrated device and the second plurality of inter pillar interconnects; and coupling a second chiplet to the second integrated device through the second plurality of inter pillar interconnects.

Aspect 28: The method of aspect 27, further comprising providing a bridge that is configured to provide at least one electrical path between the first integrated device and the second integrated device.

Aspect 29: The method of aspects 21 through 28, wherein the first integrated device includes a plurality of die interconnects comprising a first minimum spacing, and wherein the first chiplet includes a plurality of interconnects comprising a second minimum spacing.

Aspect 30: The method of aspects 21 through 29, wherein the first integrated device includes a first plurality of transistors comprising a first minimum spacing, and wherein the first chiplet includes a second plurality of transistors comprising a second minimum spacing.

Aspect 31: A package comprising a first metallization portion; a first integrated device coupled to the first metallization portion; a second integrated device coupled to the first metallization portion; a second metallization portion coupled to the first metallization portion through a first plurality of pillar interconnects; a first chiplet located between the first metallization portion and the second metallization portion, wherein the first chiplet is configured to be electrically coupled to the first integrated device through the first metallization portion; and a second chiplet located between the first metallization portion and the second metallization portion, wherein the second chiplet is configured to be electrically coupled to the second integrated device through the first metallization portion.

Aspect 32: The package of aspect 31, further comprising a bridge located between the first metallization portion and the second metallization portion.

Aspect 33: The package of aspects 31 through 32, further comprising a first encapsulation layer coupled to the first metallization portion, the first integrated device and the second integrated device.

Aspect 34: The package of aspect 33, further comprising a second encapsulation layer coupled to the first metallization portion, the second metallization portion, the first chiplet and the second chiplet, wherein the second encapsulation layer is located between the first metallization portion and the second metallization portion.

Aspect 35: The package of aspects 31 through 34, wherein the first chiplet includes a first trench capacitor, a first memory, a first power management integrated circuit or a first voltage regulator, and wherein the second chiplet includes a second trench capacitor, a second memory, a second power management integrated circuit or a second voltage regulator.

Aspect 36: The package of aspects 31 through 35, wherein the first integrated device is coupled to the first metallization portion through a first plurality of solder interconnects, and wherein the second integrated device is coupled to the first metallization portion through a second plurality of solder interconnects.

Aspect 37: The package of aspects 31 through 36, wherein the first chiplet is coupled to the first metallization portion through a first plurality of solder interconnects, and wherein the second chiplet is coupled to the first metallization portion through a second plurality of solder interconnects.

Aspect 38: The package of aspect 37, further comprising a bridge located between the first metallization portion and the second metallization portion, wherein the bridge is coupled to the first metallization portion through a third plurality of solder interconnects.

Aspect 39: The package of aspect 38, wherein a front side of the bridge faces the first metallization portion, wherein a front side of the first chiplet faces the first metallization portion, and wherein a front side of the second chiplet faces the first metallization portion.

Aspect 40: The package of aspects 31 through 36, wherein the first chiplet is coupled to the second metallization portion through a first plurality of solder interconnects, and wherein the second chiplet is coupled to the second metallization portion through a second plurality of solder interconnects.

Aspect 41: The package of aspect 40, further comprising a bridge located between the first metallization portion and the second metallization portion, wherein the bridge is coupled to the first metallization portion through a third plurality of solder interconnects.

Aspect 42: The package of aspect 41, wherein a front side of the bridge faces the first metallization portion, wherein a front side of the first chiplet faces the first metallization portion, and wherein a front side of the second chiplet faces the first metallization portion.

Aspect 43: The package of aspects 31 through 42, wherein the first integrated device includes a first plurality of die interconnects comprising a first minimum spacing, and wherein the second integrated device includes a second plurality of die interconnects comprising a second minimum spacing.

Aspect 44: The package of aspects 31 through 43, wherein the first chiplet includes a plurality of interconnects comprising a third minimum spacing.

Aspect 45: The package of aspects 31 through 42, wherein the first integrated device includes a plurality of die interconnects comprising a first minimum spacing, and wherein the first chiplet includes a plurality of interconnects comprising a second minimum spacing.

Aspect 46: The package of aspects 31 through 45, wherein the first integrated device includes a first plurality of transistors comprising a first minimum spacing, and wherein the first chiplet includes a second plurality of transistors comprising a second minimum spacing.

Aspect 47: A device comprising a package. The package comprises a first metallization portion; a first integrated device coupled to the first metallization portion; a second integrated device coupled to the first metallization portion; a second metallization portion coupled to the first metallization portion through a first plurality of pillar interconnects; a first chiplet located between the first metallization portion and the second metallization portion, wherein the first chiplet is configured to be electrically coupled to the first integrated device through the first metallization portion; and a second chiplet located between the first metallization portion and the second metallization portion, wherein the second chiplet is configured to be electrically coupled to the second integrated device through the first metallization portion.

Aspect 48: The device of aspect 47, wherein the first chiplet includes a first trench capacitor, a first memory, a first power management integrated circuit or a first voltage regulator, and wherein the second chiplet includes a second trench capacitor, a second memory, a second power management integrated circuit or a second voltage regulator.

Aspect 49: The device of aspects 47 through 48, wherein the first integrated device includes a plurality of die interconnects comprising a first minimum spacing, and wherein the first chiplet includes a plurality of interconnects comprising a second minimum spacing.

Aspect 50: The device of aspects 47 through 49, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 51: A method for fabricating a package. The method provides a first integrated device and a second integrated device. The method forms an encapsulation layer that encapsulates the first integrated device and the second integrated device. The method forms a first metallization portion such that the first metallization portion is coupled to the first integrated device and the second integrated device. The method forms a first plurality of pillar interconnects and a second plurality of pillar interconnects such that the first plurality of pillar interconnects and the second plurality of pillar interconnects are coupled to the first metallization portion. The method couples a first chiplet and a second chiplet to the first metallization portion. The method forms another encapsulation layer that encapsulates the first plurality of pillar interconnects, the second plurality of pillar interconnects, the first chiplet and the second chiplet. The method forms a second metallization portion such that the second metallization portion is coupled to the first chiplet and the second chiplet.

Aspect 52: The method of aspect 51, wherein coupling the first chiplet and the second chiplet to the first metallization portion comprises coupling the first chiplet to the first metallization portion such that a front side of the first chiplet faces the first metallization portion; and coupling the second chiplet to the first metallization portion such that a front side of the second chiplet faces the first metallization portion.

Aspect 53: The method of aspect 52, wherein the first chiplet is coupled to the first metallization portion through a first plurality of solder interconnects, and wherein the second chiplet is coupled to the first metallization portion through a second plurality of solder interconnects.

Aspect 54: The method of aspects 51 through 53, further comprising coupling a bridge to the first metallization portion such that a front side of the bridge faces the first metallization portion.

Aspect 55: The method of aspect 54, wherein the bridge is coupled to the first metallization portion through a plurality of solder interconnects.

Aspect 56: A method for fabricating a package. The method forms a second metallization portion. The method forms a first plurality of pillar interconnects and a second plurality of pillar interconnects such that the first plurality of pillar interconnects and the second plurality of pillar interconnects are coupled to the second metallization portion. The method couples a first chiplet and a second chiplet to the second metallization portion. The method forms an encapsulation layer that encapsulates the first plurality of pillar interconnects, the second plurality of pillar interconnects, the first chiplet and the second chiplet. The method forms a first metallization portion such that the first metallization portion is coupled to the first chiplet and the second chiplet. The method couples a first integrated device and a second integrated device to the first metallization portion.

Aspect 57: The method of aspect 56, wherein coupling the first chiplet and the second chiplet to the second metallization portion comprises coupling the first chiplet to the second metallization portion such that a back side of the first chiplet faces the second metallization portion; and coupling the second chiplet to the second metallization portion such that a back side of the second chiplet faces the second metallization portion.

Aspect 58: The method of aspect 57, wherein the first chiplet is coupled to the second metallization portion through a first plurality of solder interconnects, and wherein the second chiplet is coupled to the second metallization portion through a second plurality of solder interconnects.

Aspect 59: The method of aspects 56 through 57, further comprising coupling a bridge to the second metallization portion such that a back side of the bridge faces the second metallization portion.

Aspect 60: The method of aspects 56 through 59, further comprising forming another encapsulation layer that encapsulates the first integrated device and the second integrated device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a first metallization portion;
a first integrated device coupled to the first metallization portion through a first plurality of pillar interconnects; and
a first chiplet located between the first integrated device and the first metallization portion,
wherein the first chiplet comprises a trench capacitor device, the first chiplet comprising:
a chiplet substrate;
a plurality of trench capacitors; and
at least one through chiplet substrate interconnect,
wherein the first chiplet comprises a front side and a back side,
wherein the front side of the first chiplet includes the plurality of trench capacitors,
wherein the back side of the first chiplet includes the chiplet substrate, and
wherein the front side of the first chiplet faces in a direction towards the first integrated device,
wherein the first chiplet is coupled to the first integrated device through a first plurality of inter pillar interconnects, wherein the first plurality of inter pillar interconnects touch the first integrated device.

2. The package of claim 1, further comprising an encapsulation layer coupled to the first metallization portion and the first integrated device.

3. The package of claim 2, wherein the encapsulation layer comprises:
a first encapsulation layer coupled to the first integrated device; and
a second encapsulation layer coupled to the first metallization portion.

4. The package of claim 3, further comprising a dielectric layer located between the first encapsulation layer and the second encapsulation layer, wherein the dielectric layer is coupled to the first encapsulation layer and the second encapsulation layer.

5. The package of claim 1, further comprising:
a second integrated device coupled to the first metallization portion through a second plurality of pillar interconnects; and
a second chiplet located between the second integrated device and the first metallization portion, wherein the second chiplet is coupled to the second integrated device through a second plurality of inter pillar interconnects.

6. The package of claim 5, further comprising a bridge coupled to the first metallization portion, wherein the bridge is configured to provide at least one electrical path between the first integrated device and the second integrated device.

7. The package of claim 5,
wherein the first chiplet is laterally surrounded by the first plurality of pillar interconnects; and
wherein the second chiplet is laterally surrounded by the second plurality of pillar interconnects.

8. The package of claim 5, wherein the first integrated device includes a first plurality of die interconnects comprising a first minimum spacing, and wherein the second integrated device includes a second plurality of die interconnects comprising a second minimum spacing that is different from the first minimum spacing.

9. The package of claim 8, wherein the first chiplet includes a plurality of interconnects comprising a third minimum spacing.

10. The package of claim 1, wherein the first integrated device includes a plurality of die interconnects comprising a first minimum spacing, and wherein the first chiplet includes a plurality of interconnects comprising a second minimum spacing.

11. The package of claim 10, wherein the first minimum spacing is less than the second minimum spacing.

12. A package comprising:

a first metallization portion;

a first integrated device coupled to the first metallization portion through a first plurality of pillar interconnects; and a first chiplet located between the first integrated device and the first metallization portion, wherein the first chiplet comprises a trench capacitor device, wherein the first chiplet comprises a front side and a back side, wherein the front side of the first chiplet faces in a direction towards the first integrated device, wherein the first chiplet is coupled to the first integrated device through a first plurality of inter pillar interconnects, wherein the first plurality of inter pillar interconnects touch the first integrated device, wherein the first integrated device includes a first plurality of transistors comprising a first minimum spacing, and wherein the first chiplet includes a second plurality of transistors comprising a second minimum spacing that is different from the first minimum spacing.

13. A device comprising:

a package comprising:

a first metallization portion;

a first integrated device coupled to the first metallization portion through a first plurality of pillar interconnects, wherein the first integrated device includes a plurality of die interconnects comprising a first minimum spacing; and a first chiplet located between the first integrated device and the first metallization portion, wherein the first chiplet includes a plurality of interconnects comprising a second minimum spacing, wherein the first minimum spacing is less than the second minimum spacing, and wherein the first chiplet is coupled to the first integrated device through a first plurality of inter pillar interconnects.

14. The device of claim 13, wherein the first chiplet includes a trench capacitor device.

15. The device of claim 14, wherein the first chiplet includes:

a chiplet substrate;

a plurality of trench capacitors; and at least one through chiplet substrate interconnect, wherein a front side of the first chiplet includes the plurality of trench capacitors, and wherein a back side of the first chiplet includes the chiplet substrate.

16. The device of claim 13, wherein the first chiplet includes a memory, a power management integrated circuit or a voltage regulator.

17. The device of claim 13, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

18. A package comprising:

a first metallization portion;

a first integrated device coupled to the first metallization portion through a first plurality of pillar interconnects;

a first chiplet located between the first integrated device and the first metallization portion, wherein the first chiplet comprises a front side and a back side, wherein the front side of the first chiplet faces in a direction towards the first integrated device, wherein the first chiplet includes a memory, a power management integrated circuit or a voltage regulator, and wherein the first chiplet is coupled to the first integrated device through a first plurality of inter pillar interconnects, wherein the first plurality of inter pillar interconnects touch the first integrated device;

a second integrated device coupled to the first metallization portion through a second plurality of pillar interconnects; and a second chiplet located between the second integrated device and the first metallization portion, wherein the second chiplet is coupled to the second integrated device through a second plurality of inter pillar interconnects.

19. The package of claim 18, further comprising an encapsulation layer coupled to the first metallization portion and the first integrated device.

20. The package of claim 19, wherein the encapsulation layer comprises:

a first encapsulation layer coupled to the first integrated device; and a second encapsulation layer coupled to the first metallization portion.

21. The package of claim 20, further comprising a dielectric layer located between the first encapsulation layer and the second encapsulation layer, wherein the dielectric layer is coupled to the first encapsulation layer and the second encapsulation layer.

22. The package of claim 20, wherein the first encapsulation layer includes a first concentration of filler, and wherein the second encapsulation layer includes a second concentration of filler that is different from the first concentration of filler.

23. The package of claim 22, wherein the first concentration of filler is higher than the second concentration of filler.

24. The package of claim 18, further comprising a bridge coupled to the first metallization portion, wherein the bridge is configured to provide at least one electrical path between the first integrated device and the second integrated device.

25. The package of claim 18, wherein the first integrated device includes a first plurality of die interconnects comprising a first minimum spacing, and wherein the second integrated device includes a second plurality of die interconnects comprising a second minimum spacing that is different from the first minimum spacing.

26. The package of claim 3, wherein the first encapsulation layer includes a first concentration of filler, and wherein the second encapsulation layer includes a second concentration of filler that is different from the first concentration of filler.

27. The package of claim 3, wherein the first chiplet is coupled to the first integrated device through the first plurality of inter pillar interconnects and a plurality of solder interconnects, and wherein the plurality of solder interconnects touch the first plurality of inter pillar interconnects and the first chiplet.

28. The device of claim 13, wherein the package further comprises an encapsulation layer coupled to the first metallization portion and the first integrated device, wherein the encapsulation layer comprises:

a first encapsulation layer coupled to the first integrated device; and a second encapsulation layer coupled to the first metallization portion, wherein the first encapsulation layer includes a first concentration of filler, and wherein the second encapsulation layer includes a second concentration of filler that is different from the first concentration of filler.

* * * * *